(12) United States Patent
Huh et al.

(10) Patent No.: US 10,950,801 B2
(45) Date of Patent: Mar. 16, 2021

(54) ORGANIC LIGHT-EMITTING DEVICE

(71) Applicant: LG CHEM, LTD., Seoul (KR)

(72) Inventors: Jungoh Huh, Daejeon (KR); Sangbin Lee, Daejeon (KR); Sung Kil Hong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 28 days.

(21) Appl. No.: 16/646,960

(22) PCT Filed: May 3, 2019

(86) PCT No.: PCT/KR2019/005353
§ 371 (c)(1),
(2) Date: Mar. 12, 2020

(87) PCT Pub. No.: WO2019/245160
PCT Pub. Date: Dec. 26, 2019

(65) Prior Publication Data
US 2020/0287142 A1    Sep. 10, 2020

(30) Foreign Application Priority Data

Jun. 18, 2018  (KR) .................. 10-2018-0069503

(51) Int. Cl.
*H01L 51/00* (2006.01)
*H01L 51/50* (2006.01)

(52) U.S. Cl.
CPC ...... *H01L 51/0072* (2013.01); *H01L 51/0067* (2013.01); *H01L 51/0073* (2013.01);
(Continued)

(58) Field of Classification Search
CPC ............ H01L 51/0072; H01L 51/0073; H01L 51/0067; H01L 2251/5376; H01L 51/5016;
(Continued)

(56) References Cited

U.S. PATENT DOCUMENTS

| 2017/0279055 A1 | 9/2017 | Jang et al. |
| 2018/0033989 A1 | 2/2018 | Lee et al. |
| 2018/0066180 A1 | 3/2018 | Huh et al. |

FOREIGN PATENT DOCUMENTS

| CN | 108063188 | 5/2018 |
| EP | 3498804 A1 | 6/2019 |

(Continued)

OTHER PUBLICATIONS

Venugopal et al., "Nondoped blue fluorescent OLED based on cyanophenanthrimidazole-styryl-triphenylamine/carbazole materials," J. Phys. Org. Chem. 30:e3695 (2017), 13 pages.

*Primary Examiner* — Stephen W Smoot
*Assistant Examiner* — Vicki B. Booker
(74) *Attorney, Agent, or Firm* — Dentons US LLP

(57) ABSTRACT

Provided is an organic light emitting device including a cathode; an anode provided opposite to the cathode; a light emitting layer provided between the cathode and the anode; and an organic material layer provided between the cathode and the light emitting layer, and including Compound (A) including a heteroatom and a cyano group, wherein Compound (A) satisfies Equation 1 and Equation 2:

$$|P_{El}^{CN}| \geq 3 \text{debye} \quad \text{Equation 1}$$

wherein:
$|P_{El}^{CN}|$ means an absolute value of a dipole moment of Compound (A);

$$\frac{|P_{El}^{CN}|}{|P_{El}|} > \frac{|Ea_{El}^{CN}|}{|Ea_{El}|} \quad \text{Equation 2}$$

wherein:
$|P_{El}^{CN}|$ means an absolute value of a dipole moment of Compound (A);

(Continued)

$|P_{El}|$ means an absolute value of a dipole moment of a compound having the same core as the compound of $|P_{El}^{CN}|$ without including a cyano group;

$|Ea_{El}^{CN}|$ means an absolute value of electron affinity of Compound (A); and $|Ea_{El}|$ means an absolute value of electron affinity of a compound having the same core as the compound of $|Ea_{El}^{CN}|$ without including a cyano group.

15 Claims, 3 Drawing Sheets

(52) U.S. Cl.
CPC ........ *H01L 51/504* (2013.01); *H01L 51/5016* (2013.01); *H01L 51/5072* (2013.01); *H01L 51/5092* (2013.01); *H01L 51/5096* (2013.01); *H01L 2251/5376* (2013.01)

(58) Field of Classification Search
CPC ............. H01L 51/5096; H01L 51/5072; H01L 51/504; H01L 51/5092
See application file for complete search history.

(56) References Cited

FOREIGN PATENT DOCUMENTS

| KR | 10-1580429 | 12/2015 |
|----|------------|---------|
| KR | 10-20160111320 | 9/2016 |
| KR | 10-20160126862 | 11/2016 |
| KR | 10-20170073567 | 6/2017 |
| KR | 10-1966306 | 4/2019 |

[FIG. 1]
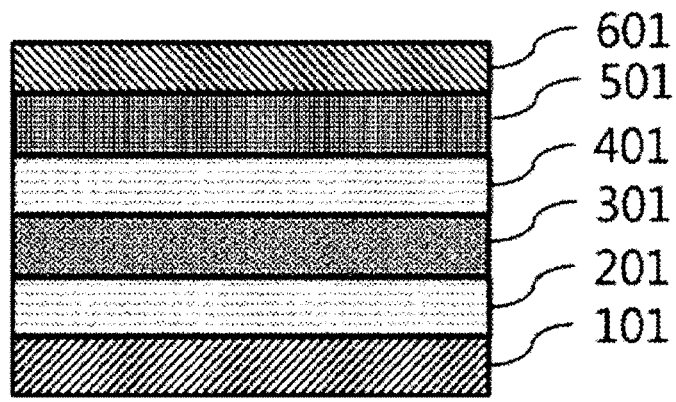
[FIG. 2]
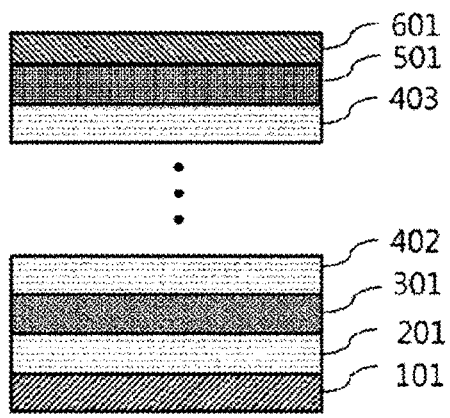

【FIG. 3】
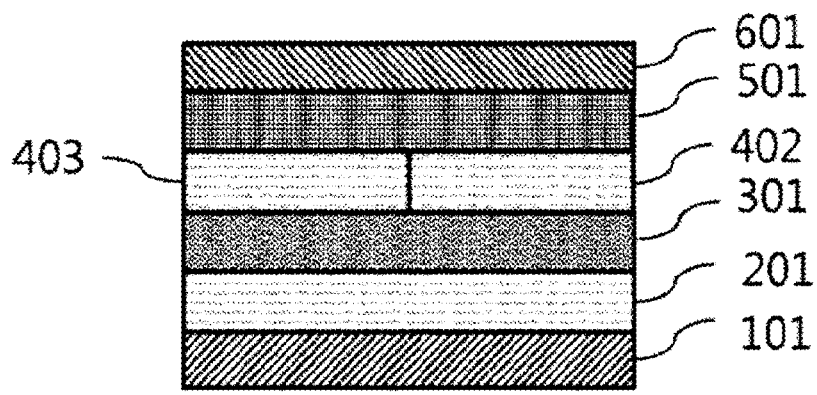
【FIG. 4】
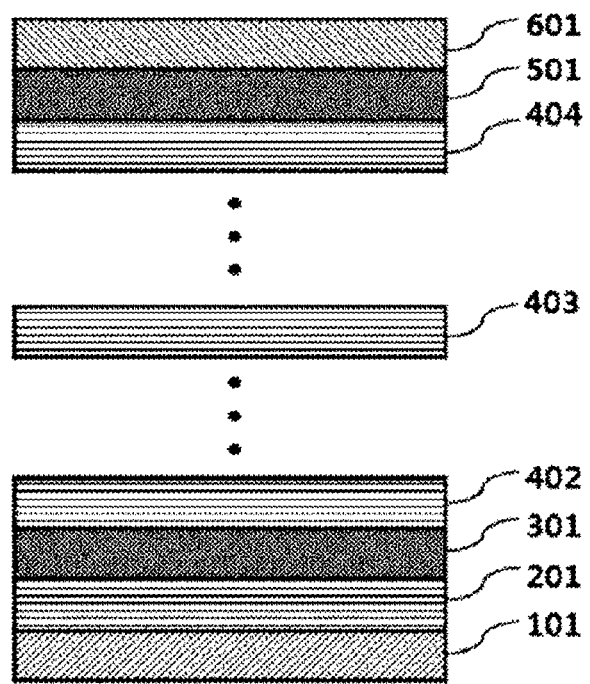

[FIG. 5]
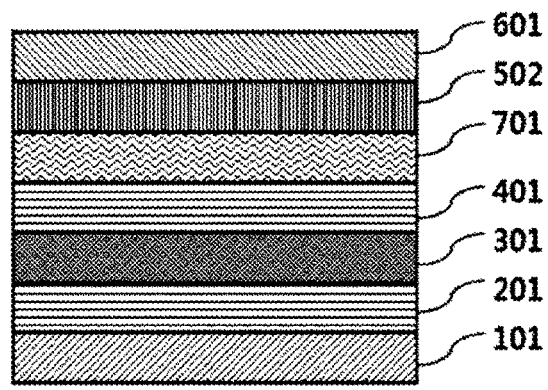
[FIG. 6]
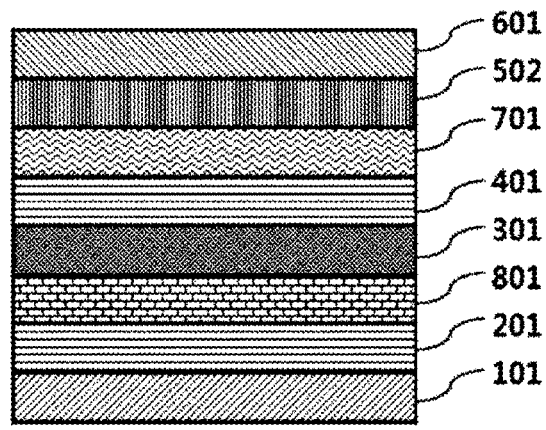

ORGANIC LIGHT-EMITTING DEVICE

CROSS-REFERENCE TO RELATED APPLICATIONS

This application is a National Stage Application of International Application No. PCT/KR2019/005353 filed on May 3, 2019, which claims priority to and the benefits of Korean Patent Application No. 10-2018-0069503, filed with the Korean Intellectual Property Office on Jun. 18, 2018, the entire contents of which are incorporated herein by reference.

TECHNICAL FIELD

The present specification relates to an organic light emitting device.

BACKGROUND

An organic light emission phenomenon is one of examples converting a current to visible light by an internal process of specific organic molecules. A principle of an organic light emission phenomenon is as follows.

When an organic material layer is placed between an anode and a cathode and a voltage is applied between the two electrodes, electrons and holes are injected to the organic material layer from the cathode and the anode, respectively. The holes and the electrons injected to the organic material layer recombine to form excitons, and light emits when these excitons fall back to the ground state. An organic light emitting device using such a principle can be generally formed with a cathode, an anode, and an organic material layer placed therebetween, for example, an organic material layer including a hole injection layer, a hole transfer layer, a light emitting layer and an electron transfer layer.

Materials used in an organic light emitting device are mostly pure organic materials or complex compounds in which an organic material and a metal form a complex, and can be divided into a hole injection material, a hole transfer material, a light emitting material, an electron transfer material, an electron injection material and the like depending on the application. Herein, as the hole injection material or the hole transfer material, organic materials having a p-type property, that is, organic materials readily oxidized and electrochemically stable when oxidized are mainly used. Meanwhile, as the electron injection material or the electron transfer material, organic materials having an n-type property, that is, organic materials readily reduced and electrochemically stable when reduced are mainly used. As the light emitting layer material, materials having both a p-type property and an n-type property, that is, materials stable in both oxidized and reduced states are preferred, and materials having, when excitons are formed, high light emission efficiency converting the excitons to light.

Development of an organic light emitting device having high efficiency has been required in the art.

BRIEF DESCRIPTION

Technical Problem

The present specification is directed to providing an organic light emitting device having high light emission efficiency and/or long lifetime.

Technical Solution

One embodiment of the present specification provides an organic light emitting device including a cathode; an anode provided opposite to the cathode; a light emitting layer provided between the cathode and the anode; and an organic material layer provided between the cathode and the light emitting layer, and including Compound (A) including a heteroatom and a cyano group, wherein Compound (A) satisfies the following Equation 1 and the following Equation 2:

$$|P_{El}^{CN}| \geq 3 \text{debye} \qquad \text{Equation 1}$$

wherein in Equation 1:

$|P_{El}^{CN}|$ means an absolute value of a dipole moment of Compound (A), $$\frac{|P_{El}^{CN}|}{|P_{El}|} > \frac{|Ea_{El}^{CN}|}{|Ea_{El}|} \qquad \text{Equation 2}$$

wherein in Equation 2:

$|P_{El}^{CN}|$ means an absolute value of a dipole moment of Compound (A), $|P_{El}|$ means an absolute value of a dipole moment of a compound having the same core as the compound of $|P_{El}^{CN}|$ without including a cyano group, $|Ea_{El}^{CN}|$ means an absolute value of electron affinity of Compound (A), and $|Ea_{El}|$ means an absolute value of electron affinity of a compound having the same core as the compound of $|Ea_{El}^{CN}|$ without including a cyano group.

Advantageous Effects

Compound (A) according to one embodiment of the present specification has a greatly increased dipole moment by including a heteroatom and a cyano group, and therefore, when an organic material layer including the same forms a film, molecular arrangements more favorably occur by the influence of the dipole moment hardening a film quality, which is effective in enhancing a lifetime of an organic light emitting device including the same. Improving a film quality by the molecular arrangement controls a rate of electrons transferred from an organic material layer including Compound (A) to a light emitting layer and thereby has a secondary lifetime improving effect.

According to one embodiment of the present specification, Compound (A) satisfies Equation 1 and Equation 2, and an organic light emitting device including the same in an organic material layer has an electron control effect by having an enhanced electron injection ability and thereby preventing an excessive amount of electrons from being simultaneously injected to a light emitting layer, and by an improved film quality obtained by the increased dipole moment, an effect of improving a lifetime of the organic light emitting device is obtained.

By Compound (A) according to one embodiment of the present specification satisfying the values of Equation 1 and Equation 2, an ability of injecting electrons entering from a cathode is enhanced, and as a result, low driving voltage and high light emission efficiency can be provided.

Compound (A) according to one embodiment of the present specification has excellent solubility in an organic solvent, and therefore, a solution process can be performed, and a large-size device can be obtained.

DESCRIPTION OF DRAWINGS

FIGS. 1 to 6 illustrate examples of an organic light emitting device according to one embodiment of the present specification.

REFERENCE NUMERALS

101: Substrate
201: Anode
301: Hole Transfer Layer
401: Light Emitting Layer
402: First Light Emitting Layer
403: Second Light Emitting Layer
404: Third Light Emitting Layer
501: Electron Transfer Layer
502: Electron Injection and Transfer Layer
601: Cathode
701: Hole Blocking Layer
801: Hole Injection Layer

DETAILED DESCRIPTION

Hereinafter, the present specification will be described in detail.

One embodiment of the present specification provides an organic light emitting device including a cathode; an anode provided opposite to the cathode; a light emitting layer provided between the cathode and the anode; and an organic material layer provided between the cathode and the light emitting layer, and including Compound (A) including a heteroatom and a cyano group, wherein Compound (A) satisfies the following Equation 1 and the following Equation 2:

$$|P_{El}^{CN}| \geq 3 \text{debye} \quad \text{Equation 1}$$

wherein in Equation 1:

$|P_{El}^{CN}|$ means an absolute value of a dipole moment of Compound (A), $$\frac{|P_{El}^{CN}|}{|P_{El}|} > \frac{|Ea_{El}^{CN}|}{|Ea_{El}|} \quad \text{Equation 2}$$

wherein in Equation 2:

$|P_{El}^{CN}|$ means an absolute value of a dipole moment of Compound (A), $|P_{El}|$ means an absolute value of a dipole moment of a compound having the same core as the compound of $|P_{El}^{CN}|$ without including a cyano group, $|Ea_{El}^{CN}|$ means an absolute value of electron affinity of Compound (A), and $|Ea_{El}|$ means an absolute value of electron affinity of a compound having the same core as the compound of $|Ea_{El}^{CN}|$ without including a cyano group.

In the present specification, "solubility" means a property that a solute is dissolved in a specific solvent, and can be expressed as the number of g of a solute that can be dissolved in 100 g of a solvent at a constant temperature.

In the present specification, a description of a certain part "including" certain constituents means capable of further including other constituents, and does not exclude other constituents unless particularly stated on the contrary.

In the present specification, the dipole moment is a physical quantity representing a degree of polarity, and can be calculated by the following Mathematical Equation 1:

$$p(r) = \int_V \rho(r_0)(r_0 - r)d^3r_0 \quad \text{Mathematical Equation 1}$$

$\rho(r_0)$: molecular density
V: volume
r: the point of observation
$d^3r_0$: an elementary volume.

A dipole moment value can be obtained by obtaining molecular density through calculation in Mathematical Equation 1. For example, molecular density can be obtained after obtaining charge and dipole for each atom using a method referred to as a Hirshfeld charge analysis, and then calculating using the following equation, and the calculation result can be put into Mathematical Equation 1 to obtain a dipole moment:

Weight Function $$W_\alpha(r) = \rho_\alpha(r - R_\alpha)\left[\sum_\beta \rho_\beta(r - R_\beta)\right]^{-1}$$

$\rho_\alpha(r - R_\alpha)$: spherically averaged ground-state amomic density $\sum_\beta \rho_\beta(r - R_\beta)$: promolecule density Deformation Density $$\rho_d(r) = \rho(r) - \sum_\alpha \rho_\alpha(r - R_\alpha)$$

$\rho(r)$: molecular density $\rho_\alpha(r - R_\alpha)$: density of the free atom $\alpha$ located at coordinates $R_\alpha$ Atomic Charge $$q(\alpha) = -\int \rho d(r) d^3r$$

$W_\alpha(r)$: weight function

Compound (A) according to one embodiment of the present specification includes a cyano group capable of greatly increasing a dipole moment without significantly affecting the overall molecular shape.

In the present specification, electron affinity means energy released when a compound bonds to electrons and becomes an anion, and can be measured using methods known in the art such as a photoelectron emission method, a transfer method, an electron transmission method and the like.

In the present specification, the calculation of the electron affinity (Ea) in accordance with an experimental measurement method and through quantum mechanics can be performed using the following Mathematical Equation 2:

$$EA(\text{electron affinity}) = E_{neutral}^{X-} - E_{anion}^{X-} \quad \text{Mathematical Equation 2}$$

In Mathematical Equation 2, $E_{geometry}^{charge}$ means energy in which a charge is 0, $X^+$ or $X^-$ in a structure where a geometry is optimized to a cation, an anion or neutral.

In other words, the electron affinity means a difference between energy of the safest structure of a neutral structure and the safest energy of an anion, and can mean energy released when adding one electron in a neutral state.

Specifically, as for the value of Mathematical Equation 2, the electron affinity is obtained according to the above-mentioned equation after obtaining a stable structure for each of a neutral state having an electrovalence of 0 and an anion having an electrovalence of −1, and calculating energy. Structural optimization and energy calculation are calculated with density functional theory (DFT) using B3LYP functional and 6-31G* basis function through Material Science Suite, a quantum chemical computing program of Schrœinger LLC.

Compound (A) satisfying Equation 1 according to one embodiment of the present specification has an excellent ability of injecting electrons coming from a cathode, and is thereby capable of providing low driving voltage and high light emission efficiency, and is capable of providing an organic light emitting device with a long lifetime by proving a dense film when laminated in the organic light emitting device.

In addition, at the same time, Equation 2 in which a value of $|P_{El}^{CN}|$ with respect to an absolute value ($|P_{El}|$) of a dipole moment of a compound having the same core as the compound of $|P_{El}^{CN}|$ without including a cyano group is larger than a value of $|P_{El}^{CN}|$ with respect to an absolute value ($|Ea_{El}|$) of electron affinity of a compound having the same core as the compound of $|Ea_{El}|$ without including a cyano group is satisfied, and therefore, an electron injection ability is enhanced, which is effective in electron control by preventing an excessive amount of electrons from being simultaneously injected to a light emitting layer, and as a result, an effect of improving a lifetime of an organic light emitting device including an organic material layer including Compound (A) satisfying Equation 1 and Equation 2 is obtained.

According to one embodiment of the present specification, Equation 1 is the following Equation 1-1:

$$15\text{debye} \geq |P_{El}^{CN}| \geq 3\text{debye} \quad \text{Equation 1-1}$$

According to one embodiment of the present specification, Equation 1 is the following Equation 1-2:

$$11\text{debye} \geq |P_{El}^{CN}| \leq 3\text{debye} \quad \text{Equation 1-2}$$

In Equations 1-1 and 1-2:

$|P_{El}^{CN}|$ has the same definition as above.

According to one embodiment of the present specification, the organic material layer is a hole blocking layer, an electron transfer layer, an electron injection layer, or an electron injection and transfer layer.

According to one embodiment of the present specification, the organic material layer is a hole blocking layer.

According to one embodiment of the present specification, the organic material layer is an electron transfer layer.

According to one embodiment of the present specification, the organic material layer is an electron injection layer.

According to one embodiment of the present specification, the organic material layer is an electron injection and transfer layer.

According to one embodiment of the present specification, a hole blocking layer provided between the light emitting layer and the organic material layer is further included, the hole blocking layer is provided adjoining the light emitting layer, and the organic material layer is an electron injection and transfer layer.

According to one embodiment of the present specification, a hole blocking layer provided between the light emitting layer and the organic material layer is further included, the hole blocking layer is provided adjoining the light emitting layer, and the organic material layer is an electron injection layer.

According to one embodiment of the present specification, a hole blocking layer provided between the light emitting layer and the organic material layer is further included, the hole blocking layer is provided adjoining the light emitting layer, and the organic material layer is an electron transfer layer.

According to one embodiment of the present specification, Compound (A) has electron mobility of greater than or equal to $10^{-12}$ cm$^2$/Vs and less than or equal to $10^2$ cm$^2$/Vs under an electric field condition of 0.1 MV/cm. In this case, an electron transfer ability to a light emitting layer is enhanced, which increases the number of excitons generated in the light emitting layer, and high device efficiency can be expected.

Electron mobility and hole mobility can be measured using methods known in the art. Specifically, a time of flight (TOF) method or a method of measuring a space charge limited current (SCLC) can be used, however, the method is not limited thereto.

According to one embodiment of the present specification, electron mobility of Compound (A) measured using a time of flight (TOF) method is greater than or equal to $10^{-12}$ cm$^2$/Vs and less than or equal to $10^2$ cm$^2$/Vs.

In the present specification, charge mobility can be measured while employing a film thickness of a material as 1000 nm or greater in order to measure a space charge limited current (SCLC).

Specifically, in one embodiment of the present specification, bathophenanthroline and lithium quinolate (2%) are heated under vacuum and deposited to a thickness of 100 nm on an ITO substrate, and then the compound is deposited to 200 nm. On the layer, bathophenanthroline and lithium quinolate (2%) are deposited again to a thickness of 100 nm, and then aluminum is deposited to 100 nm or greater to prepare a sample. Electron mobility in a space charge limited current (SCLC) region can be calculated by measuring current density (mA/cm$^2$) of the sample with respect to a voltage.

In addition, hexanitrile hexaazatriphenylene is heated under vacuum and deposited to a thickness of 5 nm on an ITO substrate, the compound is deposited to 200 nm, and then aluminum is deposited to 100 nm or greater to prepare a sample. Electron mobility in a space charge limited current (SCLC) region can be calculated by measuring current density (mA/cm$^2$) of the sample with respect to a voltage.

According to one embodiment of the present specification, the organic material layer has a glass transition temperature (Tg) of higher than 100° C. and lower than or equal to 200° C. When the glass transition temperature is in the above-mentioned range, an organic light emitting device having excellent thermal stability can be used.

In the present specification, the glass transition temperature can be measured using methods known in the art, and specifically, a differential scanning calorimeter (DSC) can be used, however, the method is not limited thereto.

The glass transition temperature can be measured before laminating the organic material layer, and the glass transition temperature of the organic material layer after lamination is the same.

Specifically, the glass transition temperature is measured from a peak-type area curve obtained by heating a reference material and a sample at the same time at a constant temperature increasing rate and measuring an energy input difference between the two due to heat absorption and heat generation caused by phase changes and thermal decomposition of the sample as a function of a temperature. A differential scanning calorimeter Q100 (product of TA Instruments) is used as a measuring device.

According to one embodiment of the present specification, the light emitting layer includes a host and a dopant, and the dopant has a maximum light emission wavelength in a range of 420 nm to 520 nm.

According to one embodiment of the present specification, the dopant is a blue fluorescent dopant.

In the present specification, the organic light emitting device is a blue organic light emitting device including Compound (A) satisfying Equation 1 and Equation 2 as an organic material layer between a cathode and a light emitting layer, which is effective in improving a lifetime of an organic light emitting device emitting blue light.

According to one embodiment of the present specification, the host can include one or more types of materials.

According to one embodiment of the present specification, the host includes at least one compound of the following Chemical Formulae 1-1 and 1-2. When including the following compounds, energy levels of the organic material layer and light emitting layer are properly formed, and the amount of electrons migrating from the organic material layer to the light emitting layer is readily controlled, which is effective in improving a lifetime of an organic light emitting device.

Chemical Formula 1-1

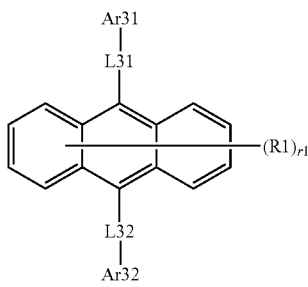

Chemical Formula 1-2

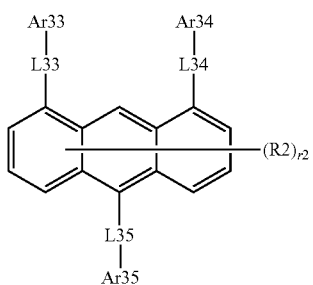

In Chemical Formulae 1-1 and 1-2:

L31 to L35 are the same as or different from each other, and each independently is a direct bond, a substituted or unsubstituted arylene group, or a substituted or unsubstituted heteroarylene group;

Ar31 to Ar35 are the same as or different from each other, and each independently is a substituted or unsubstituted aryl group or a substituted or unsubstituted heteroaryl group;

R1 and R2 are the same as or different from each other, and each independently is hydrogen or a substituted or unsubstituted aryl group;

r1 is an integer of 1 to 8;

r2 is an integer of 1 to 7;

when r1 is 2 or greater, the two or more R1s are the same as or different from each other; and when r2 is 2 or greater, the two or more R2s are the same as or different from each other.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which a hydrogen atom is substituted, that is, a position at which a substituent can substitute, and when two or more substitute, the two or more substituents can be the same as or different from each other.

In the present specification, the team "substituted or unsubstituted" means being substituted with one or more substituents selected from the group consisting of deuterium, a halogen group, a cyano group, an alkyl group, an aryl group, and a heteroaryl group, or being substituted with a substituent linking two or more substituents among the substituents described above, or having no substituents. For example, "a substituent linking two or more substituents" can include a biphenyl group. In other words, a biphenyl group can be an aryl group, or interpreted as a substituent linking two phenyl groups.

In the present specification, the halogen group can be fluorine, chlorine, bromine or iodine.

In the present specification, the alkyl group can be linear or branched, and although not particularly limited thereto, the number of carbon atoms is preferably from 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the aryl group is not particularly limited, but preferably has 6 to 30 carbon atoms, and the aryl group can be monocyclic or polycyclic.

When the aryl group is a monocyclic aryl group, the number of carbon atoms is not particularly limited, but is preferably from 6 to 30. Specific examples of the monocyclic aryl group can include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group can include a naphthyl group, an anthracene group, a phenanthrene group, a triphenylene group, a pyrene group, a phenalene group, a perylene group, a chrysene group, a fluorene group and the like, but are not limited thereto.

In the present specification, the fluorene group can be substituted, and adjacent groups can bond to each other to form a ring.

When the fluorene group is substituted,

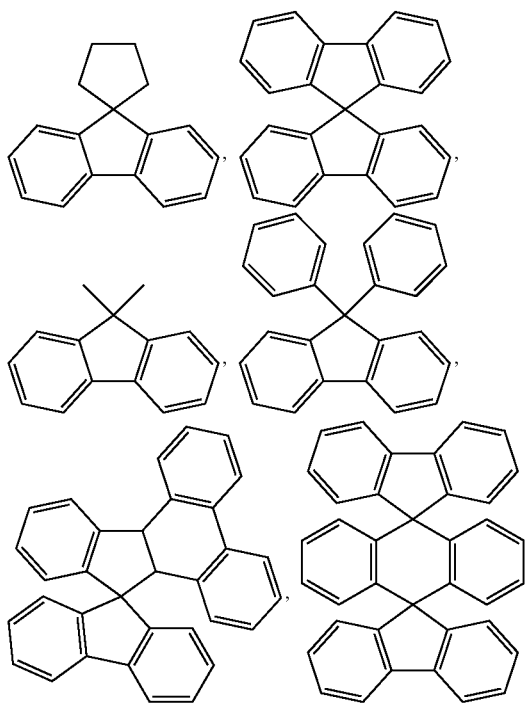

and the like can be included. However, the structure is not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, the heteroaryl group includes one or more atoms that are not carbon, that is, heteroatoms, and specifically, the heteroatom can include one or more atoms selected from the group consisting of O, N, Se, S and the like. The number of carbon atoms is not particularly limited, but is preferably from 2 to 30, and the heteroaryl group can be monocyclic or polycyclic. Examples of the heterocyclic group can include a thiophene group, a furan group, a pyrrole group, an imidazole group, a triazole group, an oxazole group, an oxadiazole group, a pyridyl group, a bipyridyl group, a pyrimidyl group, a triazine group, a triazole group, an acridine group, a pyridazine group, a pyrazine group, a quinoline group, a quinazoline group, a quinoxaline group, a phthalazine group, a pyridopyrimidyl group, a pyridopyrazine group, a pyrazinopyrazine group, an isoquinoline group, an indole group, a carbazole group, a benzoxazole group, a benzimidazole group, a benzothiazolyl group, a benzocarbazole group, a benzothiophene group, a dibenzothiophene group, a benzofuran group, a dibenzofuran group, a phenanthroline group, a phenanthridine group, an isoxazole group, a thiadiazole group, a phenothiazine group and the like, but are not limited thereto.

In the present specification, the arylene group means an aryl group having two bonding sites, that is, a divalent group. Descriptions on the aryl group provided above can be applied thereto except for those that are each a divalent group.

In the present specification, the heteroarylene group means a heteroaryl group having two bonding sites, that is, a divalent group. Descriptions on the heteroaryl group provided above can be applied thereto except for those that are each a divalent group.

According to one embodiment of the present specification, L31 to L35 are the same as or different from each other, and each independently is a direct bond or an arylene group.

According to one embodiment of the present specification, L31 to L35 are the same as or different from each other, and each independently is a direct bond; a phenylene group; a naphthylene group; or a divalent anthracene group.

According to one embodiment of the present specification, Ar31 to Ar35 are the same as or different from each other, and each independently is an aryl group unsubstituted or substituted with deuterium; or a heteroaryl group unsubstituted or substituted with an aryl group.

According to one embodiment of the present specification, Ar31 to Ar35 are the same as or different from each other, and each independently is a phenyl group that is unsubstituted or substituted with deuterium, a biphenyl group, a naphthyl group, a thiophene group that is unsubstituted or substituted with a phenyl group, a dibenzofuran group, a dibenzothiophene group, a benzo[b]naphtho[1,2-d]furan group, a benzo[b]naphtho[2,3-d]furan group, or a benzo[d]naphtho[1,2-b]furan group.

According to one embodiment of the present specification, R1 is hydrogen or an aryl group that is unsubstituted or substituted with an aryl group.

According to one embodiment of the present specification, R1 is hydrogen or a naphthyl group that is unsubstituted or substituted with a phenyl group.

According to one embodiment of the present specification, R2 is hydrogen.

According to one embodiment of the present specification, the host is any one or more selected from among the following compounds:

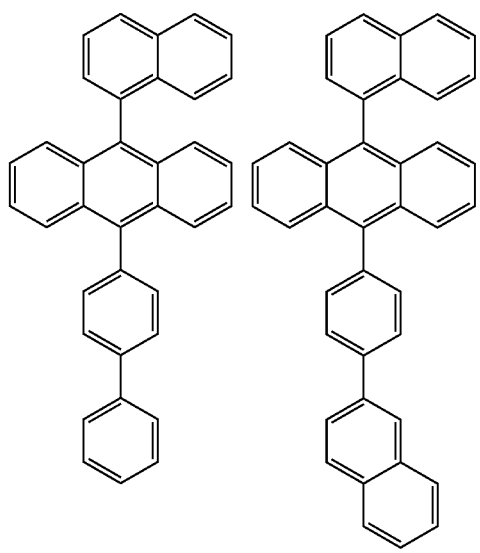

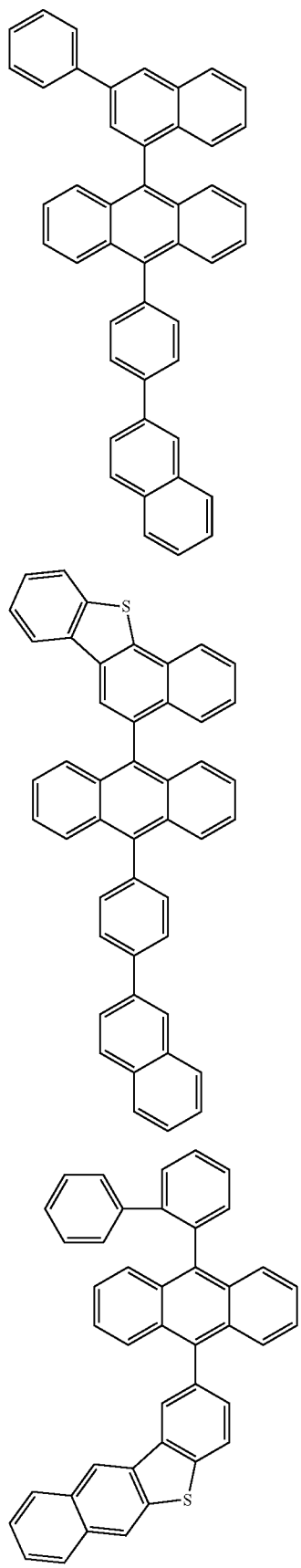
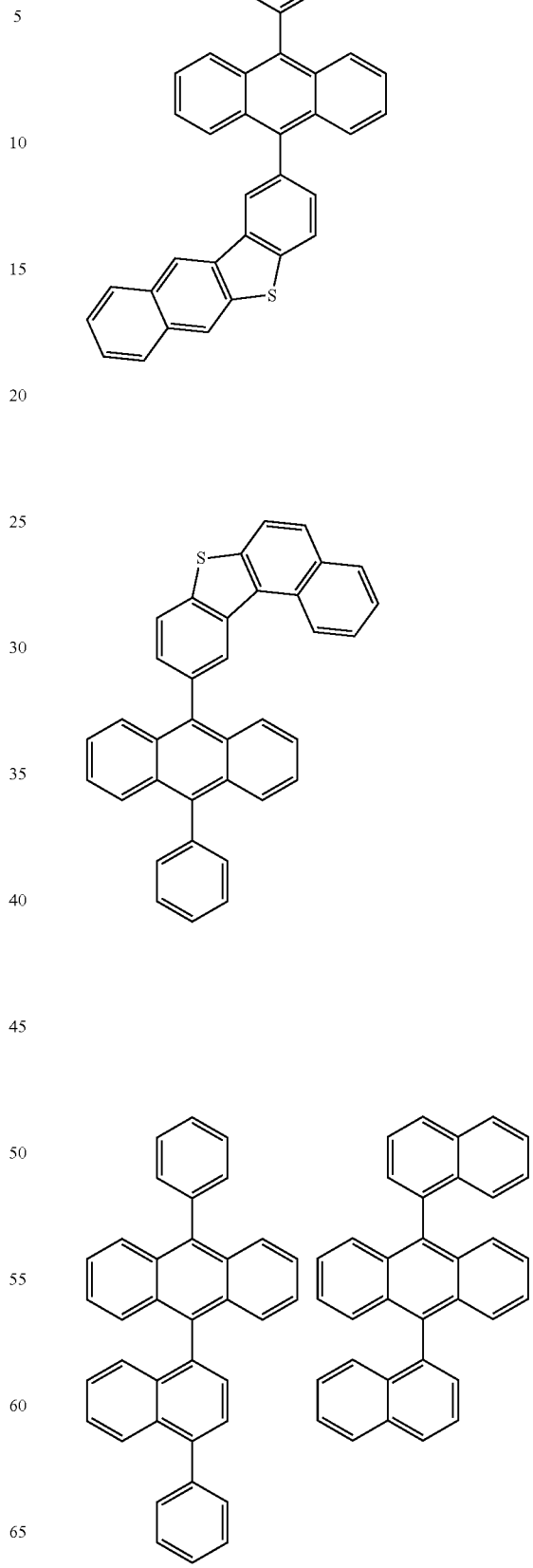

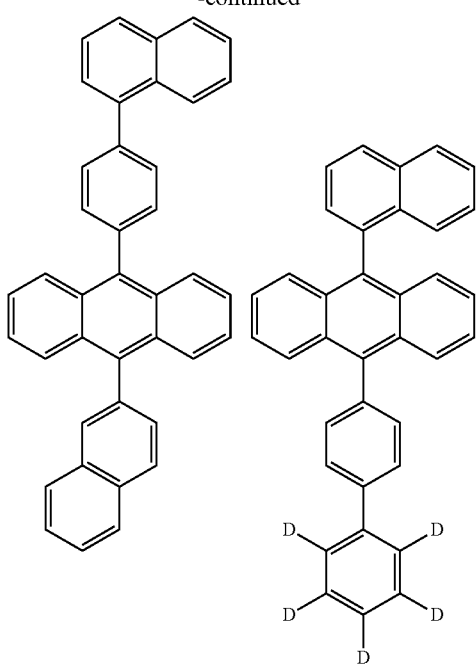
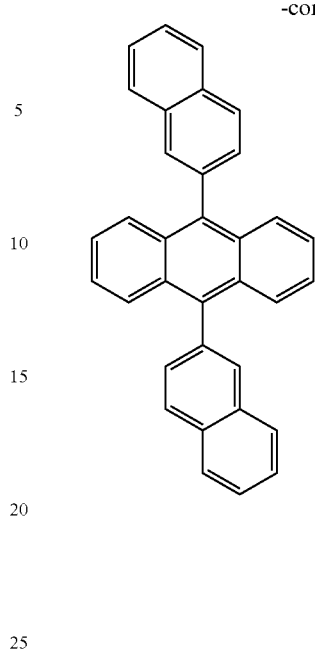
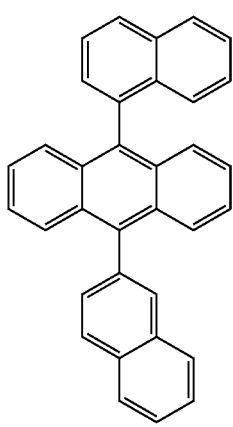
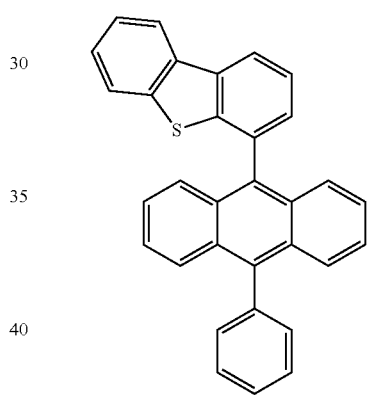
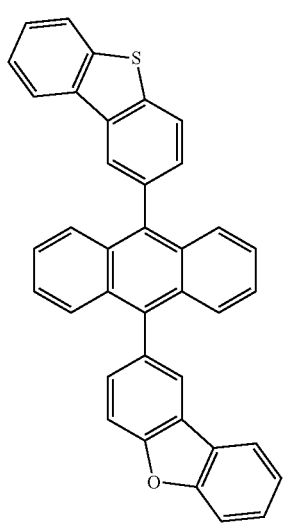
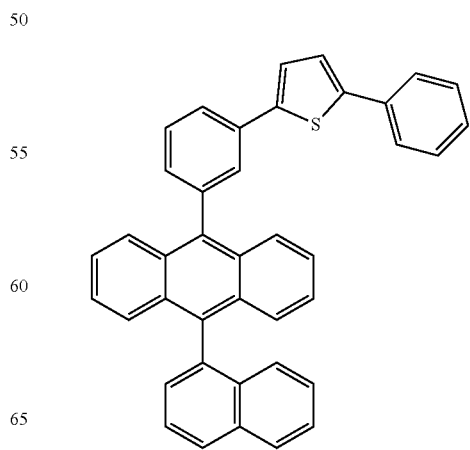

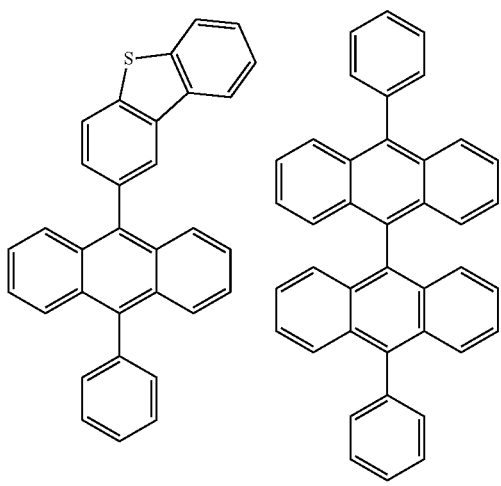
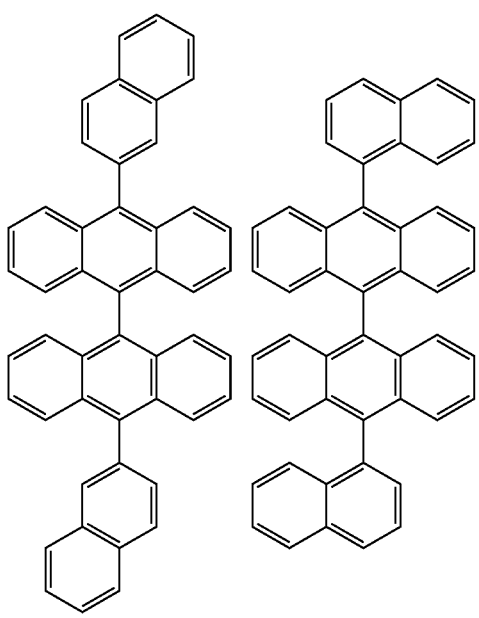
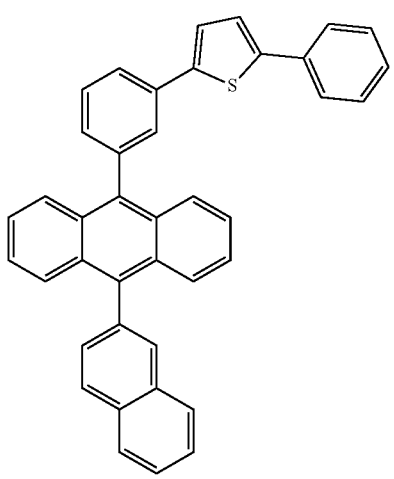
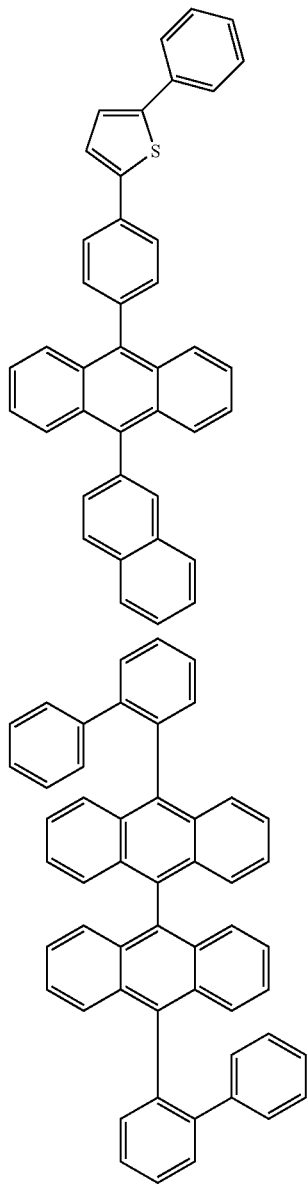
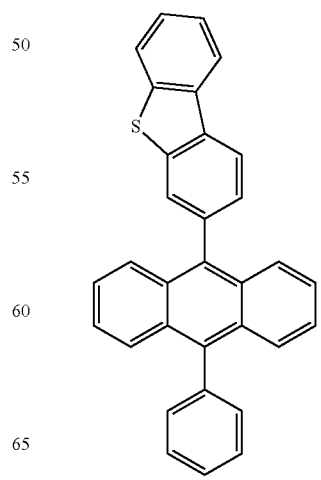

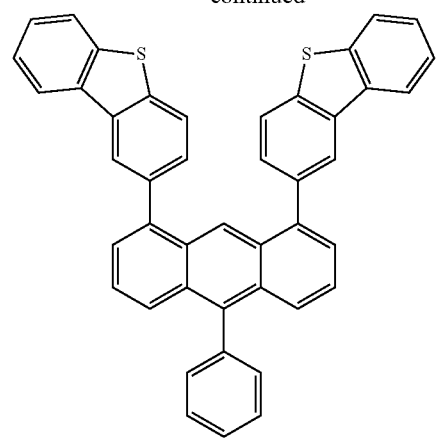
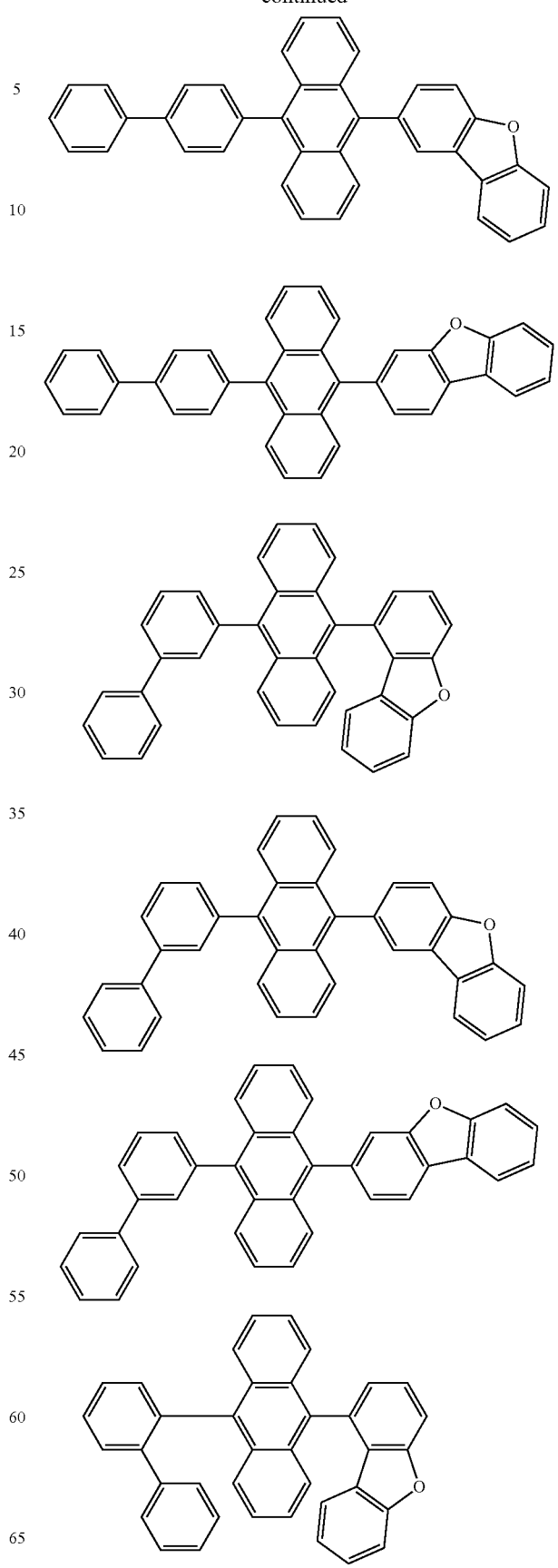

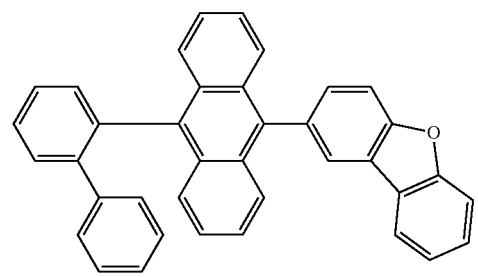
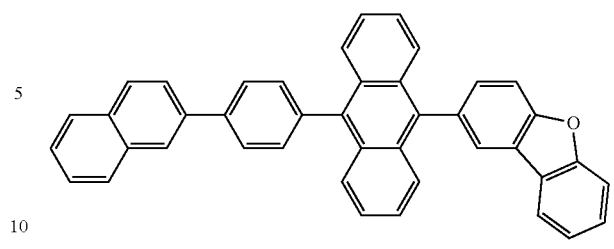
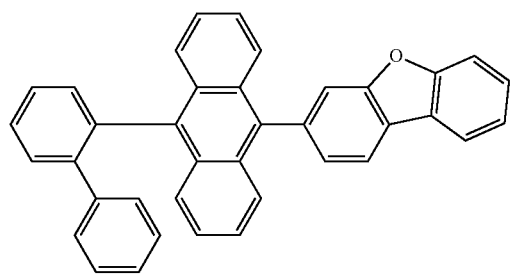
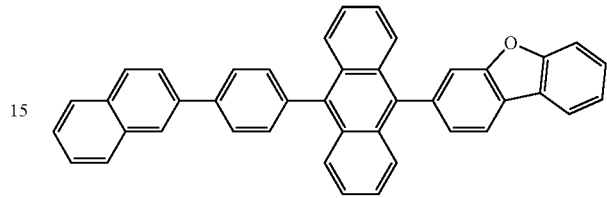
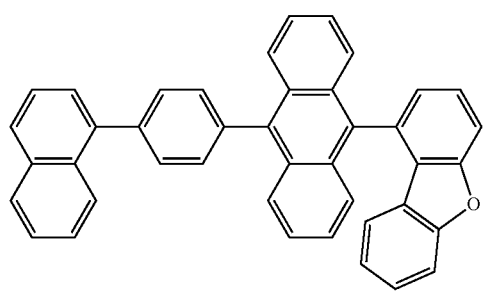
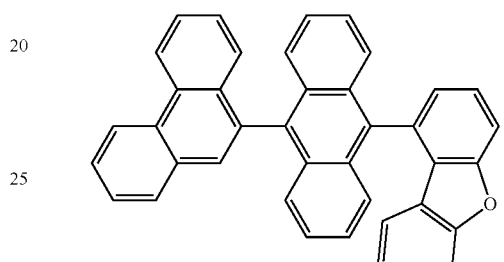
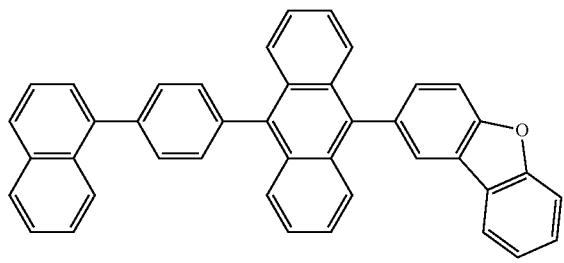
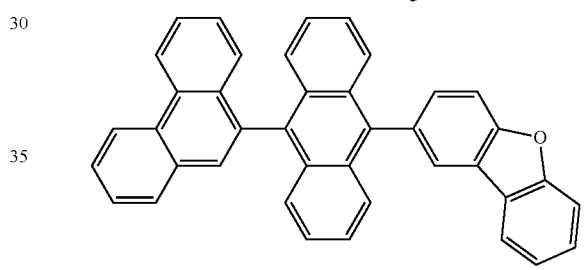
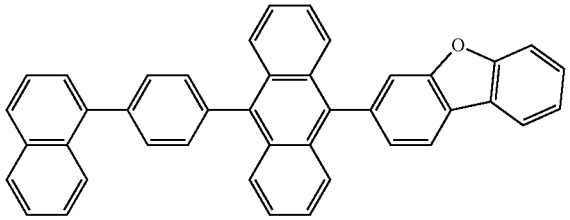
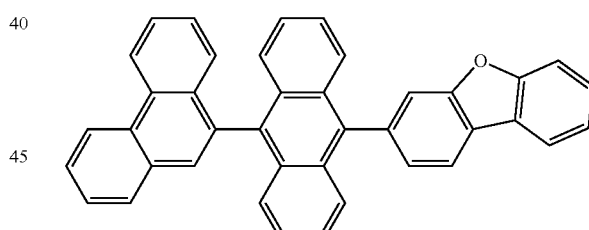
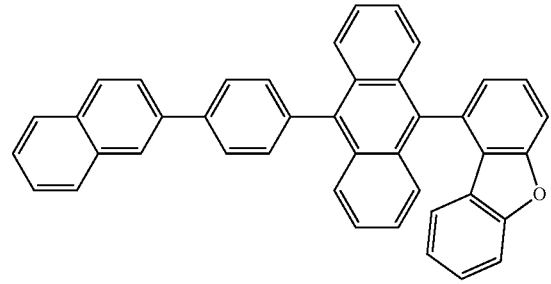
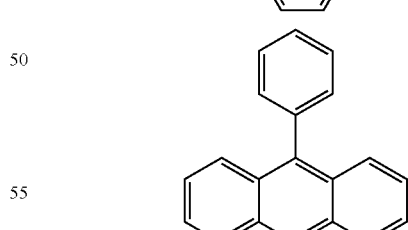
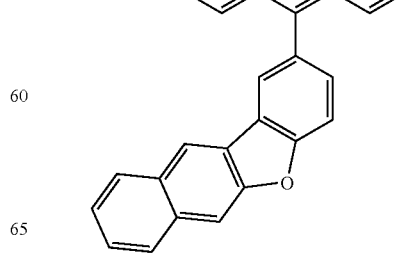

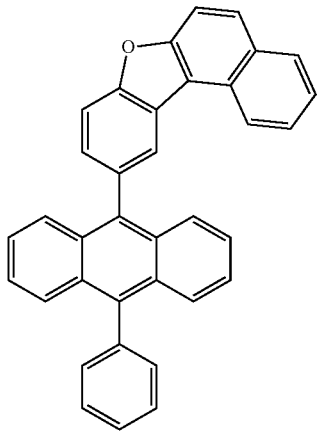
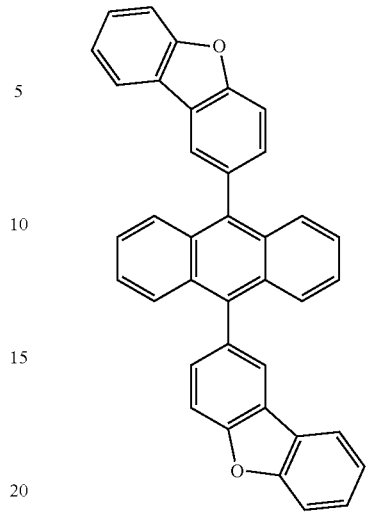
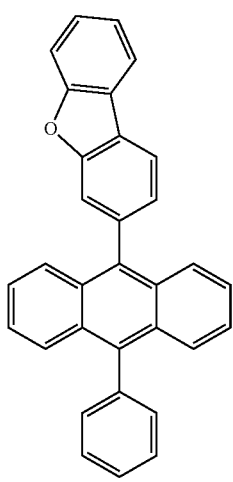
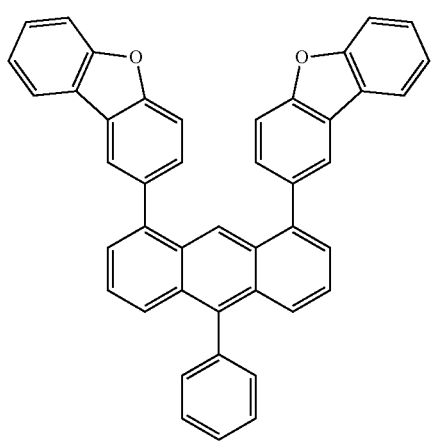

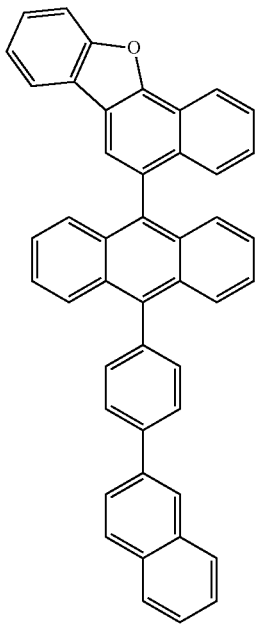

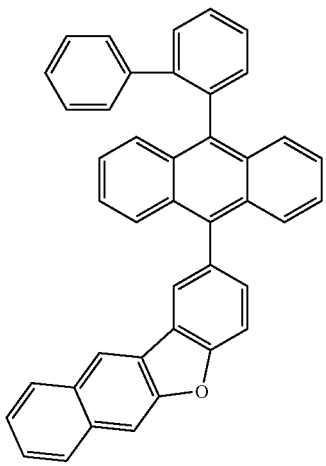

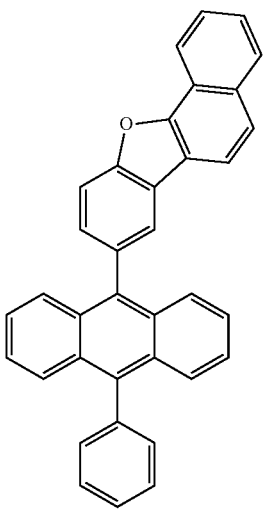

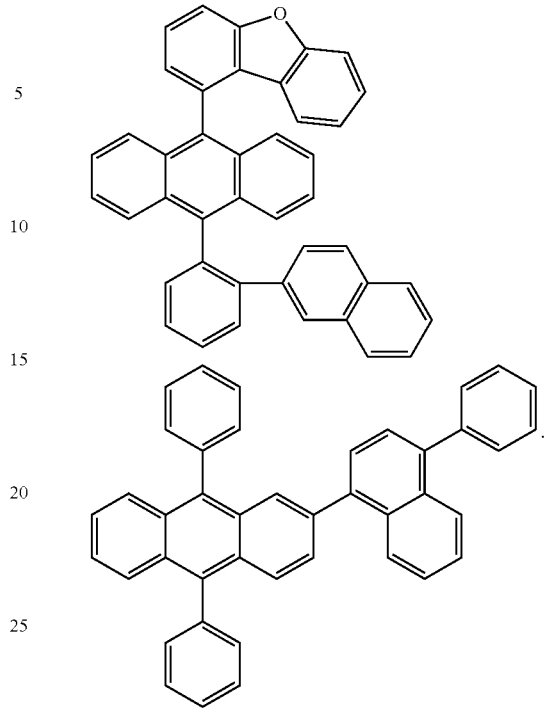

According to one embodiment of the present specification, the organic material layer further includes a metal complex.

According to one embodiment of the present specification, the metal complex is a metal complex or an alkali earth metal complex.

When the organic material layer further includes an alkali metal complex or an alkali earth metal complex, electrons can be readily extracted from a cathode.

According to one embodiment of the present specification, the metal complex is the following Chemical Formula 2:

Chemical Formula 2

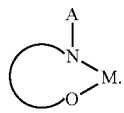

In Chemical Formula 2:

A is hydrogen, deuterium, a halogen group, a cyano group, a substituted or unsubstituted alkyl group, a substituted or unsubstituted alkenyl group, a substituted or unsubstituted aryl group, or a substituted or unsubstituted heteroaryl group;

the curve represents a bond and 2 or 3 atoms required for forming a 5-membered or 6-membered ring containing M, and the atoms are unsubstituted or substituted with one, two or more substituents having the same definitions as A; and M is an alkali metal or an alkali earth metal.

In the present specification, the alkenyl group can be linear or branched, and although not particularly limited thereto, the number of carbon atoms is preferably from 2 to 30. Specific examples thereof can include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

According to one embodiment of the present specification, Chemical Formula 2 is one of the following Chemical Formula 2-1 or 2-2:

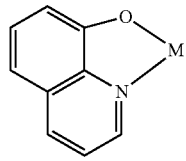

Chemical Formula 2-1

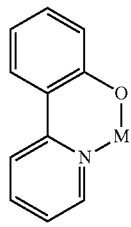

Chemical Formula 2-2 wherein in Chemical Formulae 2-1 and 2-2:

M has the same definition as in Chemical Formula 2;

structures of Chemical Formulae 2-1 and 2-2 are each independently unsubstituted or substituted with one or more substituents selected from the group consisting of deuterium, a halogen group, a nitrile group, a nitro group, a hydroxyl group, a substituted or unsubstituted alkyl group, a substituted or unsubstituted alkenyl group, a substituted or unsubstituted aryl group, and a substituted or unsubstituted heteroaryl group, or adjacent groups bond to each other to form a substituted or unsubstituted hydrocarbon ring, or a substituted or unsubstituted heteroring.

In the present specification, the "ring" in the substituted or unsubstituted ring formed by adjacent groups bonding to each other means a substituted or unsubstituted hydrocarbon ring or a substituted or unsubstituted heteroring.

In the present specification, the hydrocarbon ring can be aromatic, aliphatic or a fused ring of aromatic and aliphatic, and can be selected from among the examples of the aryl group except for those that are not monovalent.

In the present specification, the heteroring includes one or more atoms that are not carbon, that is, heteroatoms, and specifically, the heteroatom can include one or more atoms selected form the group consisting of O, N, Se, S and the like. The heteroring can be monocyclic or polycyclic, can be aromatic, aliphatic or a fused ring of aromatic and aliphatic, and can be selected from among the examples of the heteroaryl group except for those that are not monovalent.

According to one embodiment of the present specification, Chemical Formula 2 is selected from among the following structures:

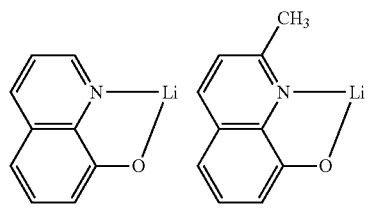

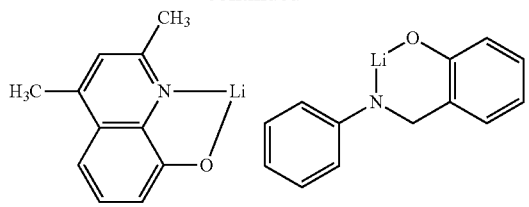

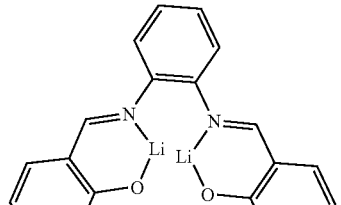

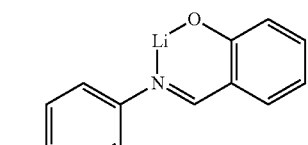

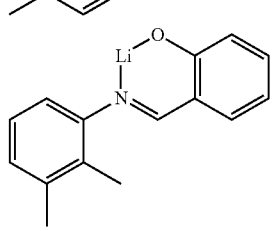

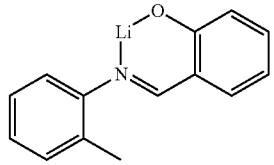

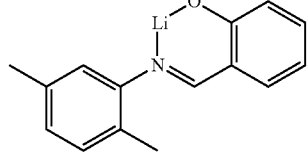

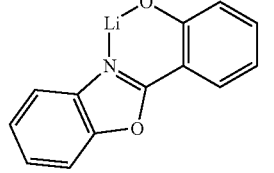

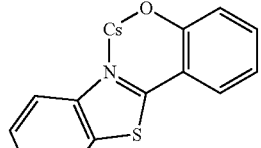

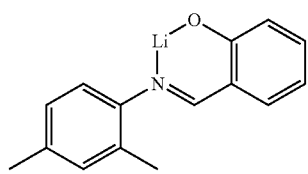

-continued
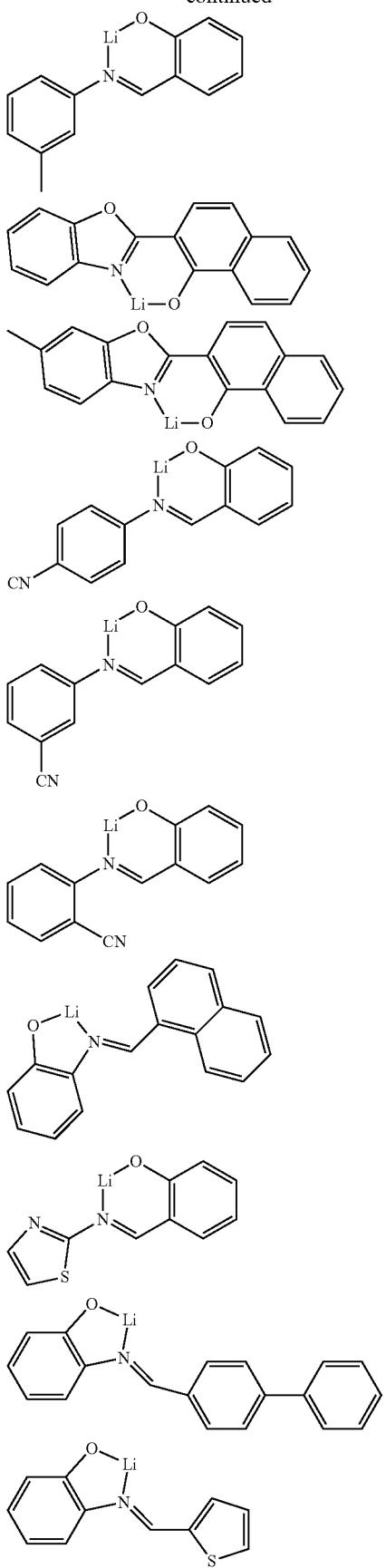
-continued
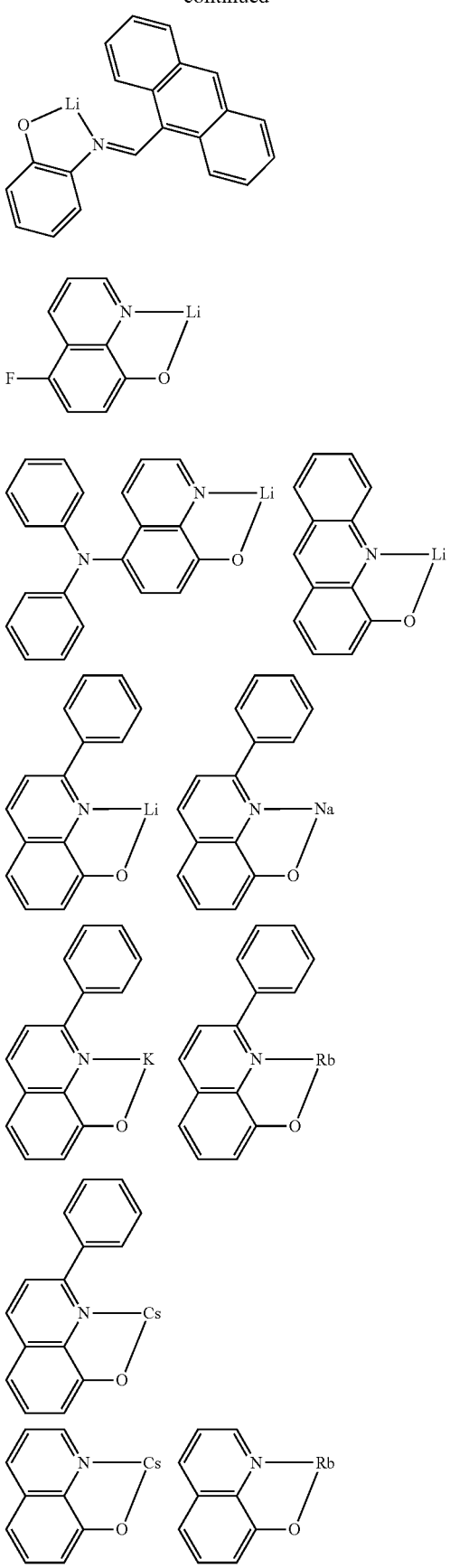

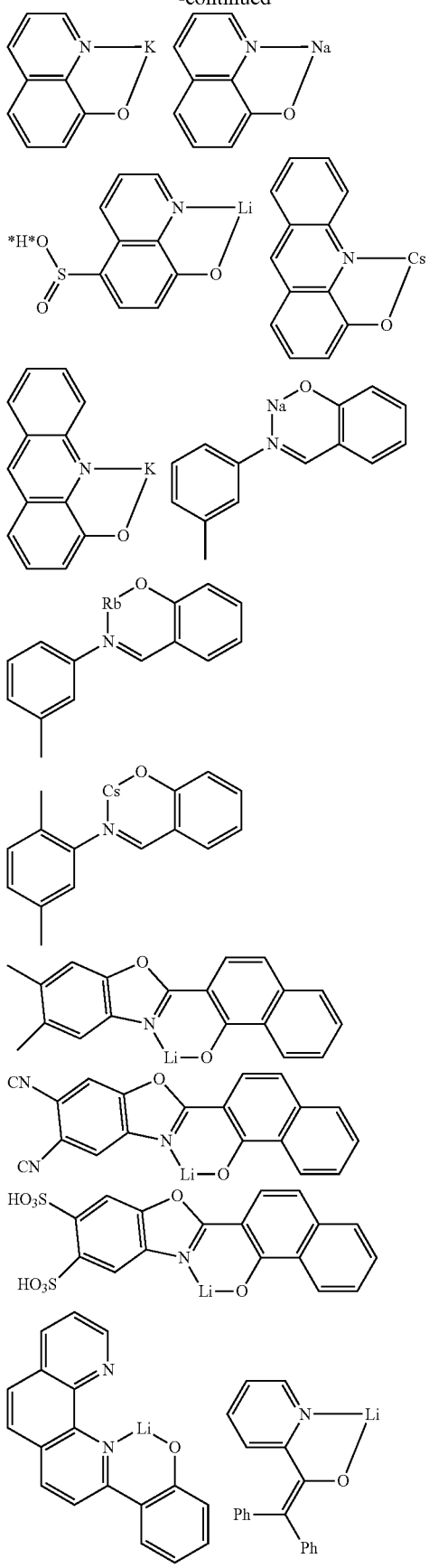

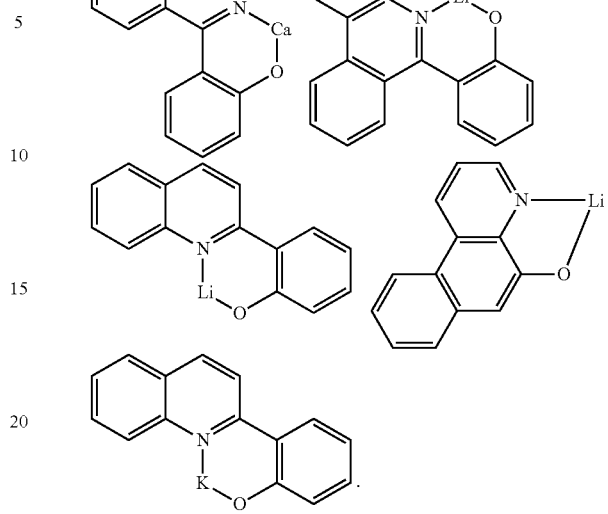

According to one embodiment of the present specification, the organic material layer further includes a metal complex, and includes Compound (A): the metal complex in a weight ratio of 1:9 to 9:1.

When satisfying the above-mentioned weight ratio, electrons are readily extracted from a cathode, and therefore, a device voltage can be properly adjusted between 2 V to 5 V. When the metal complex is included in the weight ratio of less than 1, electron extraction from a cathode significantly decreases greatly increasing a voltage. On the other hand, when the metal complex is included in the weight ratio of greater than 9, electron mobility greatly decreases although electrons are readily extracted, and a voltage increases due to the electron mobility.

According to one embodiment of the present specification, Compound (A) is a compound including a heteroring including at least one N.

According to one embodiment of the present specification, the heteroring including at least one N can be a 5-membered ring or a 6-membered ring, and the ring including the 5-membered ring or the 6-membered ring can be monocyclic or polycyclic.

According to one embodiment of the present specification, the heteroring including at least one N is any one of the following structures:

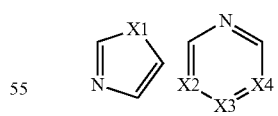

wherein:
X1 is NR, S, O or CRR';
X2 to X4 are each N or CR";
R, R' and R" are the same as or different from each other, and each independently is a monovalent organic group, and to the above-described structure, a hydrocarbon ring or a heteroring can be fused.

In the present specification, a hydrocarbon ring or a heteroring being fused means a hydrocarbon ring or a heteroring bonding to the structure to form a polycyclic ring.

In the present specification, examples of the organic group can include an alkyl group, an alkenyl group, a cycloalkyl group, aryl group and the like. This organic group can also include bonds or substituents other than the hydrocarbon group such as a heteroatom in the organic group. In addition, the organic group can be any of linear, branched or cyclic.

In the present specification, a monovalent organic group means a monovalent group having one bonding position in an organic compound.

In addition, the organic group can form a cyclic structure, and can form bonds including a heteroatom as long as it does not impair effects of the disclosure.

Specifically, bonds including a heteroatom such as an oxygen atom, a nitrogen atom or a silicon atom can be included. Specific examples thereof can include a cyano bond, an ether bond, a thioether bond, a carbonyl bond, a thiocarbonyl bond, an ester bond, an amide bond, an urethane bond, an imino bond (—N=C(-Q)-, —C(=NQ)- where Q is a hydrogen atom or an organic group), a carbonate bond, a sulfonyl bond, a sulfinyl bond, an azo bond and the like, but are not limited thereto.

Examples of the cyclic structure can include the above-described aromatic ring, aliphatic ring and the like, and the cyclic structure can be monocyclic or polycyclic.

In one embodiment of the present specification, the heteroring including at least one N can be any one of the following structures, but is not limited thereto:

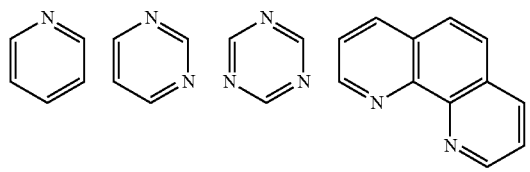

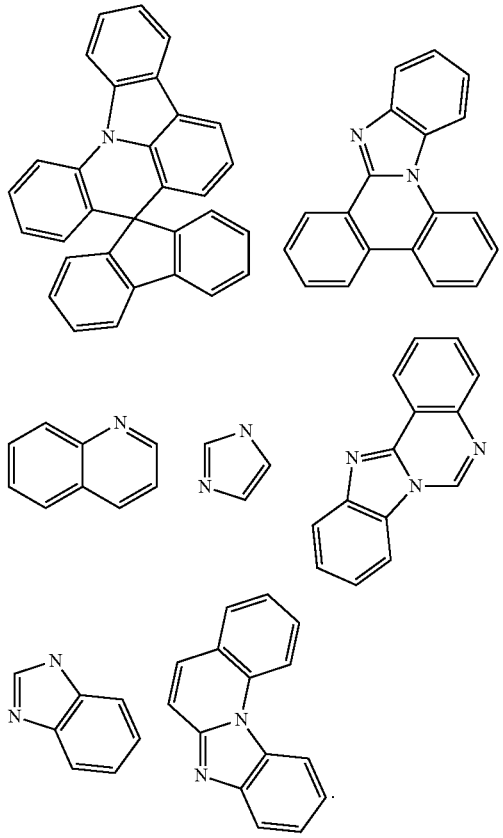

The structures can be unsubstituted or substituted with one, two or more substituents selected from the group consisting of deuterium, an alkyl group, an aryl group, and a heterocyclic group.

According to one embodiment of the present specification, Compound (A) is a compound including a heteroring including at least one N, and a cyano group.

According to one embodiment of the present specification, Compound (A) is selected from among the following compounds:

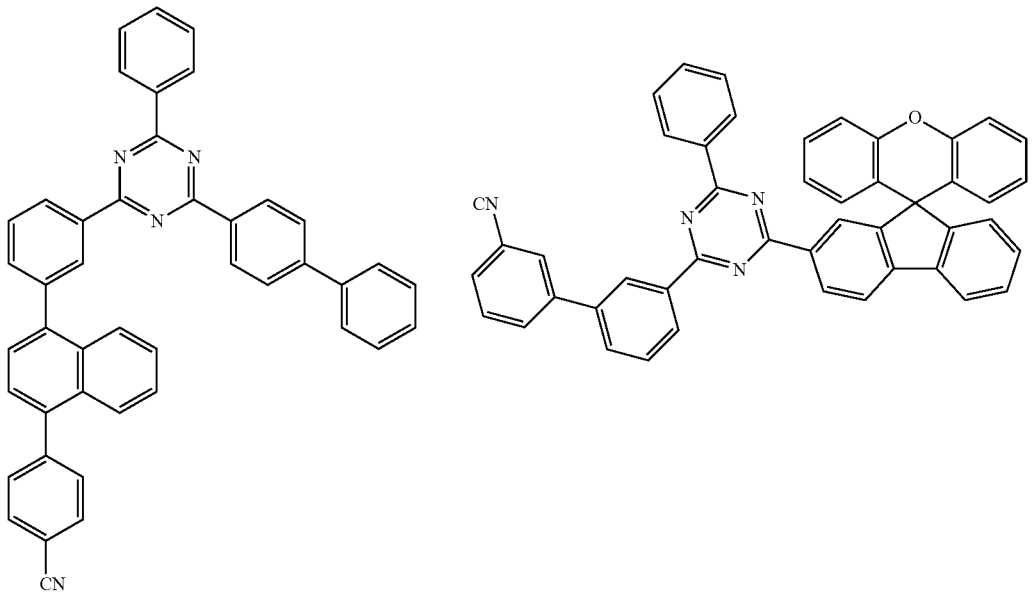

-continued
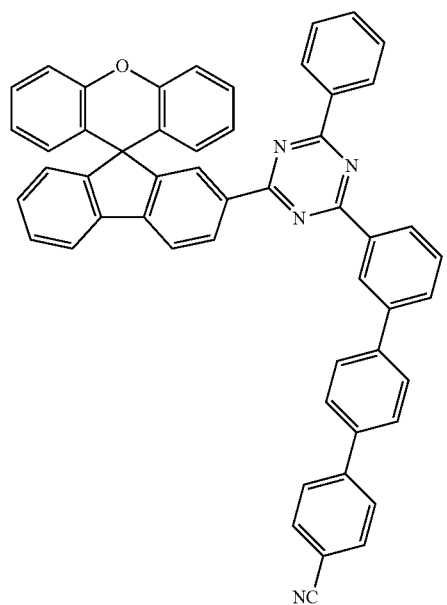
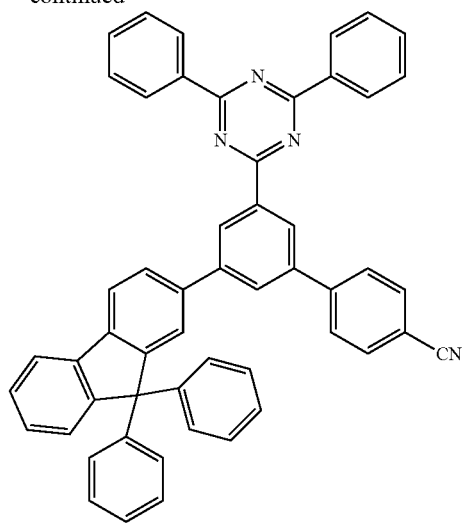
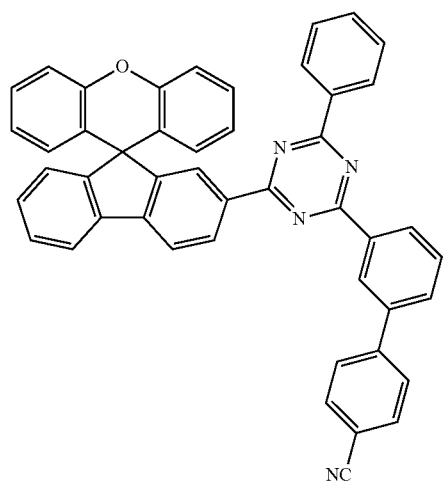
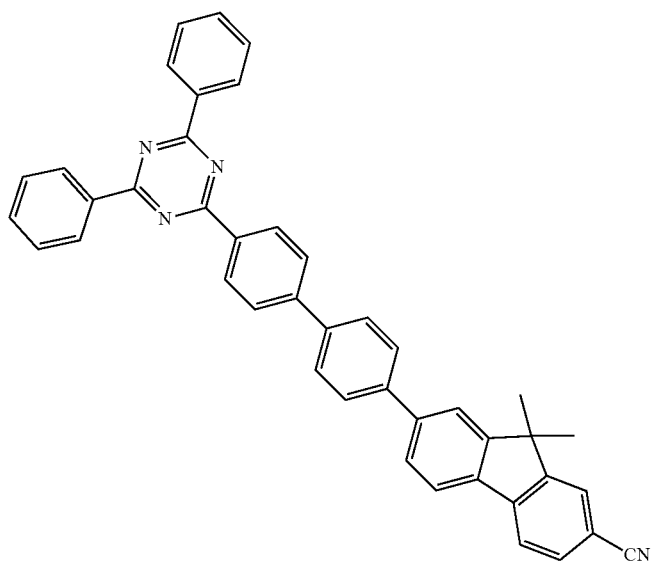
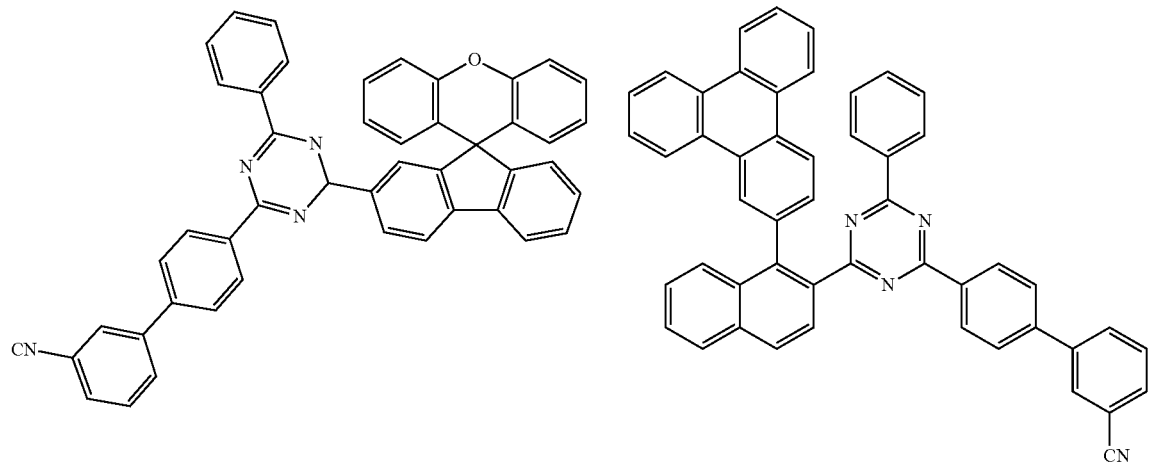

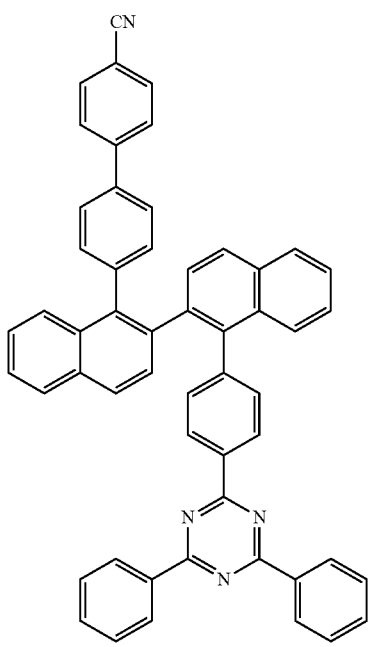
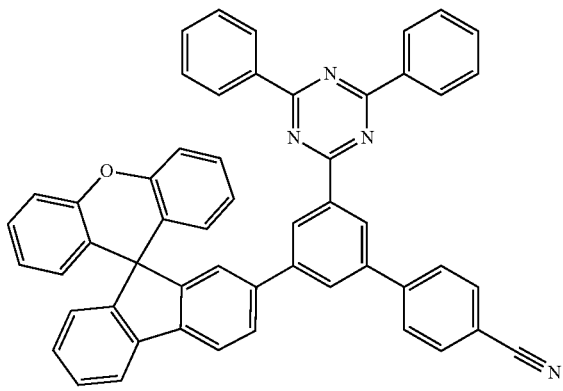
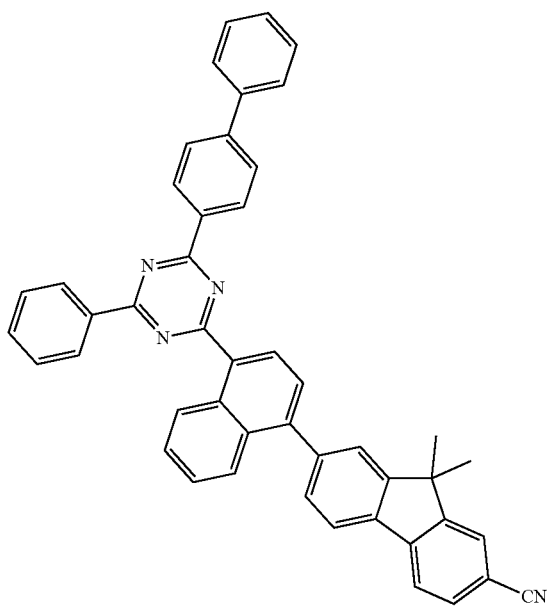
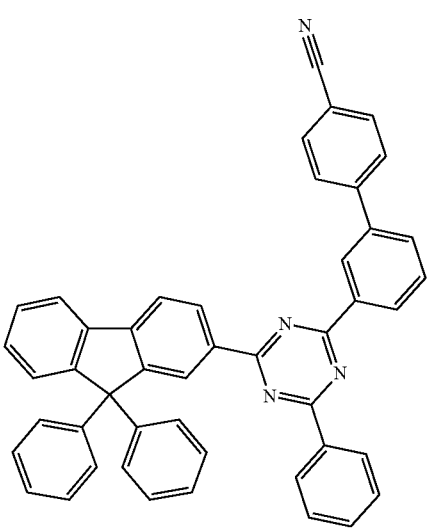

-continued
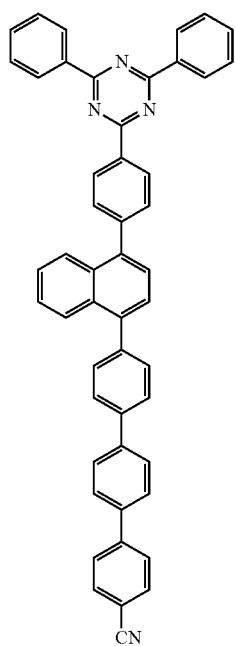
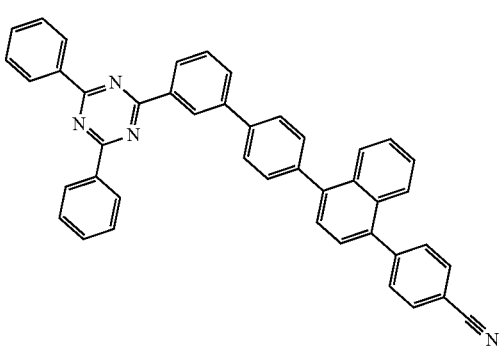
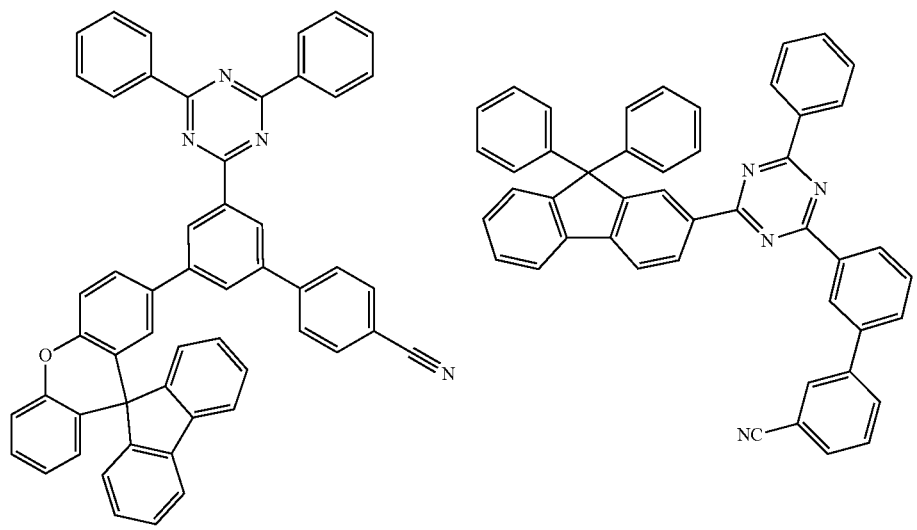

-continued
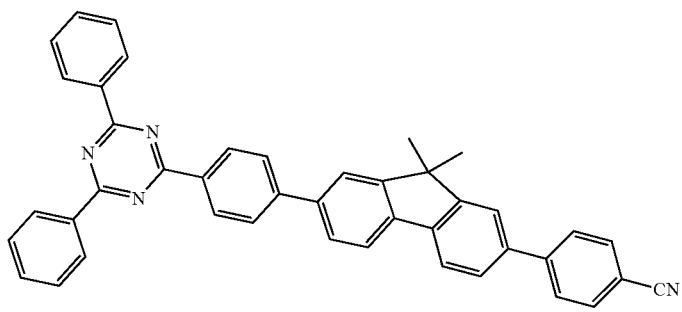
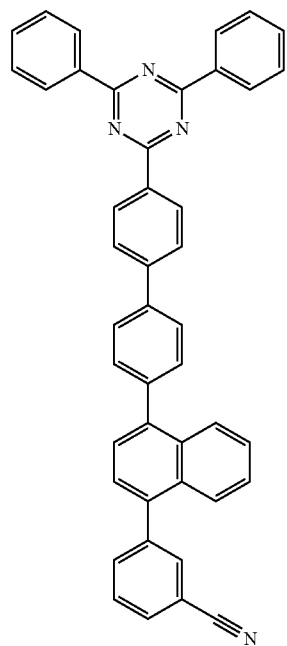
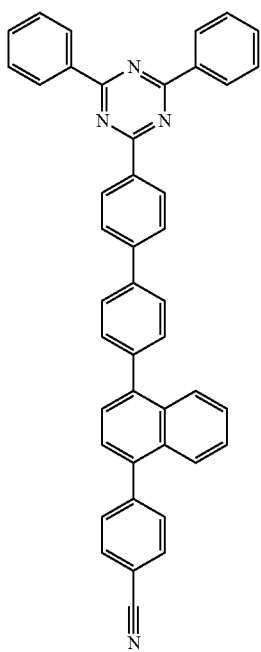
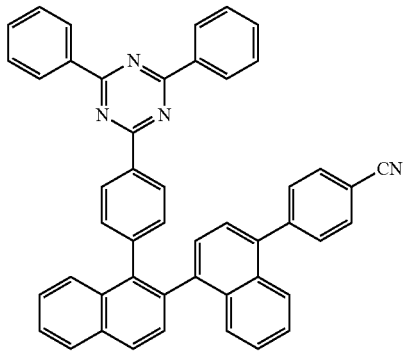

-continued
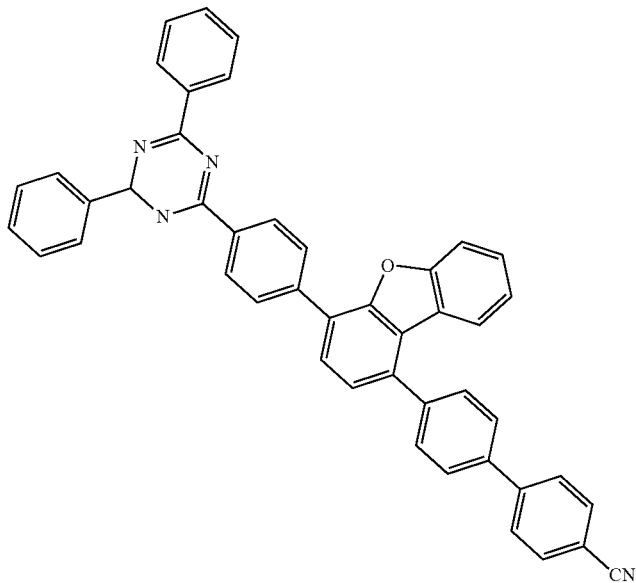
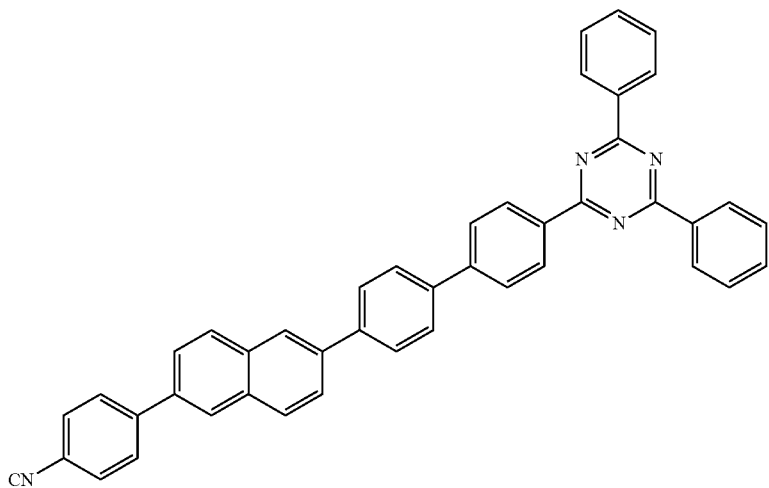
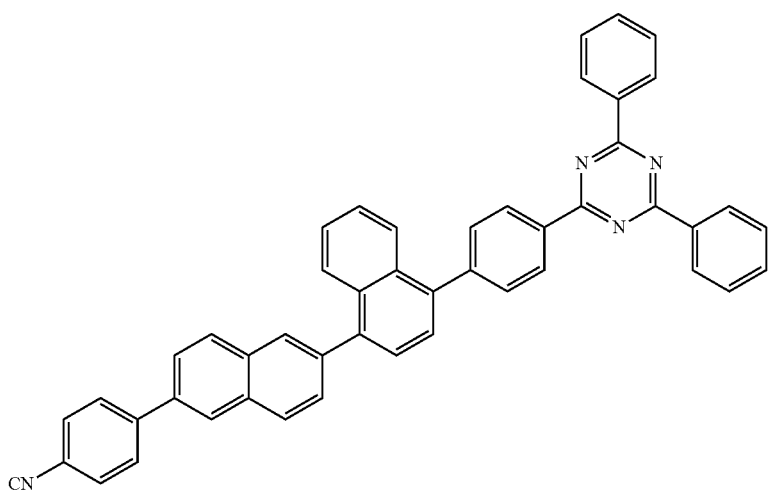

-continued
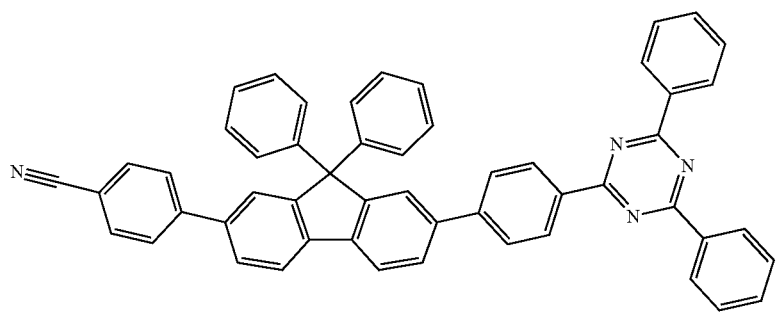
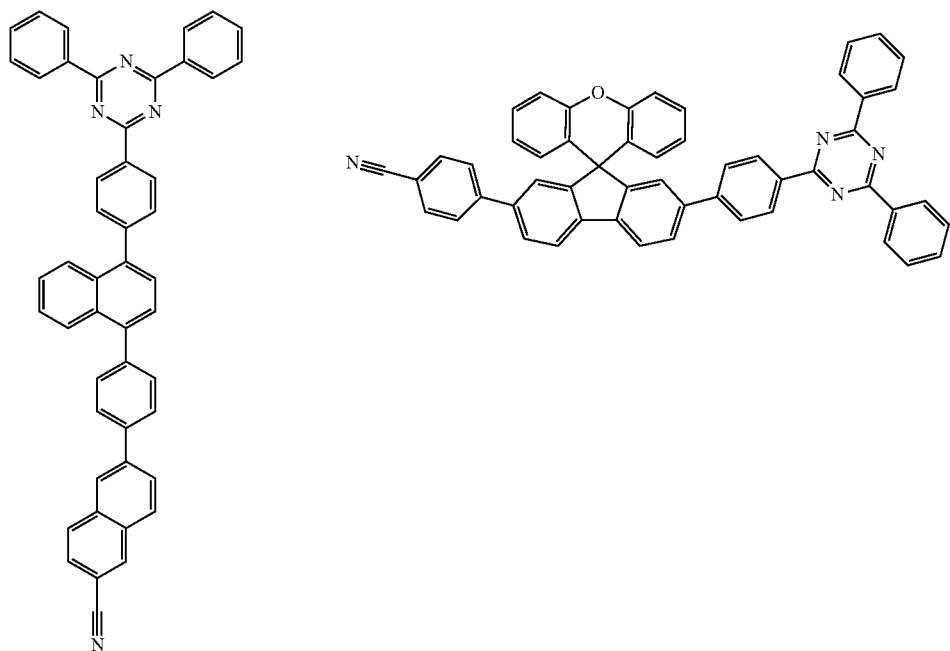
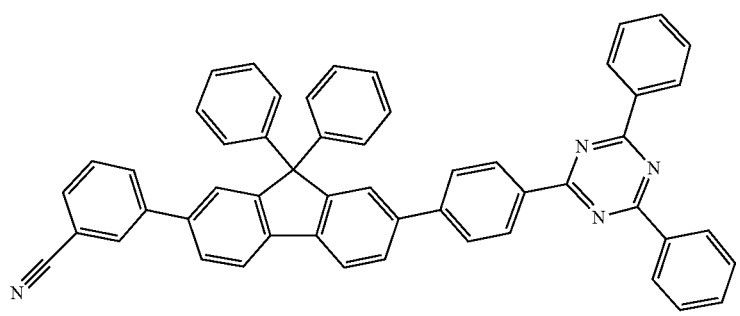
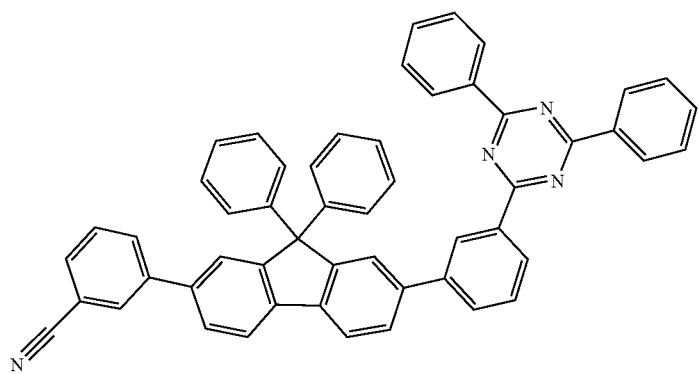

-continued
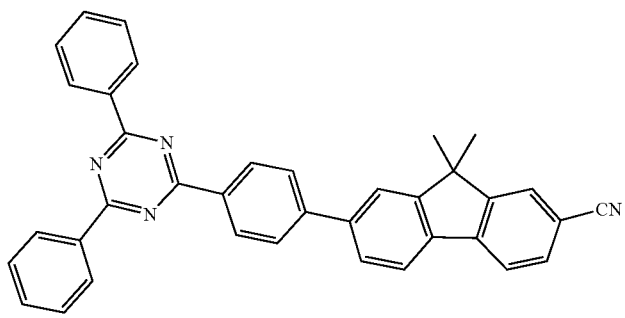
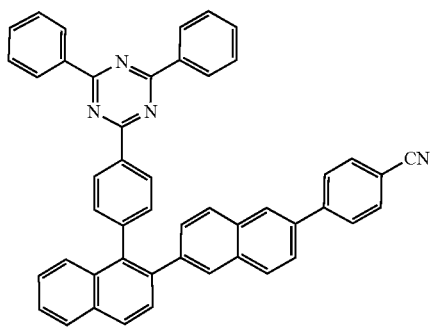
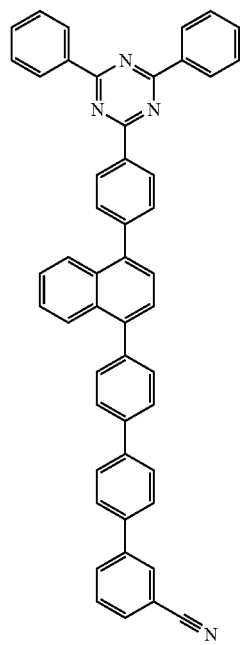
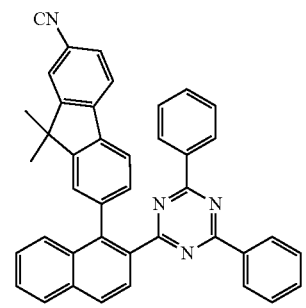
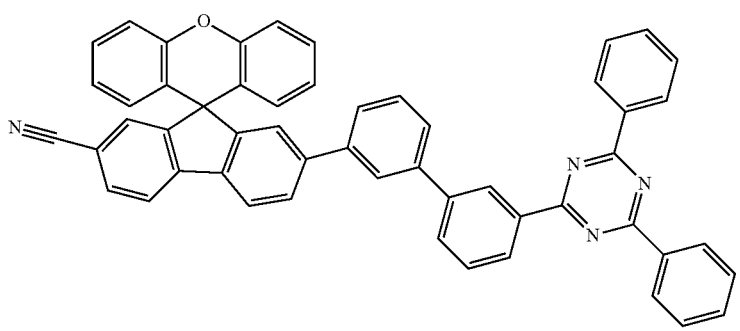
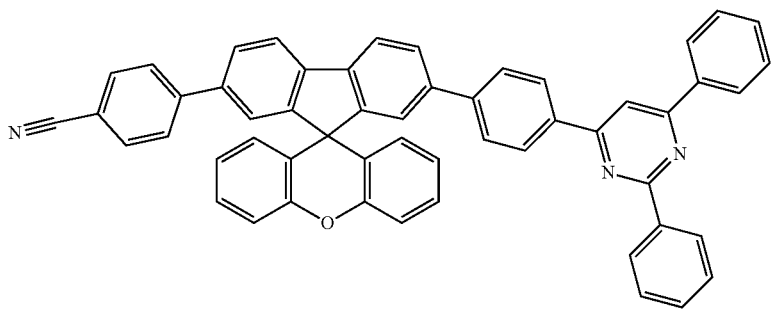

-continued
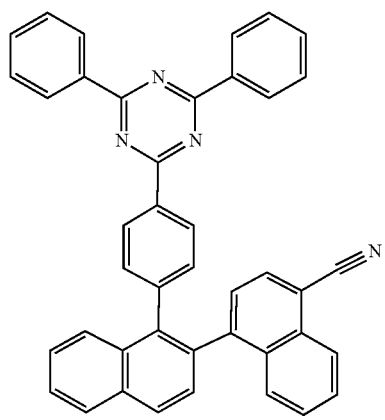
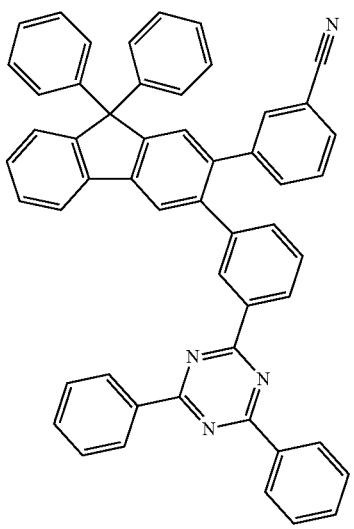
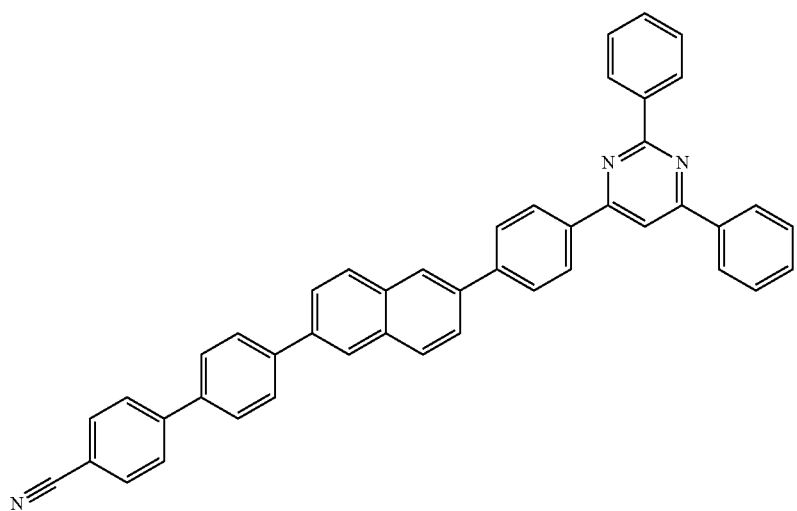
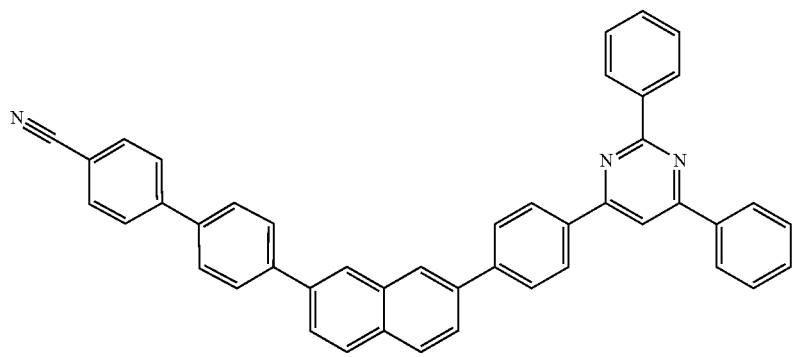

-continued
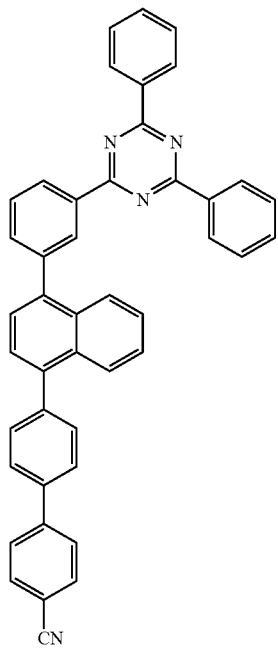
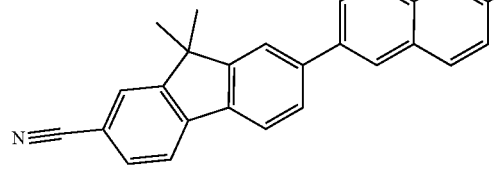
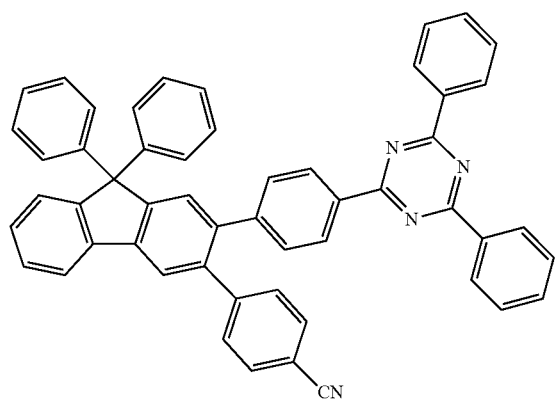
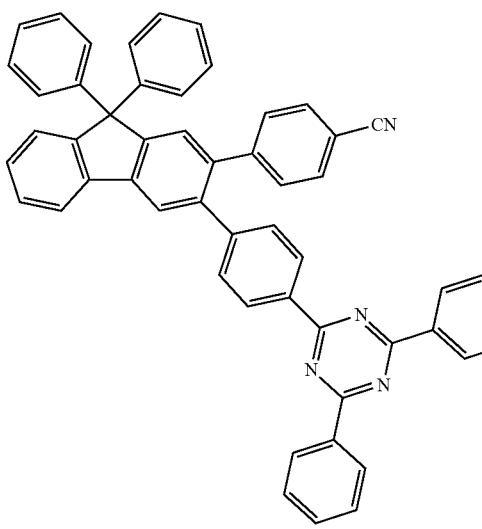
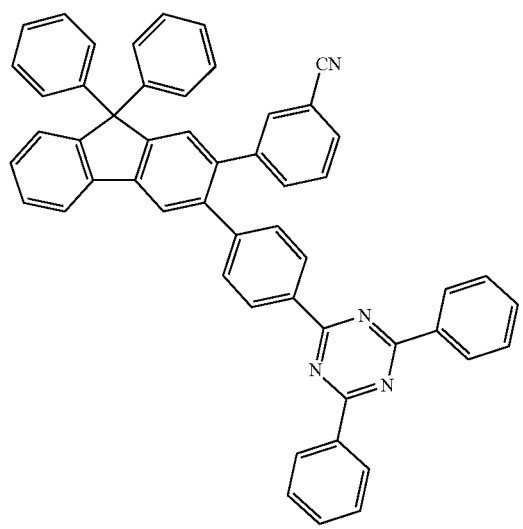

-continued
51
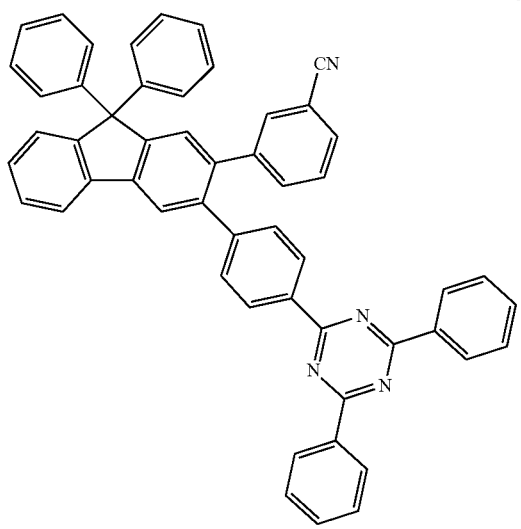
52
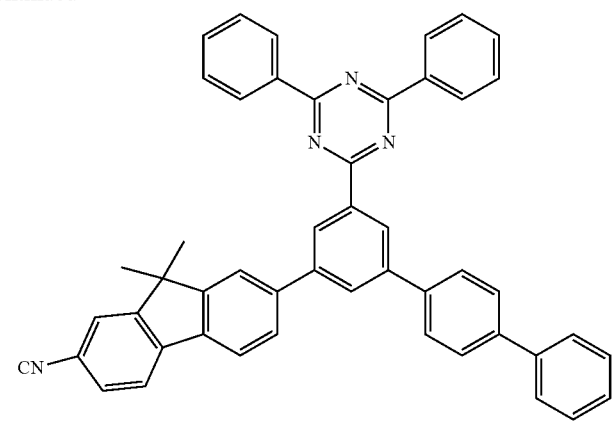
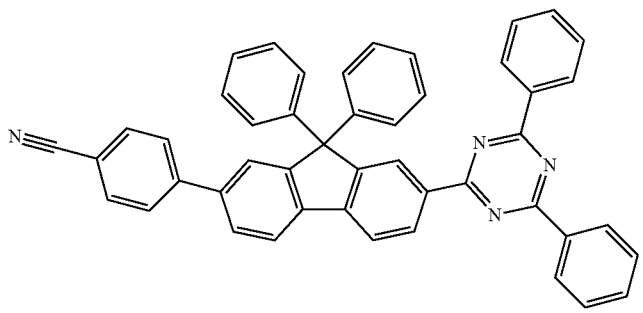
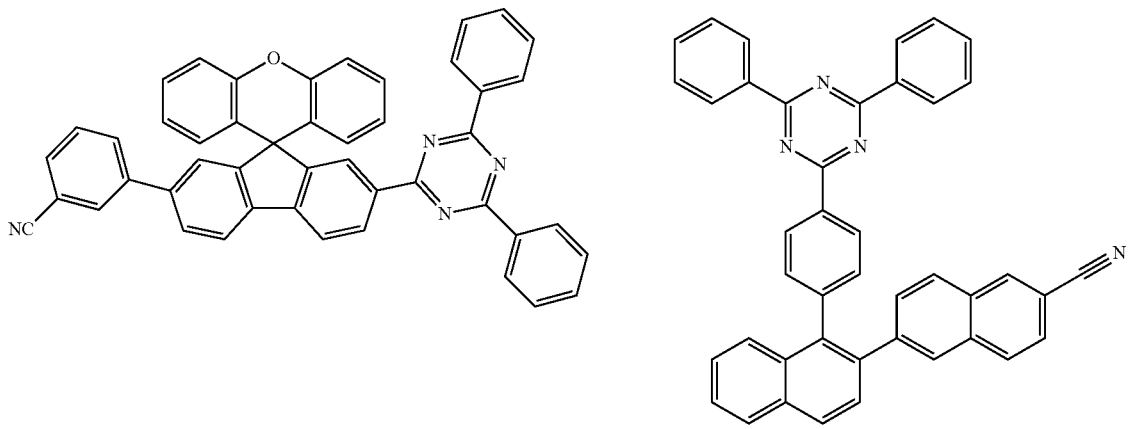
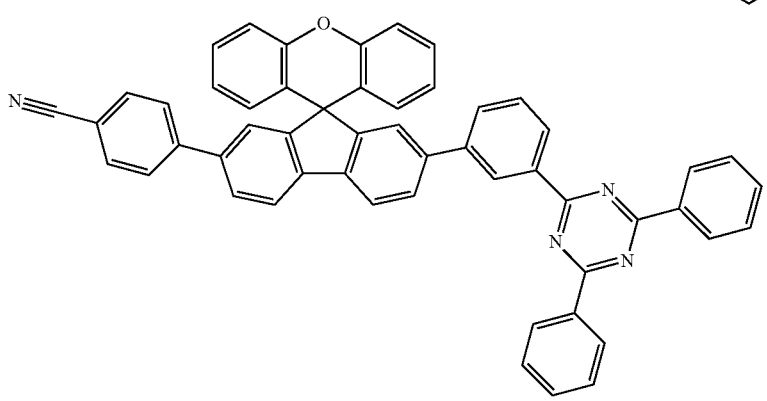

-continued
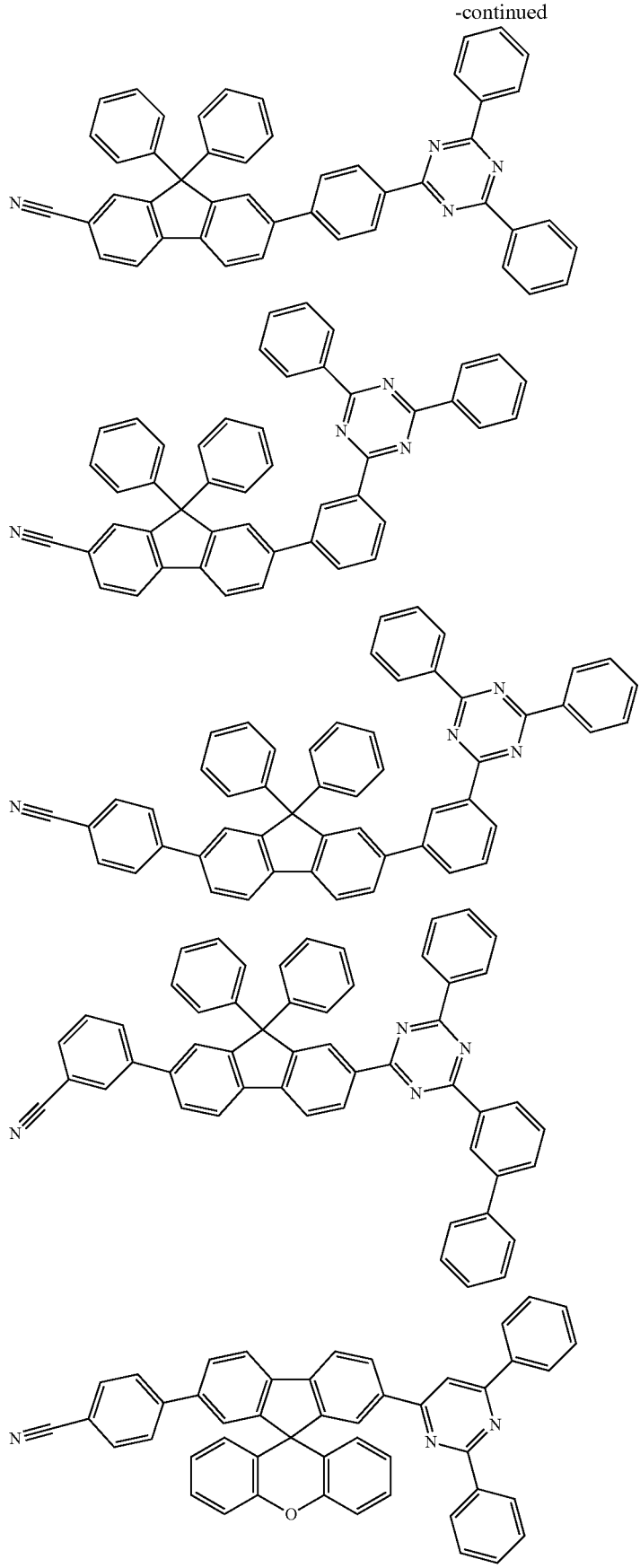

55
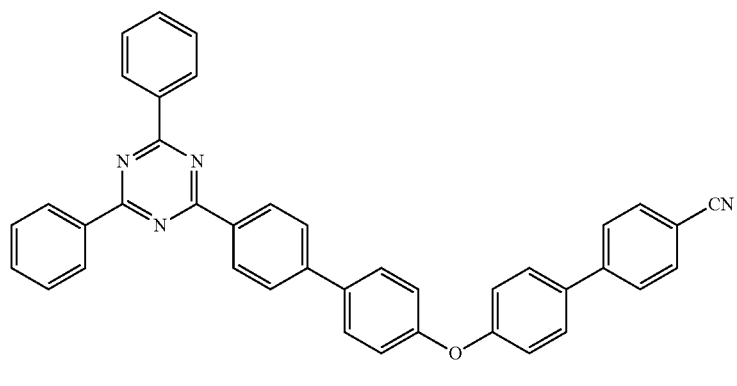
56
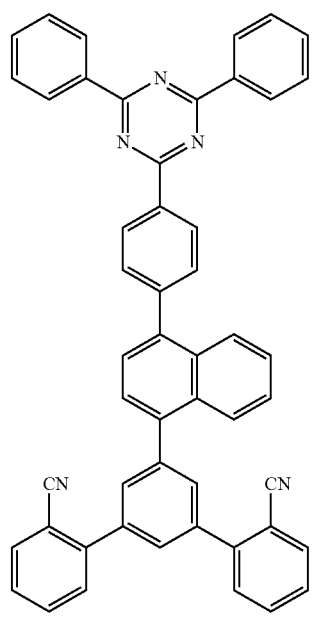
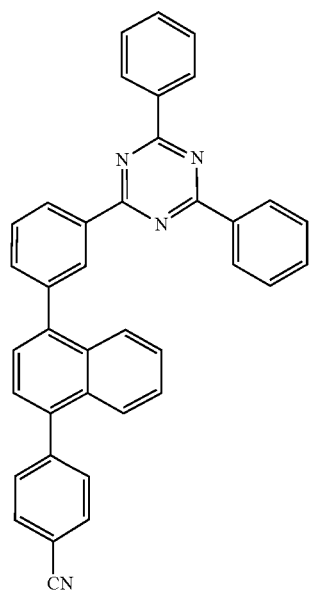
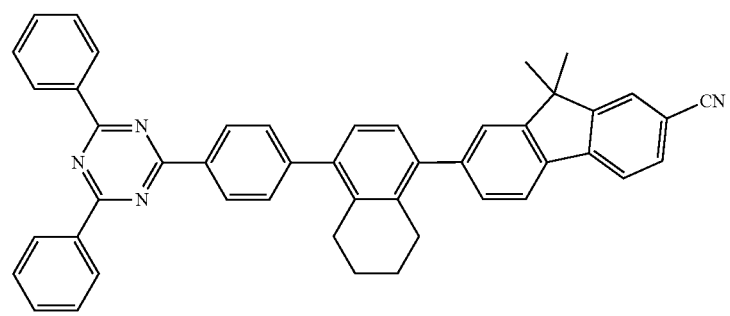

-continued
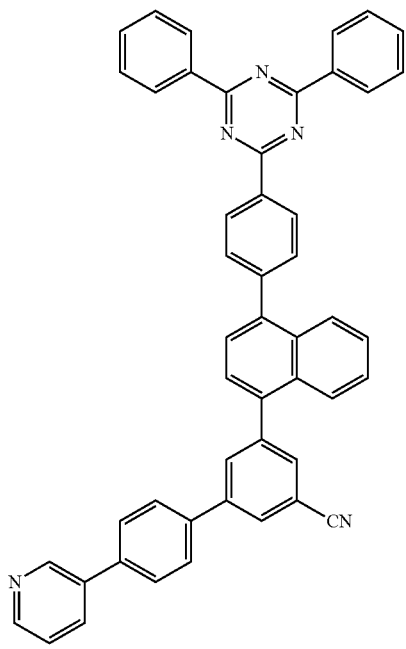
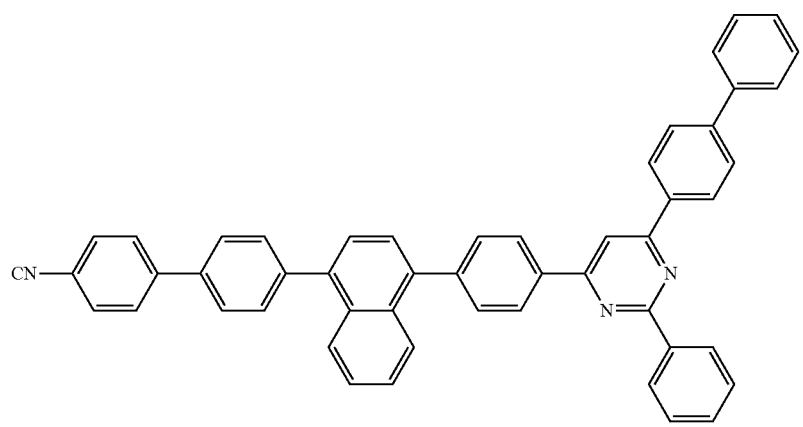
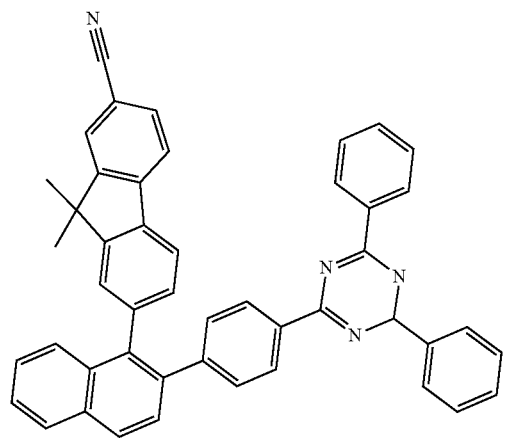
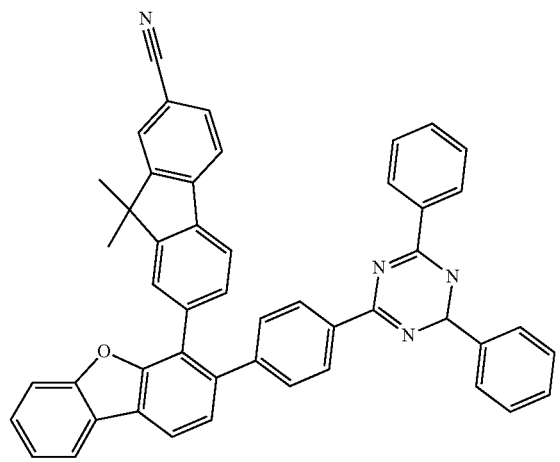

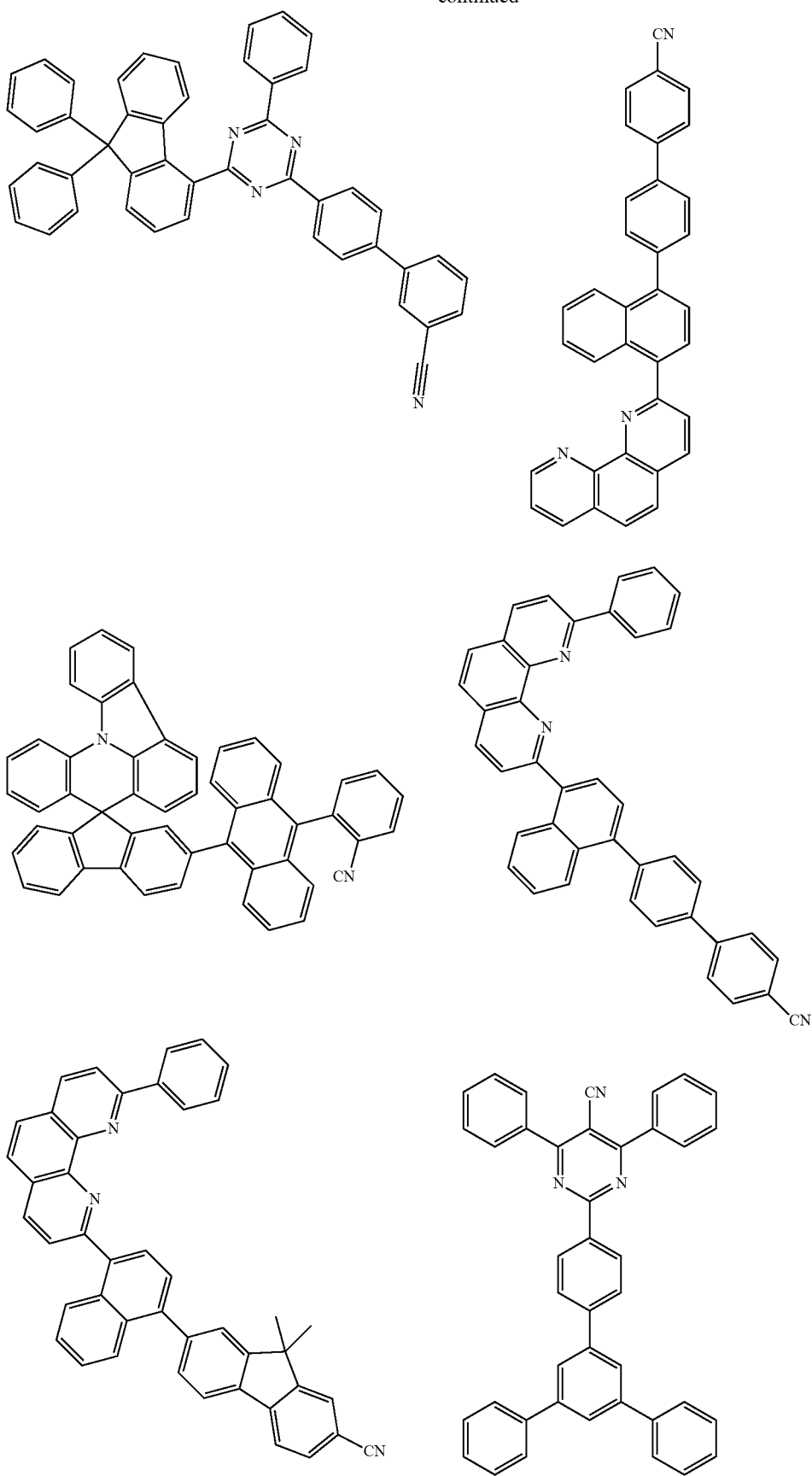

-continued
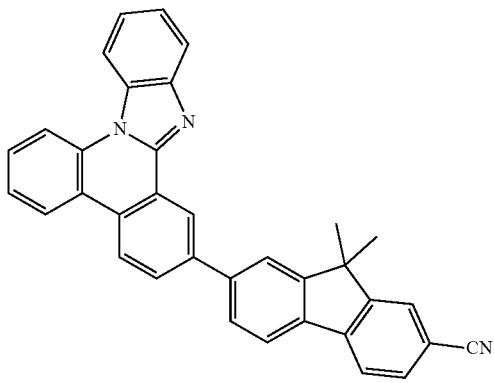
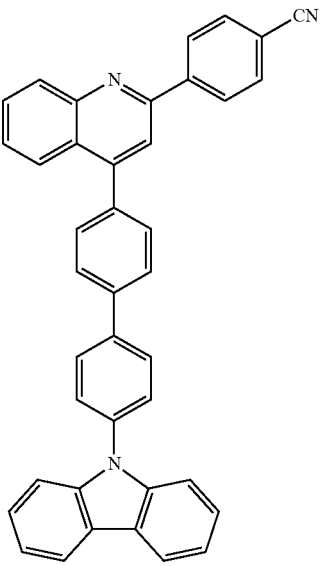
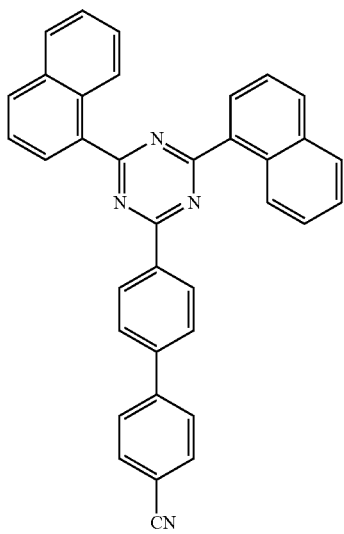
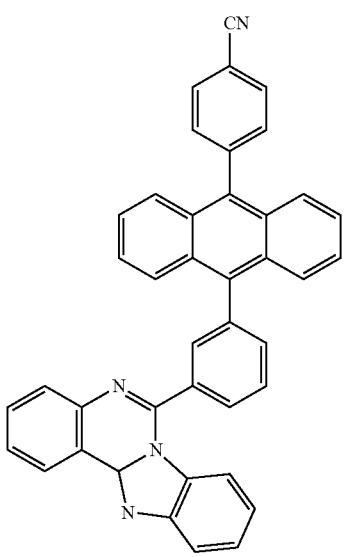
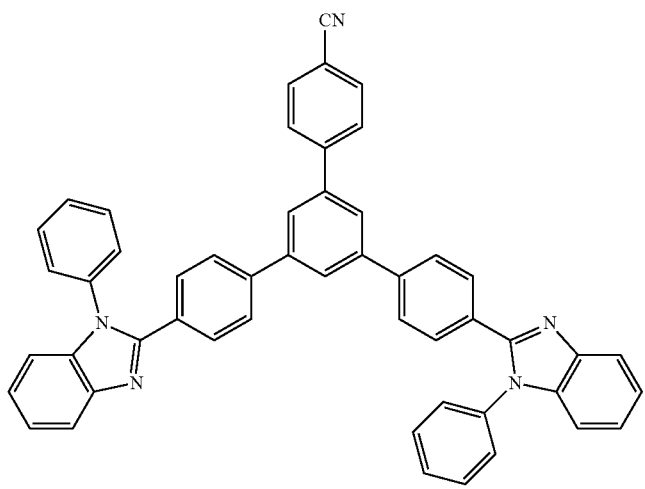

-continued

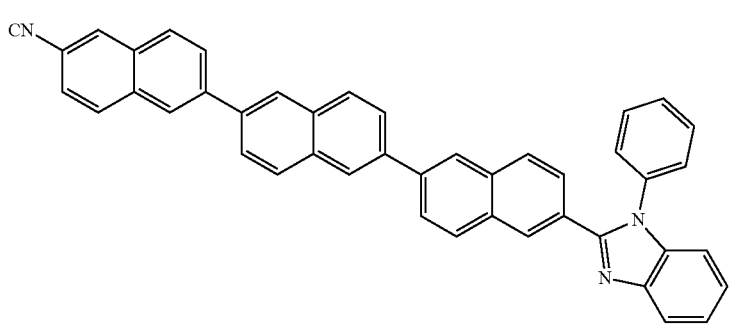

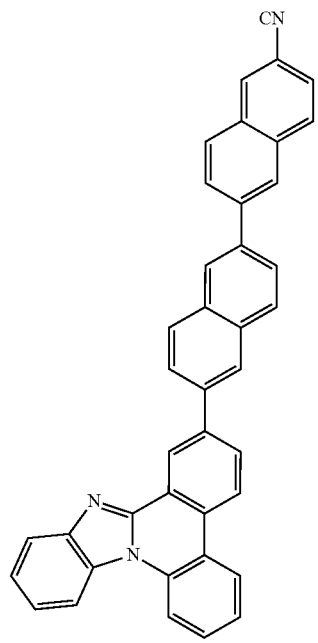

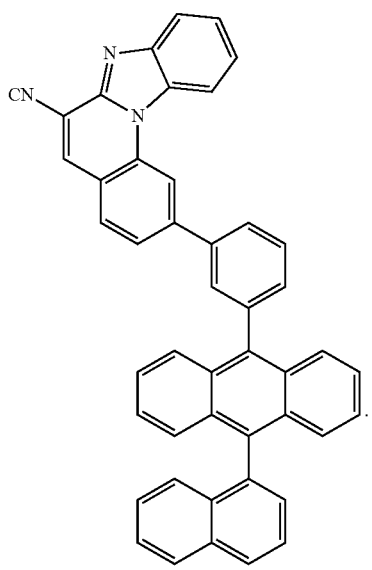

In one embodiment of the present specification, the organic light emitting device can include two or more light emitting layers. The two or more light emitting layers can be provided adjoining each other, or an additional organic material layer can be provided between the two light emitting layers.

In one embodiment of the present specification, the organic light emitting device includes two or more light emitting layers, a charge generation layer is included between two adjacent light emitting layers of the two or more light emitting layers, and the charge generation layer can include an n-type organic material layer and a p-type organic material layer.

In another embodiment, the n-type organic material layer and the p-type organic material layer included in the charge generation layer form an NP junction.

In one embodiment of the present specification, the p-type organic material layer is selected from the group consisting of a hole injection layer, a hole transfer layer, an electron blocking layer and a light emitting layer, and the n-type organic material layer is selected from the group consisting of an electron transfer layer, an electron injection layer, a hole blocking layer and a light emitting layer.

In the present specification, the n-type means an n-type semiconductor property. In other words, the n-type is a property receiving or transferring electrons through a lowest unoccupied molecular orbital (LUMO) energy level, and this can be defined as a property of a material having higher electron mobility than hole mobility. On the contrary, the p-type means a p-type semiconductor property. In other words, the p-type is a property receiving or transferring holes through a highest occupied molecular orbital (HOMO) energy level, and this can be defined as a property of a material having higher hole mobility than electron mobility. In the present specification, the compound or the organic material layer having an n-type property can be referred to as an n-type compound or an n-type organic material layer. In addition, the compound or the organic material layer having a p-type property can be referred to as a p-type compound or a p-type organic material layer. In addition, n-type doping can mean being doped to have an n-type property.

In the present specification, the charge generation layer is a layer generating charges without applying an external voltage, and by generating charges between adjacent light emitting layers of the two or more light emitting layers, the two or more light emitting layers included in the organic light emitting device can emit light.

In the present specification, the NP junction can mean, as well as a second electron transfer layer, an n-type organic material layer, and a p-type organic material layer being physically brought into contact with each other, an interaction capable of readily progressing hole and electron generation and transfer.

When the NP junction is formed according to one embodiment of the present specification, holes or electrons are readily formed by an external voltage or light source. Accordingly, an increase in the driving voltage for hole injection can be prevented.

In another embodiment, maximum light emission wavelengths of at least two of the two or more light emitting layers are the same as or different from each other.

In the present specification, the maximum light emission wavelength means a wavelength at the maximum of spectral distribution.

In one embodiment of the present specification, maximum light emission wavelengths of at least two of the two or more light emitting layers are different from each other.

In one embodiment of the present specification, at least one of the two or more light emitting layers includes a phosphorescent dopant, and at least one includes a fluorescent dopant.

As in one embodiment of the present specification, by including two or more light emitting layers different from each other, a white light emitting device can be manufactured through laminating blue fluorescence, green phosphorescence and red phosphorescence materials; or laminating blue fluorescence and green-yellow phosphorescence materials. Specifically, the organic light emitting device according to one embodiment of the present specification can include a fluorescent light emitting layer and/or a phosphorescent light emitting layer.

For example, in the case of blue, the light emission spectrum has a peak wavelength of 400 nm to 500 nm, the light emission spectrum has a peak wavelength of 510 nm to 580 nm in the case of green, and in the case of red, the light emission spectrum has a peak wavelength of 610 nm to 680 nm, and those skilled in the art can use light emitting layers having different peak wavelengths in one layer, or as a combination of two or more layers.

In the present specification, dopants generally used in the art can be used as the phosphorescent dopant and the fluorescent dopant.

In one embodiment of the present specification, the organic light emitting device includes a first light emitting layer provided between the anode and the organic material layer including Compound (A); and a second light emitting layer provided on the first light emitting layer.

In this case, the first light emitting layer and the second light emitting layer can be provided adjoining each other, and an additional organic material layer can be provided between the first light emitting layer and the second light emitting layer.

In another embodiment of the present specification, the organic light emitting device includes a first light emitting layer provided on a part of between the anode and the organic material layer including Compound (A); and a second light emitting layer provided on the remaining part of between the anode and the organic material layer including Compound (A). An insulating structure can also be included between the first light emitting layer and the second light emitting layer.

In this case, the first light emitting layer and the second light emitting layer can be provided side by side on the same surface of the organic material layer including Compound (A). In one embodiment, one side surface of the first light emitting layer and one side surface of the second light emitting layer can be provided adjoining each other.

In one embodiment of the present specification, the first light emitting layer and the second light emitting layer provided side by side can be provided adjoining the same surface of the organic material layer including Compound (A).

In another embodiment, an additional layer can be provided between the first light emitting layer and the second light emitting layer provided side by side, and the organic material layer including Compound (A). In one embodiment of the present specification, the additional layer can be a hole blocking layer and/or an electron transfer layer.

According to one embodiment of the present specification, the organic light emitting device includes a first light emitting layer provided between the anode and the organic material layer including Compound (A); and a second light emitting layer provided on the first light emitting layer, and includes a third light emitting layer provided on the second light emitting layer.

In this case, the first light emitting layer, the second light emitting layer, and the third light emitting layer can be provided adjoining each other, and an additional organic material layer can be provided between the first light emitting layer and the second light emitting layer and/or between the second light emitting layer and the third light emitting layer.

In another embodiment, the first light emitting layer, the second light emitting layer and the third light emitting layer have a different maximum light emission wavelength.

In another embodiment, the first light emitting layer, the second light emitting layer, and the third light emitting layer have the same maximum light emission wavelength.

In another embodiment, the first light emitting layer, the second light emitting layer and the third light emitting layer can include a blue fluorescent dopant, and the dopant can have a maximum light emission wavelength in a range of 420 nm to 520 nm.

For example, the organic light emitting device according to the present disclosure can have structures as shown in FIGS. 1 to 6, however, the structure is not limited thereto.

FIG. 1 illustrates a structure of the organic light emitting device in which an anode (201), a hole transfer layer (301), a light emitting layer (401), an electron transfer layer (501) and a cathode (601) are consecutively laminated on a substrate (101). In FIG. 1, the electron transfer layer (501) can be the organic material layer including Compound (A).

FIG. 2 illustrates a structure of the organic light emitting device in which an anode (201), a hole transfer layer (301), a first light emitting layer (402), a second light emitting layer (403), an electron transfer layer (501) and a cathode (601) are consecutively laminated on a substrate (101). In FIG. 2, the electron transfer layer (501) can be the organic material layer including Compound (A), the second light emitting layer (402) and the first light emitting layer (403) can be provided adjoining each other, and an additional organic material layer can be provided.

FIG. 3 illustrates a structure of the organic light emitting device in which an anode (201) and a hole transfer layer (301) are provided on a substrate (101), a first light emitting layer (402) and a second light emitting layer (403) are provided on the hole transfer layer (301), and an electron transfer layer (501) and a cathode (601) are consecutively laminated on the first light emitting layer (402) and the second light emitting layer (403). In FIG. 3, the electron transfer layer (501) can be the organic material layer including Compound (A).

FIG. 4 illustrates a structure of the organic light emitting device in which an anode (201), a hole transfer layer (301), a first light emitting layer (402), a second light emitting layer (403), a third light emitting layer (404), an electron transfer layer (501) and a cathode (601) are consecutively laminated on a substrate (101). In FIG. 4, the electron transfer layer (501) can be the organic material layer including Compound (A), the first light emitting layer (402), the second light emitting layer (403) and the third light emitting layer (404) can be provided adjoining each other, and an additional organic material layer can be provided between the first light emitting layer (402) and the second light emitting layer (403) and/or between the second light emitting layer (403) and the third light emitting layer (404).

FIG. 5 illustrates a structure of the organic light emitting device in which an anode (201), a hole transfer layer (301), a light emitting layer (401), a hole blocking layer (701), an electron injection and transfer layer (502) and a cathode (601) are consecutively laminated on a substrate (101). In FIG. 5, the electron injection and transfer layer (502) can be the organic material layer including Compound (A). In addition, a hole injection layer can be further provided between the anode (201) and the hole transfer layer (301), and the structure in which the hole injection layer is further provided is FIG. 6. FIG. 6 illustrates a structure of the organic light emitting device in which an anode (201), a hole injection layer (801), a hole transfer layer (301), a light emitting layer (401), a hole blocking layer (701), an electron injection and transfer layer (502) and a cathode (601) are consecutively laminated on a substrate (101). In FIG. 6, the electron injection and transfer layer (502) can be the organic material layer including Compound (A).

FIGS. 1 to 6 are illustrative structures according to embodiments of the present specification, and other organic material layers can be further included. In addition, in FIGS. 1 to 4, the organic material layer including Compound (A) can be a hole blocking layer, an electron injection layer, or an electron injection and transfer layer instead of the electron transfer layer (501).

The organic light emitting device of the present specification includes the organic material layer including Compound (A) including a heteroatom and a cyano group between the cathode and the light emitting layer, and can be manufactured using materials and methods known in the art except that Compound (A) satisfies Equation 1 and Equation 2. For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as a sputtering method or an e-beam evaporation method, forming an organic material layer including a hole injection layer, a hole transfer layer, an electron blocking layer, a light emitting layer, an electron transfer layer and an electron injection layer thereon, and then depositing a material usable as a cathode thereon. In addition to such a method, the organic light emitting device can be manufactured by consecutively depositing a cathode material, an organic material layer and an anode material on a substrate. In addition to such a method, the organic light emitting device can be manufactured by consecutively depositing an anode material, an organic material layer and a cathode material on a substrate.

The organic material layer of the organic light emitting device of the present specification can be formed in a multilayer structure in which one or more organic material layers are laminated.

In one embodiment of the present specification, the organic light emitting device can further include one, two or more layers selected from the group consisting of a hole injection layer, a hole transfer layer, a light emitting layer, an electron transfer layer, an electron injection layer, an electron blocking layer and a hole blocking layer.

When the organic light emitting device includes a plurality of organic material layers, the organic material layers can be formed with the same material or different materials.

As the anode material, materials having large work function are normally preferred so that hole injection to an organic material layer is smooth. Specific examples of the anode material usable in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO$_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or LiO$_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from migrating to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The electron blocking layer is a layer capable of enhancing lifetime and efficiency of a device by preventing electrons injected from an electron injection layer from entering a hole injection layer after passing through a light emitting layer, and can be formed as necessary on a proper part between the light emitting layer and the hole injection layer using known materials.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

When the organic light emitting device further includes an additional light emitting layer in addition to the light emitting layer according to one embodiment of the present specification, the light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes (Alq$_3$), carbazole-based compounds, dimerized styryl compounds, BAlq, 10-hydroxybenzoquinoline-metal compounds, benzoxazole-benzothiazole- and benzimidazole-based compounds, poly(p-phenylenevinylene) (PPV)-based polymers, spiro compounds, polyfluorene, rubrene, and the like, but are not limited thereto.

The light emitting layer can include a host material and a dopant material. The host material can include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

As a host material of the fluorescent light emitting layer, one, two or more are selected from the group consisting of distyrylarylene (DSA), distyrylarylene derivatives, distyrylbenzene (DSB), distyrylbenzene derivatives, 4,4'-bis(2,2'-diphenylvinyl)-1,1'-biphenyl (DPVBi), DPVBi derivatives, and spiro-DPVBi and spiro-6P(spiro-sexyphenyl).

As a dopant material of the fluorescent light emitting layer, one, two or more are selected from the group consisting of styrylamine-based, pherylene-based and distyrylbiphenyl (DSBP)-based.

The electron injection layer is a layer that injects electrons from an electrode, and as the electron injection material, compounds having an ability to transfer electrons, having an electron injection effect from a cathode, having an excellent electron injection effect for a light emitting layer or light emitting material, and preventing excitons generated in the light emitting layer from migrating to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxyquinolinato)-aluminum, tris(8-hydroxyquinolinato)gallium, bis(10-hydroxybenzo[h]quinolinato)beryllium, bis(10-hydroxybenzo[h]-quinolinato)zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato)-(2-naphtholato) gallium and the like, but is not limited thereto.

The hole blocking layer is a layer blocking holes from reaching a cathode, and can be generally formed under the same condition as a hole injection layer. Specific examples thereof can include oxadiazole derivatives, triazole derivatives, phenanthroline derivatives, BCP, aluminum complexes and the like, but are not limited thereto.

The organic light emitting device according to the present specification can be a top-emission type, a bottom-emission type or a dual-emission type depending on the materials used.

In addition, the organic light emitting device according to the present specification can have a normal structure (normal type) in which a lower electrode is an anode and an upper electrode is a cathode, or can have an inverted structure (inverted type) in which a lower electrode is a cathode and an upper electrode is an anode.

The structure according to one embodiment of the present specification can also be used in an organic electronic device including an organic solar cell, an organic photoconductor, an organic transistor and the like under a principle similar to the principle used in the organic light emitting device.

Hereinafter, the present specification will be described in detail with reference to examples. However, the examples according to the present specification can be modified to various other forms, and the scope of the present specification is not to be construed as being limited to the examples described below. Examples of the present specification are provided in order to more fully describe the present specification to those having average knowledge in the art.

Experimental Example. Manufacture of Organic Light Emitting Device

Experimental Example 1-1

A glass substrate (corning 7059 glass) on which indium tin oxide (ITO) was coated as a thin film to a thickness of 1,000 Å was placed in distilled water containing a dissolved detergent and ultrasonically cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol in this order, and then dried.

On the transparent ITO electrode prepared as above, a hole injection layer was formed by thermal vacuum depositing hexanitrile hexaazatriphenylene (HAT) to a thickness of 500 Å. After vacuum depositing HT1 (400 Å), a material transferring holes, thereon, host BH1 and dopant BD1 compounds were vacuum deposited to a thickness of 300 Å as a light emitting layer. After depositing a hole blocking layer (electron control layer) on the light emitting layer by depositing an ET1 compound to a thickness of 50 Å, an electron injection and transfer layer was formed to a thickness of 350 Å by vacuum depositing a compound of Experimental Example 1-1 of the following Table 1 and lithium quinolate (LiQ) in a weight ratio of 1:1. On the electron injection and transfer layer, a cathode was formed by consecutively depositing lithium fluoride (LiF) to a thickness of 12 Å and aluminum to a thickness of 2,000 Å. As a result, an organic light emitting device was manufactured.

In the above-mentioned process, the deposition rates of the organic materials were maintained at 0.4 Å/sec to 0.7 Å/sec, the deposition rates of the lithium fluoride and the aluminum of the cathode were maintained at 0.3 Å/sec and 2 Å/sec, respectively, and the degree of vacuum during the deposition was maintained at $2 \times 10^{-7}$ torr to $5 \times 10^{-6}$ torr to manufacture the organic light emitting device.

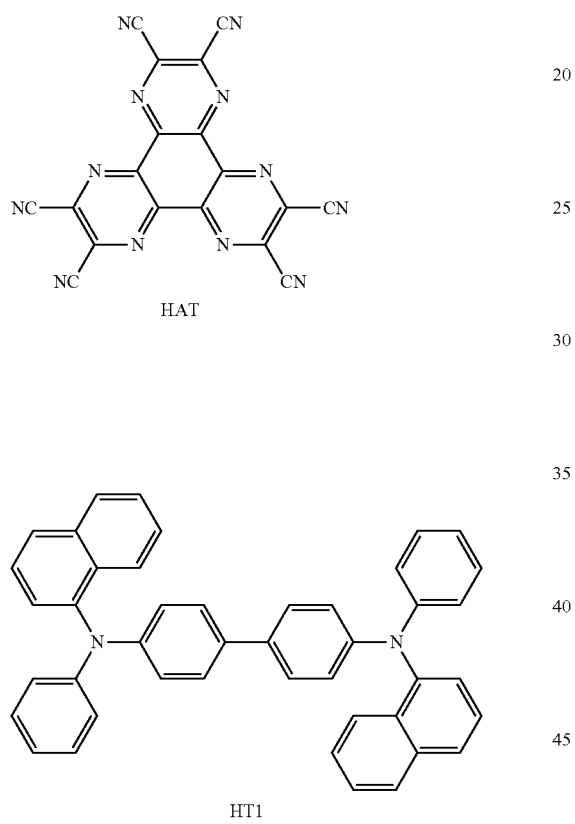

HAT

HT1

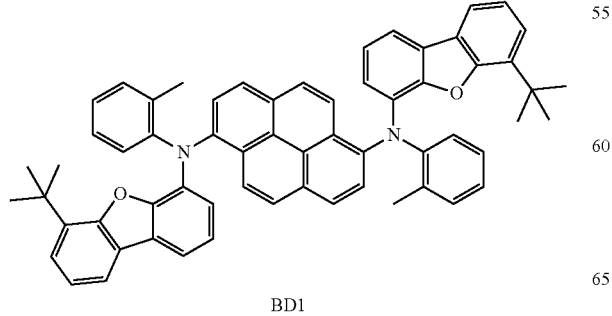

BD1

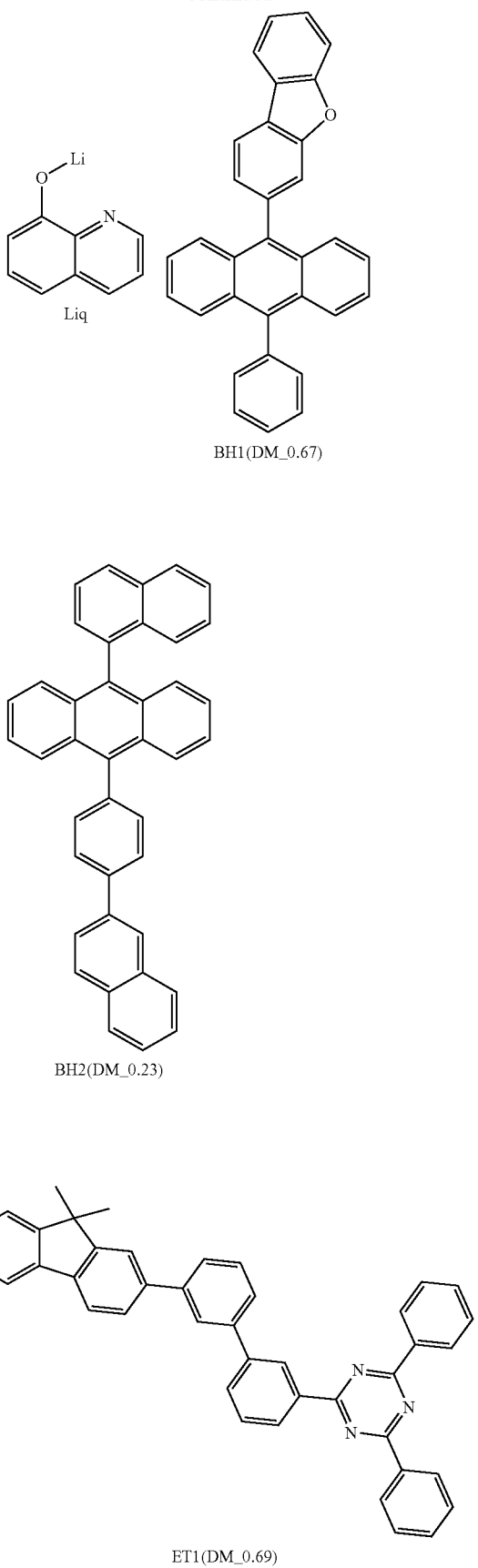

Liq

BH1(DM_0.67)

BH2(DM_0.23)

ET1(DM_0.69)

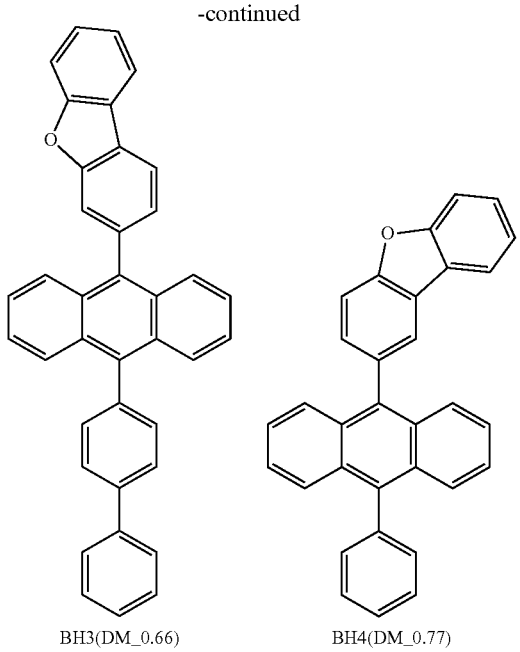

BH3(DM_0.66)  BH4(DM_0.77)  BH5(DM_1.18)

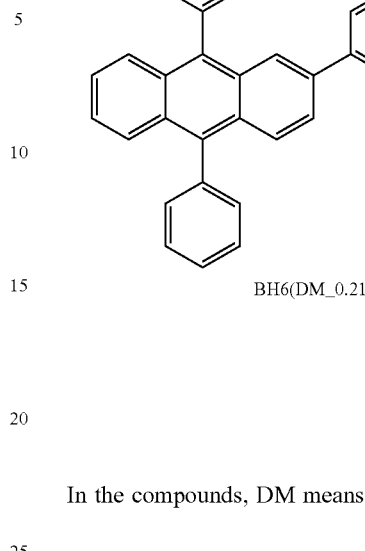

BH6(DM_0.21)

In the compounds, DM means a dipole moment.

Additional Experimental Examples

Organic light emitting devices were manufactured in the same manner as in Experimental Example 1-1 except that compounds of the following Table 1 were each used instead of using BH1 as the host of the light emitting layer and the compound of Experimental Example 1-1 of the following Table 1 as the electron injection and transfer layer.

For each of the organic light emitting devices manufactured in the experimental examples, driving voltage and light emission efficiency were measured at current density of 10 mA/cm², and time taken for luminance becoming 98% with respect to initial luminance (LT98) was measured at current density of 20 mA/cm². The results are shown in the following Table 1.

TABLE 1

| Experimental Example Number | Light emitting layer | Electron transport and injection layer | DM | EA | Voltage (V) | Efficiency (cd/A) | LT98 (hr) |
|---|---|---|---|---|---|---|---|
| 1-1 | BH1 | 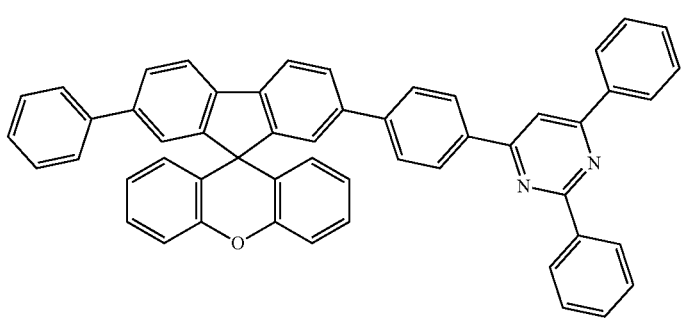 [SMILES: c1ccc(-c2ccc3c(c2)C2(c4ccccc4Oc4ccccc42)c2cc(-c4ccc(-c5cc(-c6ccccc6)nc(-c6ccccc6)n5)cc4)ccc2-3)cc1] | 2.67 | 0.95 | 4.01 | 4.82 | 22 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 1-2 | BH1 | | 5.95 | 1.22 | 3.82 | 5.28 | 56 |
| 2-1 | BH2 | | 0.61 | 0.82 | 3.77 | 5.01 | 15 |
| 2-2 | BH2 | | 5.38 | 1.06 | 3.75 | 5.11 | 51 |
| 3-1 | BH1 | | 2.78 | 0.68 | 4.20 | 4.88 | 11 |
| 3-2 | BH1 | | 8.45 | 1.03 | 4.11 | 4.95 | 62 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 4-1 | BH2 | | 0.64 | 0.87 | 3.95 | 4.75 | 29 |
| 4-2 | BH2 | | 4.77 | 1.14 | 3.89 | 5.25 | 55 |
| 5-1 | BH2 | | 0.57 | 0.87 | 3.77 | 5.00 | 10 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 5-2 | BH2 | | 5.37 | 1.12 | 3.71 | 5.20 | 49 |
| 6-1 | BH1 | | 2.32 | 0.98 | 3.99 | 4.87 | 28 |
| 6-2 | BH1 | | 3.06 | 1.17 | 3.86 | 5.01 | 61 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 7-1 | BH1 | | 1.10 | 0.87 | 3.99 | 4.89 | 24 |
| 7-2 | BH1 | | 5.05 | 1.06 | 3.76 | 5.09 | 57 |
| 8-1 | BH1 | | 3.52 | 0.76 | 4.33 | 4.75 | 26 |
| 8-2 | BH1 | | 8.38 | 1.25 | 4.01 | 5.01 | 50 |
| 9-1 | BH2 | | 0.48 | 1.01 | 3.91 | 4.68 | 19 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 9-2 | BH2 | | 4.84 | 1.12 | 3.82 | 5.18 | 59 |
| 10-1 | BH2 | | 0.14 | 0.87 | 4.10 | 4.98 | 26 |
| 10-2 | BH2 | | 5.78 | 1.12 | 3.88 | 5.11 | 62 |
| 11-1 | BH3 | | 0.84 | 0.90 | 4.05 | 4.41 | 16 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 11-2 | BH3 | | 5.39 | 1.22 | 3.91 | 5.01 | 65 |
| 12-1 | BH2 | | 0.45 | 0.76 | 3.98 | 4.99 | 26 |
| 12-2 | BH2 | | 4.60 | 0.95 | 3.74 | 5.25 | 49 |
| 13-1 | BH3 | | 0.99 | 1.03 | 4.02 | 4.98 | 31 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 13-2 | BH3 | | 5.58 | 1.28 | 3.80 | 5.19 | 55 |
| 14-1 | BH2 | | 0.41 | 1.01 | 3.92 | 4.78 | 30 |
| 14-2 | BH2 | | 5.72 | 1.28 | 3.88 | 5.11 | 60 |
| 15-1 | BH3 | | 0.73 | 1.01 | 4.01 | 4.96 | 29 |
| 15-2 | BH3 | | 5.41 | 1.25 | 3.80 | 5.20 | 52 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 15-3 | BH3 | | 4.51 | 1.17 | 3.79 | 5.23 | 50 |
| 16-1 | BH2 | | 0.49 | 1.01 | 3.91 | 4.80 | 28 |
| 16-2 | BH2 | | 5.60 | 1.25 | 3.89 | 5.10 | 61 |
| 17-1 | BH2 | | 0.62 | 1.03 | 4.25 | 4.77 | 29 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 17-2 | BH2 | [chemical structure] | 5.50 | 1.31 | 4.00 | 5.08 | 63 |
| 18-1 | BH4 | [chemical structure] | 1.57 | 1.03 | 3.99 | 4.71 | 28 |
| 18-2 | BH4 | [chemical structure] | 4.42 | 1.28 | 3.92 | 5.05 | 65 |
| 19-1 | BH6 | [chemical structure] | 0.20 | 0.87 | 4.05 | 4.99 | 21 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 19-2 | BH6 | | 5.38 | 1.06 | 3.81 | 5.22 | 52 |
| 20-1 | BH2 | | 0.56 | 0.98 | 3.96 | 4.88 | 29 |
| 20-2 | BH2 | | 4.74 | 1.14 | 3.89 | 5.12 | 61 |
| 20-3 | BH2 | | 5.31 | 1.22 | 3.82 | 5.31 | 58 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 21-1 | BH4 | | 0.80 | 0.95 | 3.86 | 4.85 | 10 |
| 21-2 | BH4 | | 5.39 | 1.22 | 3.72 | 5.11 | 49 |
| 22-1 | BH6 | | 0.48 | 1.01 | 3.90 | 4.81 | 26 |
| 22-2 | BH6 | | 5.55 | 1.22 | 3.87 | 5.34 | 57 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 23-1 | BH4 | 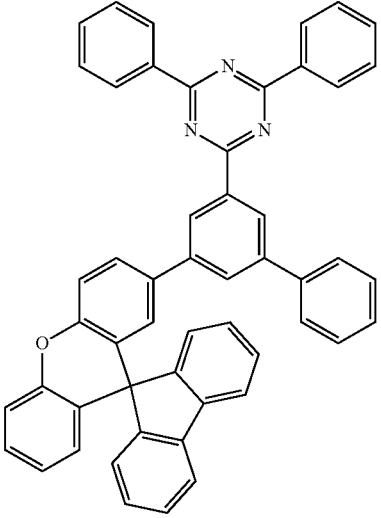 [SMILES: c1ccc(-c2cc(-c3ccc4c(c3)C3(c5ccccc5O4)c4ccccc4-c4ccccc43)cc(-c3nc(-c4ccccc4)nc(-c4ccccc4)n3)c2)cc1] | 0.92 | 0.71 | 4.11 | 4.61 | 29 |
| 23-2 | BH4 | 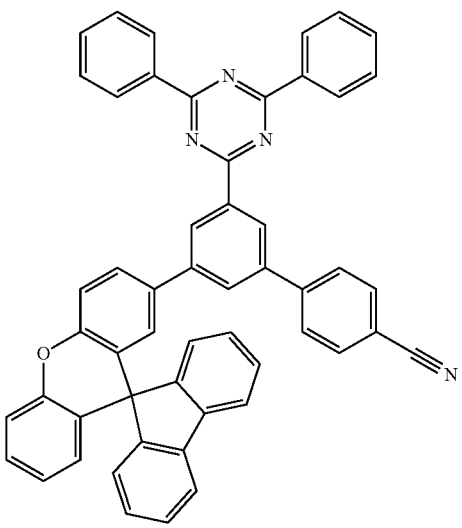 [SMILES: N#Cc1ccc(-c2cc(-c3ccc4c(c3)C3(c5ccccc5O4)c4ccccc4-c4ccccc43)cc(-c3nc(-c4ccccc4)nc(-c4ccccc4)n3)c2)cc1] | 6.29 | 1.01 | 3.95 | 5.02 | 61 |
| 24-1 | BH6 | 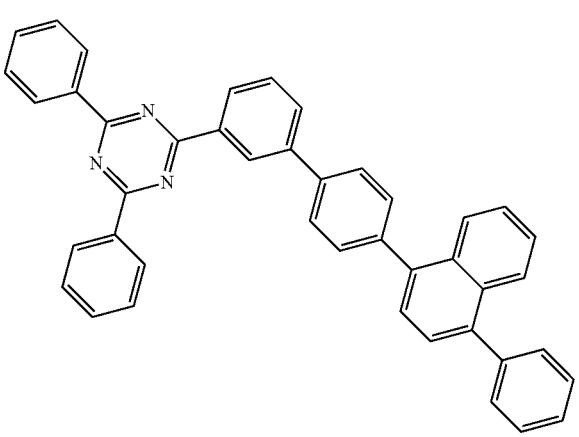 [SMILES: c1ccc(-c2nc(-c3ccccc3)nc(-c3cccc(-c4ccc(-c5ccc(-c6ccccc6)c6ccccc56)cc4)c3)n2)cc1] | 0.16 | 0.79 | 3.86 | 5.01 | 18 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 24-2 | BH6 | | 5.72 | 1.06 | 3.64 | 5.29 | 49 |
| 25-1 | BH2 | | 0.55 | 0.87 | 3.97 | 4.79 | 27 |
| 25-2 | BH2 | | 4.83 | 1.09 | 3.87 | 5.15 | 54 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 25-3 | BH2 | | 5.33 | 1.06 | 3.85 | 5.25 | 51 |
| 26-1 | BH4 | | 0.92 | 1.01 | 3.88 | 4.86 | 10 |
| 26-2 | BH4 | | 5.67 | 1.31 | 3.73 | 5.11 | 49 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 27-1 | BH4 | | 0.85 | 0.79 | 4.10 | 4.63 | 29 |
| 27-2 | BH4 | | 5.48 | 1.03 | 3.91 | 5.22 | 59 |
| 28-1 | BH2 | | 0.32 | 0.93 | 3.79 | 4.99 | 9 |
| 28-2 | BH2 | | 5.52 | 1.12 | 3.61 | 5.55 | 41 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 29-1 | BH2 | 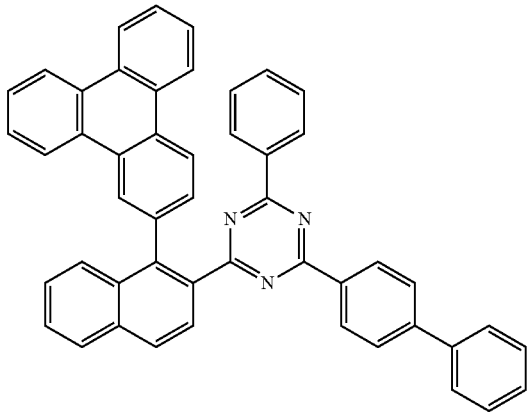 [SMILES: c1ccc(-c2ccc(-c3nc(-c4ccccc4)nc(-c4ccc5ccccc5c4-c4ccc5c6ccccc6c6ccccc6c5c4)n3)cc2)cc1] | 0.59 | 0.87 | 3.96 | 4.75 | 17 |
| 29-2 | BH2 | 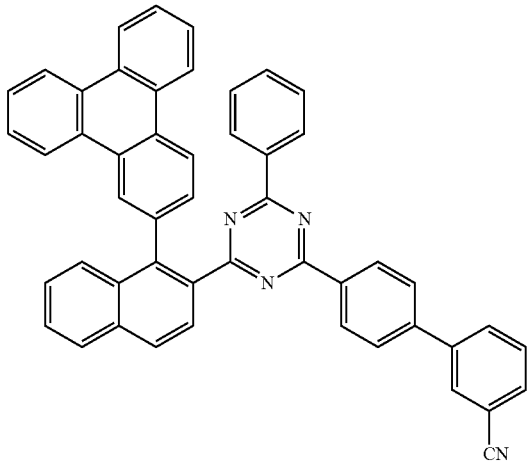 [SMILES: N#Cc1cccc(-c2ccc(-c3nc(-c4ccccc4)nc(-c4ccc5ccccc5c4-c4ccc5c6ccccc6c6ccccc6c5c4)n3)cc2)c1] | 3.96 | 1.06 | 3.77 | 5.11 | 48 |
| 30-1 | BH2 | 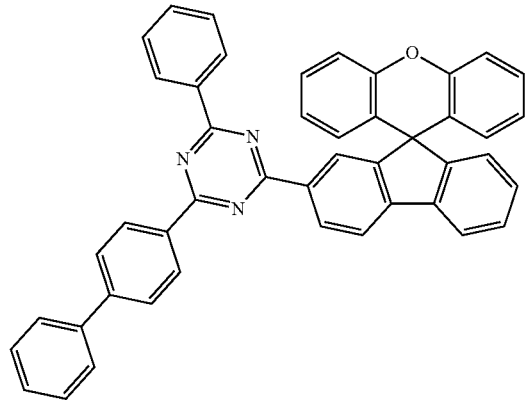 [SMILES: c1ccc(-c2ccc(-c3nc(-c4ccccc4)nc(-c4ccc5c(c4)C4(c6ccccc6Oc6ccccc64)c4ccccc4-5)n3)cc2)cc1] | 0.51 | 0.90 | 3.96 | 4.75 | 27 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 30-2 | Bh2 | | 5.10 | 1.12 | 3.87 | 5.26 | 58 |
| 31-1 | BH4 | | 0.85 | 0.95 | 3.81 | 4.74 | 10 |
| 31-2 | BH4 | | 5.42 | 1.22 | 3.69 | 5.02 | 48 |
| 32-1 | BH6 | | 0.19 | 0.79 | 4.11 | 4.63 | 28 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 32-2 | BH6 | 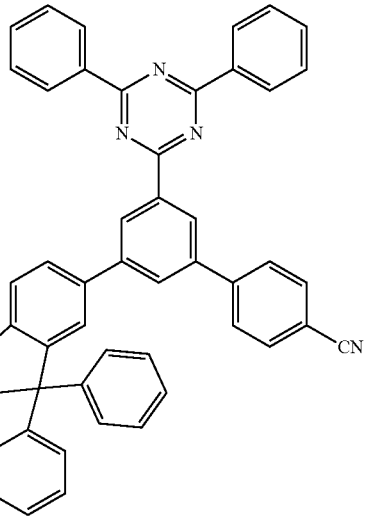 | 5.89 | 1.06 | 3.91 | 5.19 | 55 |
| 33-1 | BH2 | 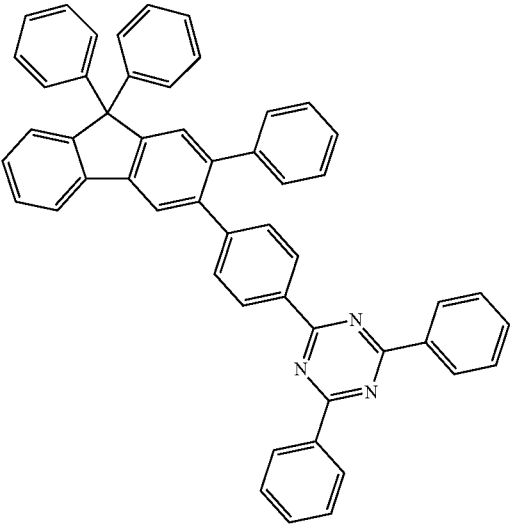 [SMILES: c1ccc(-c2nc(-c3ccccc3)nc(-c3ccc(-c4cc5c(cc4-c4ccccc4)C(c4ccccc4)(c4ccccc4)c4ccccc4-5)cc3)n2)cc1] | 0.60 | 0.84 | 3.99 | 4.75 | 21 |
| 33-2 | BH2 | 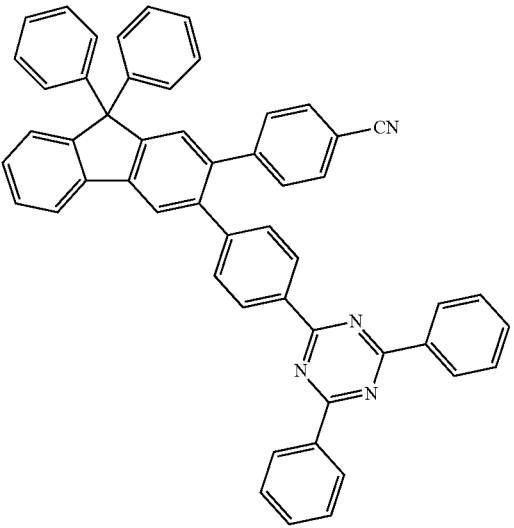 [SMILES: N#Cc1ccc(-c2cc3c(cc2-c2ccc(-c4nc(-c5ccccc5)nc(-c5ccccc5)n4)cc2)-c2ccccc2C3(c2ccccc2)c2ccccc2)cc1] | 5.49 | 1.12 | 3.75 | 5.25 | 52 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 34-1 | BH4 | 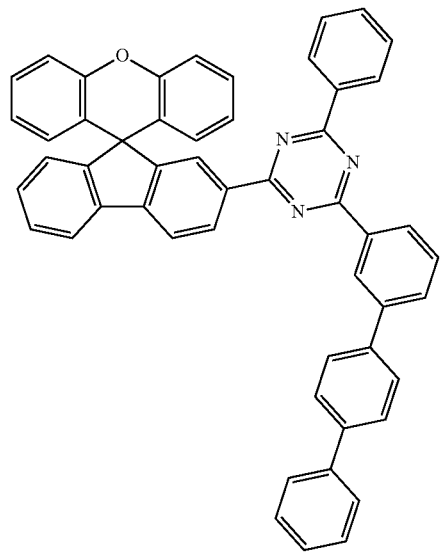 [SMILES: c1ccc(-c2ccc(-c3cccc(-c4nc(-c5ccccc5)nc(-c5ccc6c(c5)C5(c7ccccc7Oc7ccccc75)c5ccccc5-6)n4)c3)cc2)cc1] | 1.19 | 0.93 | 3.91 | 4.81 | 25 |
| 34-2 | BH4 | 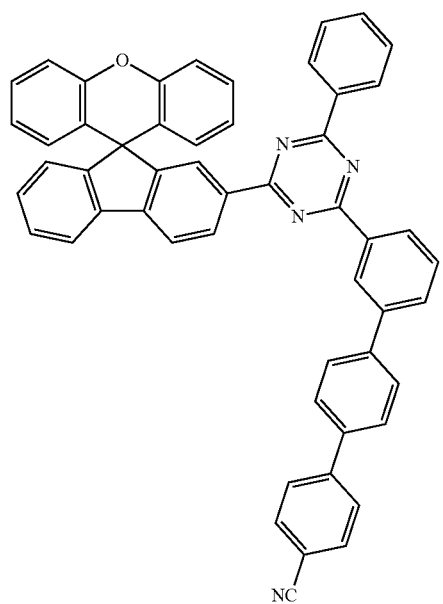 [SMILES: N#Cc1ccc(-c2ccc(-c3cccc(-c4nc(-c5ccccc5)nc(-c5ccc6c(c5)C5(c7ccccc7Oc7ccccc75)c5ccccc5-6)n4)c3)cc2)cc1] | 6.00 | 1.09 | 3.77 | 5.33 | 55 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 35-1 | BH5 | | 1.31 | 0.87 | 3.90 | 4.82 | 26 |
| 35-2 | BH5 | | 5.50 | 1.06 | 3.75 | 5.31 | 51 |
| 36-1 | BH4 | | 0.97 | 0.90 | 3.90 | 4.85 | 22 |
| 36-2 | BH4 | | 6.35 | 1.06 | 3.72 | 5.36 | 49 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 37-1 | BH2 | (structure) | 0.61 | 0.84 | 3.87 | 4.98 | 18 |
| 37-2 | BH2 | (structure) | 5.19 | 1.09 | 3.66 | 5.27 | 49 |
| 38-1 | BH1 | (structure) | 2.53 | 0.87 | 4.02 | 4.98 | 25 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 38-2 | BH1 | 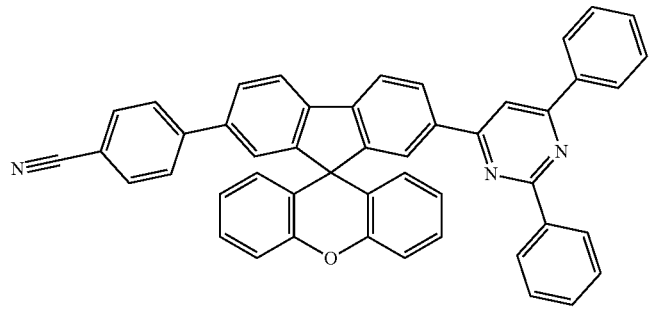 [SMILES: N#Cc1ccc(-c2ccc3c(c2)C2(c4ccccc4Oc4ccccc42)c2cc(-c4cc(-c5ccccc5)nc(-c5ccccc5)n4)ccc2-3)cc1] | 5.80 | 1.22 | 3.49 | 5.25 | 61 |
| 39-1 | BH1 | 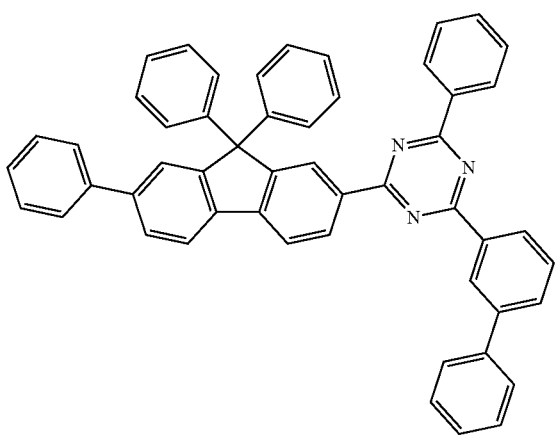 [SMILES: c1ccc(-c2cccc(-c3nc(-c4ccccc4)nc(-c4ccc5c(c4)C(c4ccccc4)(c4ccccc4)c4cc(-c6ccccc6)ccc4-5)n3)c2)cc1] | 0.84 | 1.01 | 4.02 | 4.88 | 29 |
| 39-2 | BH1 | 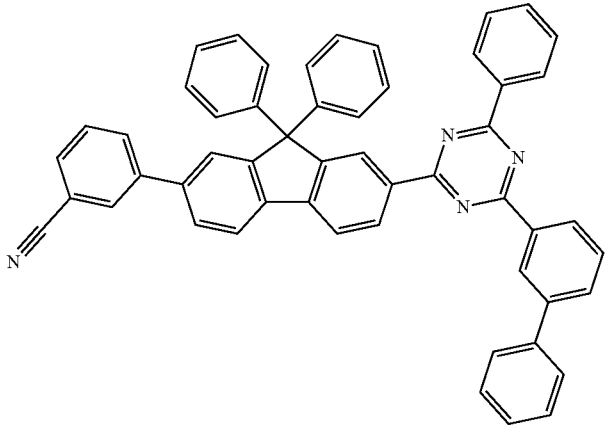 [SMILES: N#Cc1cccc(-c2ccc3c(c2)C(c2ccccc2)(c2ccccc2)c2cc(-c4nc(-c5ccccc5)nc(-c5cccc(-c6ccccc6)c5)n4)ccc2-3)c1] | 5.09 | 1.20 | 3.81 | 5.20 | 51 |
| 40-1 | BH2 | 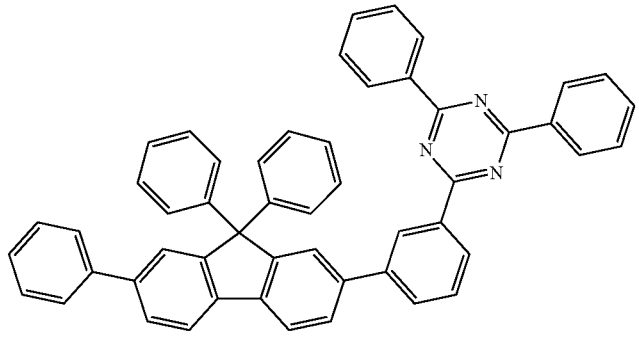 [SMILES: c1ccc(-c2ccc3c(c2)C(c2ccccc2)(c2ccccc2)c2cc(-c4cccc(-c5nc(-c6ccccc6)nc(-c6ccccc6)n5)c4)ccc2-3)cc1] | 0.45 | 0.76 | 4.00 | 4.92 | 24 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 40-2 | BH2 | | 5.61 | 1.06 | 3.78 | 5.29 | 50 |
| 41-1 | BH1 | | 0.70 | 0.93 | 4.01 | 4.89 | 28 |
| 41-2 | BH1 | | 5.35 | 1.28 | 3.80 | 5.22 | 51 |
| 42-1 | BH2 | | 0.24 | 0.71 | 3.99 | 4.92 | 28 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 42-2 | BH2 | 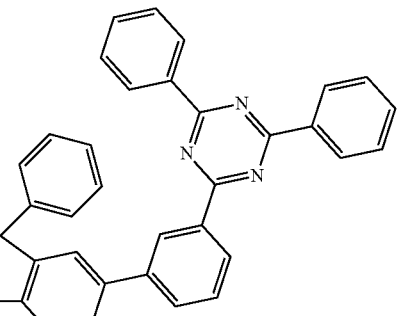 | 5.71 | 1.03 | 3.75 | 5.29 | 48 |
| 43-1 | BH1 | 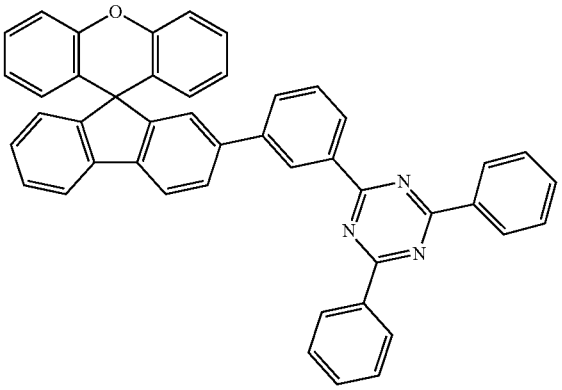 [SMILES: c1ccc(-c2nc(-c3ccccc3)nc(-c3cccc(-c4ccc5c(c4)C4(c6ccccc6Oc6ccccc64)c4ccccc4-5)c3)n2)cc1] | 0.89 | 0.71 | 4.00 | 4.90 | 30 |
| 43-2 | BH1 | 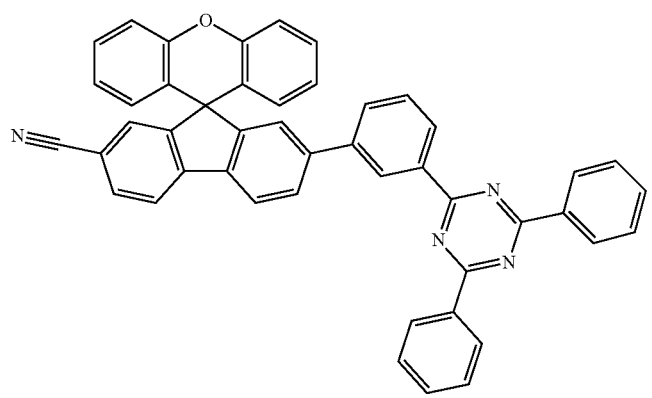 [SMILES: N#Cc1ccc2c(c1)C1(c3ccccc3Oc3ccccc31)c1cc(-c3cccc(-c4nc(-c5ccccc5)nc(-c5ccccc5)n4)c3)ccc1-2] | 5.60 | 1.01 | 3.76 | 5.28 | 52 |
| 44-1 | BH6 | 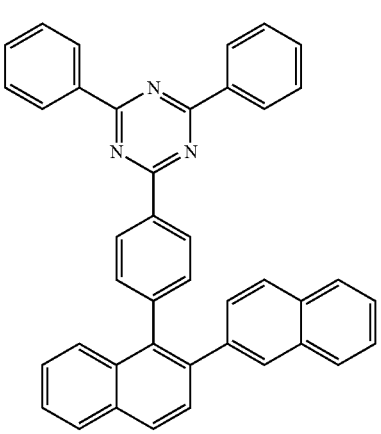 [SMILES: c1ccc(-c2nc(-c3ccccc3)nc(-c3ccc(-c4c(-c5ccc6ccccc6c5)ccc5ccccc45)cc3)n2)cc1] | 0.12 | 0.84 | 4.15 | 4.91 | 24 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 44-2 | BH1 | | 5.58 | 1.09 | 3.89 | 5.12 | 59 |
| 45-1 | BH1 | | 0.96 | 0.98 | 4.00 | 4.89 | 25 |
| 45-2 | BH1 | | 4.99 | 1.17 | 3.81 | 5.22 | 50 |
| 46-1 | BH1 | | 0.70 | 0.98 | 4.04 | 4.77 | 29 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 46-2 | BH1 | | 5.40 | 1.28 | 3.89 | 5.19 | 56 |
| 47-1 | BH4 | | 1.85 | 0.82 | 4.03 | 4.89 | 25 |
| 47-2 | BH4 | | 7.45 | 1.06 | 3.89 | 5.21 | 59 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 48-1 | BH2 | (structure) | 0.59 | 0.84 | 3.98 | 4.71 | 25 |
| 48-2 | BH2 | (structure) | 4.99 | 0.98 | 3.71 | 5.24 | 49 |
| 49-1 | BH2 | (structure) | 0.57 | 0.90 | 4.01 | 4.55 | 28 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 49-2 | BH2 | | 5.63 | 1.12 | 3.79 | 5.11 | 57 |
| 50-1 | BH4 | | 0.87 | 1.05 | 3.80 | 4.76 | 15 |
| 50-2 | BH4 | | 5.44 | 1.28 | 3.68 | 5.12 | 45 |
| 51-1 | BH2 | | 0.26 | 0.78 | 3.81 | 5.01 | 12 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 51-2 | BH2 | | 5.73 | 1.05 | 3.65 | 5.31 | 44 |
| 52-1 | BH2 | | 0.56 | 0.97 | 4.22 | 4.35 | 31 |
| 52-2 | BH2 | | 5.51 | 1.16 | 4.01 | 5.02 | 68 |
| 53-1 | BH2 | | 0.65 | 1.04 | 4.35 | 4.31 | 33 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 53-2 | BH2 | [chemical structure] | 5.43 | 1.30 | 4.05 | 5.00 | 67 |
| 54-1 | BH2 | [chemical structure] | 0.36 | 0.69 | 3.91 | 4.72 | 21 |
| 54-2 | BH2 | [chemical structure] | 4.35 | 0.78 | 3.69 | 5.35 | 51 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 55-1 | BH4 | | 0.13 | 0.81 | 4.12 | 4.99 | 21 |
| 55-2 | BH4 | | 5.04 | 1.06 | 3.81 | 5.25 | 51 |
| 56-1 | BH4 | | 1.04 | 0.63 | 3.99 | 4.95 | 21 |
| 56-2 | BH4 | | 5.88 | 1.02 | 3.69 | 5.31 | 50 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 57-1 | BH2 | | 0.55 | 0.53 | 4.55 | 4.42 | 28 |
| 57-2 | BH2 | | 3.89 | 0.69 | 4.11 | 4.98 | 65 |
| 58-1 | BH4 | | 2.23 | 0.79 | 4.15 | 4.87 | 12 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 58-2 | BH4 | (structure) | 7.80 | 1.09 | 4.01 | 5.05 | 55 |
| 59-1 | BH4 | (structure) | 2.22 | 0.80 | 4.20 | 4.89 | 15 |
| 59-2 | BH4 | (structure) | 7.81 | 1.10 | 4.12 | 4.95 | 69 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 60-1 | BH2 | 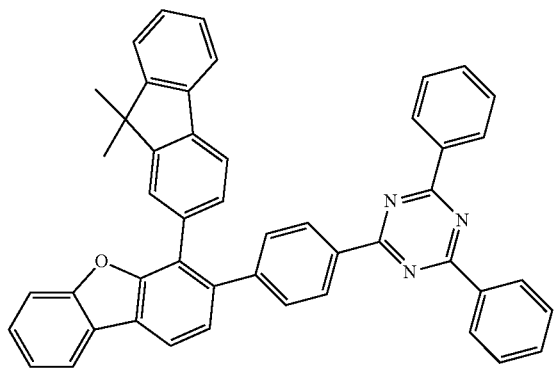 [SMILES: CC1(C)c2ccccc2-c2ccc(-c3c(-c4ccc(-c5nc(-c6ccccc6)nc(-c6ccccc6)n5)cc4)ccc4c3oc3ccccc34)cc21] | 0.56 | 0.94 | 3.98 | 5.01 | 11 |
| 60-2 | BH2 | 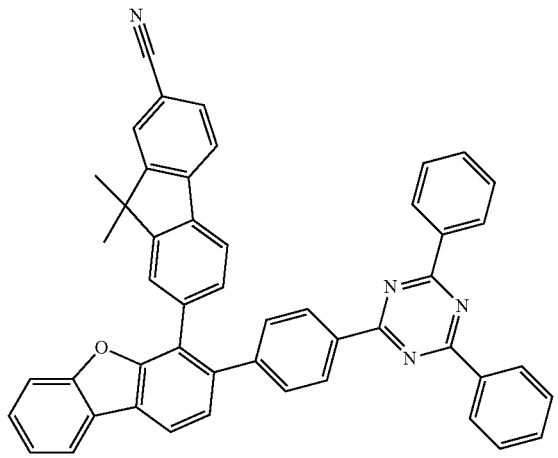 [SMILES: CC1(C)c2cc(C#N)ccc2-c2ccc(-c3c(-c4ccc(-c5nc(-c6ccccc6)nc(-c6ccccc6)n5)cc4)ccc4c3oc3ccccc34)cc21] | 6.15 | 1.13 | 3.75 | 5.52 | 51 |
| 61-1 | BH4 | 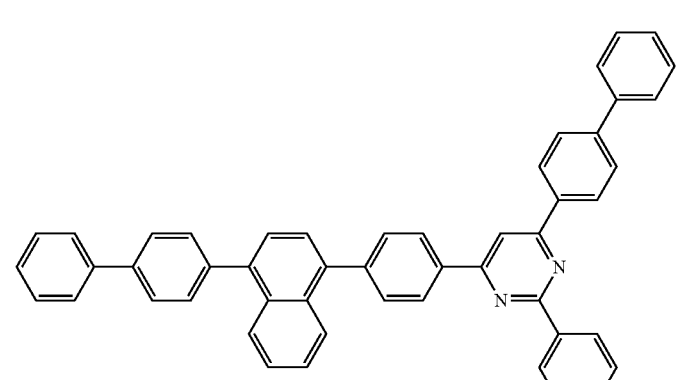 | 2.18 | 0.95 | 4.01 | 4.88 | 25 |

TABLE 1-continued
| Experimental Example Number | Light emitting layer | Electron transport and injection layer | DM | EA | Voltage (V) | Efficiency (cd/A) | LT98 (hr) |
|---|---|---|---|---|---|---|---|
| 61-2 | BH4 | 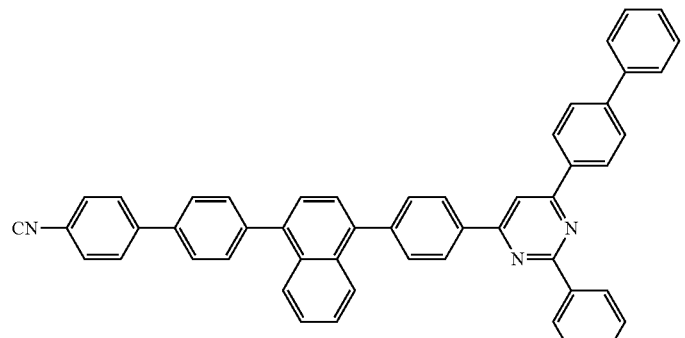 | 5.29 | 1.19 | 3.48 | 5.26 | 60 |
| 62-1 | BH1 | 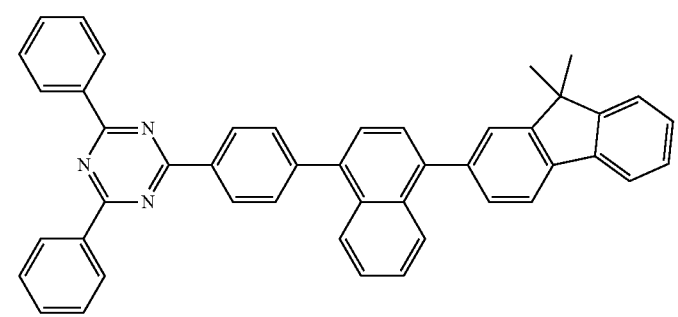 [SMILES: CC1(C)c2ccccc2-c2ccc(-c3ccc(-c4ccc(-c5nc(-c6ccccc6)nc(-c6ccccc6)n5)cc4)c4ccccc34)cc21] | 0.73 | 0.94 | 3.95 | 4.86 | 24 |
| 62-2 | BH1 | 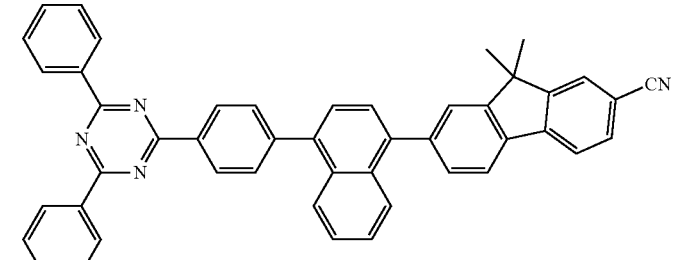 | 5.53 | 1.21 | 3.87 | 5.33 | 57 |
| 63-1 | BH6 | 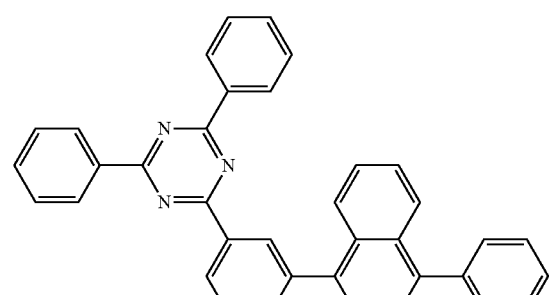 | 0.22 | 0.70 | 4.02 | 5.01 | 12 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 63-2 | BH6 | | 5.59 | 0.97 | 3.89 | 5.36 | 55 |
| 64-1 | BH6 | | 0.37 | 0.93 | 4.21 | 4.91 | 15 |
| 64-2 | BH6 | | 7.92 | 1.00 | 3.99 | 5.16 | 66 |
| 65-1 | BH2 | | 0.48 | 0.75 | 4.58 | 3.24 | 15 |
| 65-2 | BH2 | | 6.19 | 1.15 | 4.02 | 4.88 | 70 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 66-1 | BH4 | *(structure)* | 2.23 | 0.52 | 3.95 | 4.65 | 21 |
| 66-2 | BH4 | *(structure)* | 7.83 | 0.95 | 3.87 | 5.21 | 57 |
| 67-1 | BH2 | *(structure)* | 0.44 | 0.87 | 4.33 | 4.71 | 17 |
| 67-2 | BH2 | *(structure)* | 5.60 | 1.29 | 4.05 | 5.05 | 68 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 68-1 | BH4 | | 0.48 | 0.88 | 4.05 | 4.91 | 29 |
| 68-2 | BH4 | | 5.43 | 1.29 | 3.89 | 5.26 | 61 |
| 69-1 | BH5 | | 2.48 | 0.75 | 4.21 | 4.05 | 14 |
| 69-2 | BH5 | | 7.96 | 1.11 | 4.00 | 4.44 | 54 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 70-1 | BH3 | | 3.80 | 0.77 | 4.22 | 4.16 | 26 |
| 70-2 | BH3 | | 6.23 | 1.14 | 4.00 | 4.43 | 49 |
| 71-1 | BH3 | | 2.47 | 0.73 | 4.00 | 4.85 | 24 |
| 71-2 | BH3 | | 3.89 | 1.01 | 3.99 | 5.02 | 38 |

TABLE 1-continued

| Experimental Example Number | Light emitting layer | Electron transport and injection layer | DM | EA | Voltage (V) | Efficiency (cd/A) | LT98 (hr) |
|---|---|---|---|---|---|---|---|
| 72-1 | BH6 | (structure) | 5.05 | 0.60 | 4.04 | 4.89 | 25 |
| 72-2 | BH6 | (structure with CN) | 10.87 | 0.82 | 3.90 | 5.21 | 61 |

Comparative Example 1

Organic light emitting devices were manufactured in the same manner as in Experimental Example 1-1 except that compounds of the following Table 2 were each used instead of using BH1 as the host of the light emitting layer and the compound of Experimental Example 1-1 of Table 1 as the electron injection and transfer layer.

For each of the organic light emitting devices manufactured in the comparative examples, driving voltage and light emission efficiency were measured at current density of 10 mA/cm², and time taken for luminance becoming 98% with respect to initial luminance (LT98) was measured at current density of 20 mA/cm². The results are shown in the following Table 2.

TABLE 2

| Comparative Example Number | Light emitting layer | Electron transport and injection layer | DM | EA | Voltage (V) | Efficiency (cd/A) | LT-98 (hr) |
|---|---|---|---|---|---|---|---|
| 1-1 | BH1 | *(structure)* | 2.78 | 0.49 | 4.25 | 4.85 | 25 |
| 1-2 | BH1 | *(structure)* | 4.23 | 0.87 | 4.23 | 4.74 | 19 |
| 2-1 | BH4 | *(structure)* | 0.80 | 0.79 | 4.00 | 4.93 | 26 |
| 2-2 | BH1 | | | | 4.02 | 4.90 | 29 |

TABLE 2-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 2-3 | BH4 | [structure] | 1.50 | 1.20 | 3.91 | 5.02 | 19 |
| 2-4 | BH1 | | | | 4.01 | 4.91 | 13 |
| 3-1 | BH4 | [structure] | 1.81 | 0.54 | 4.12 | 4.77 | 27 |
| 3-2 | BH4 | [structure] | 2.95 | 1.16 | 4.01 | 4.21 | 5 |
| 4-1 | BH4 | [structure] | 3.26 | −0.02 | 4.55 | 3.24 | 21 |

TABLE 2-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 4-2 | BH4 | | 9.81 | 0.88 | 4.41 | 3.10 | 8 |
| 5-1 | BH2 | | 2.28 | 0.79 | 4.01 | 4.85 | 24 |
| 5-2 | BH2 | | 3.46 | 1.28 | 3.93 | 4.66 | 11 |
| 6-1 | BH4 | | 2.30 | 0.75 | 4.24 | 4.57 | 30 |

TABLE 2-continued
| Comparative Example Number | Light emitting layer | Electron transport and injection layer | DM | EA | Voltage (V) | Efficiency (cd/A) | LT-98 (hr) |
|---|---|---|---|---|---|---|---|
| 6-2 | BH4 | 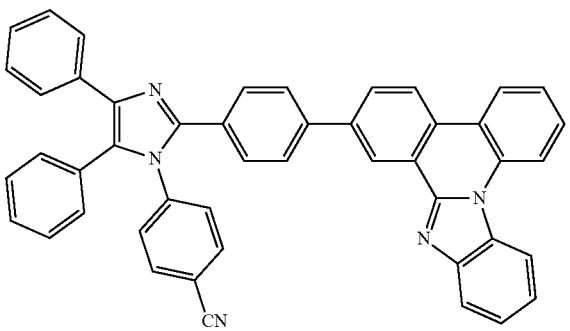 [SMILES: N#Cc1ccc(-n2c(-c3ccc(-c4ccc5c6ccccc6n6c7ccccc7nc6c5c4)cc3)nc(-c3ccccc3)c2-c2ccccc2)cc1] | 2.98 | 0.90 | 4.31 | 4.32 | 6 |
| 7-1 | BH1 | 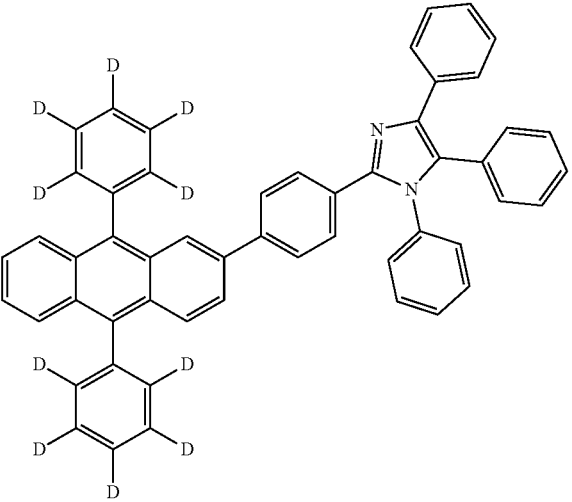 [SMILES: [2H]c1c([2H])c([2H])c(-c2c3ccccc3c(-c3c([2H])c([2H])c([2H])c([2H])c3[2H])c3cc(-c4ccc(-c5nc(-c6ccccc6)c(-c6ccccc6)n5-c5ccccc5)cc4)ccc23)c([2H])c1[2H]] | 4.08 | 0.71 | 4.05 | 4.87 | 29 |
| 7-2 | BH2 | | | | 4.02 | 4.92 | 24 |
| 7-3 | BH1 | 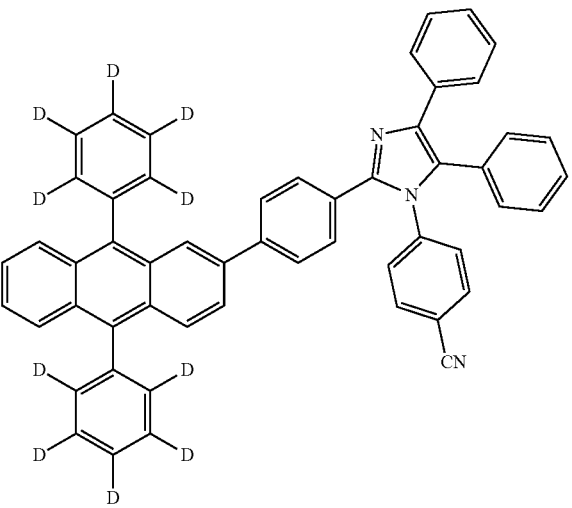 [SMILES: [2H]c1c([2H])c([2H])c(-c2c3ccccc3c(-c3c([2H])c([2H])c([2H])c([2H])c3[2H])c3cc(-c4ccc(-c5nc(-c6ccccc6)c(-c6ccccc6)n5-c5ccc(C#N)cc5)cc4)ccc23)c([2H])c1[2H]] | 1.02 | 0.94 | 4.02 | 4.48 | 10 |
| 7-4 | BH2 | | | | 4.03 | 4.81 | 5 |

TABLE 2-continued
| Comparative Example Number | Light emitting layer | Electron transport and injection layer | DM | EA | Voltage (V) | Efficiency (cd/A) | LT-98 (hr) |
|---|---|---|---|---|---|---|---|
| 8-1 | BH5 | 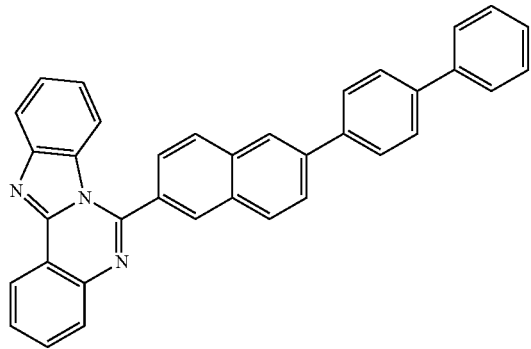 [SMILES: c1ccc(-c2ccc(-c3ccc4cc(-c5nc6ccccc6c6nc7ccccc7n56)ccc4c3)cc2)cc1] | 2.89 | 0.95 | 4.15 | 4.68 | 26 |
| 8-2 | BH5 | 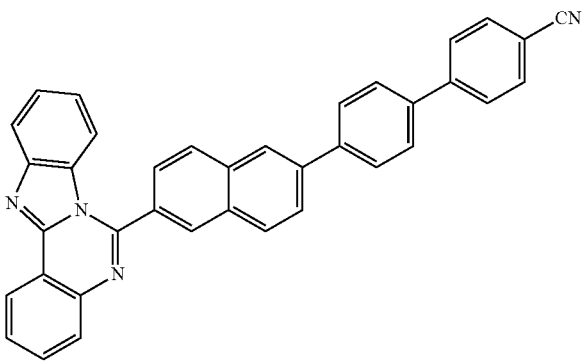 [SMILES: N#Cc1ccc(-c2ccc(-c3ccc4cc(-c5nc6ccccc6c6nc7ccccc7n56)ccc4c3)cc2)cc1] | 3.12 | 1.24 | 4.10 | 4.45 | 17 |
| 9-1 | BH3 | 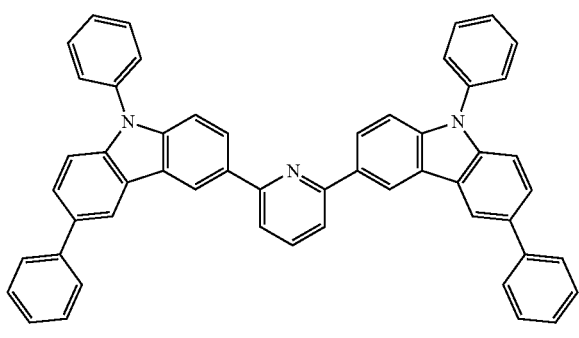 [SMILES: c1ccc(-c2ccc3c(c2)c2cc(-c4cccc(-c5ccc6c(c5)c5cc(-c7ccccc7)ccc5n6-c5ccccc5)n4)ccc2n3-c2ccccc2)cc1] | 3.18 | 0.05 | 4.45 | 3.91 | 24 |
| 9-2 | BH3 | 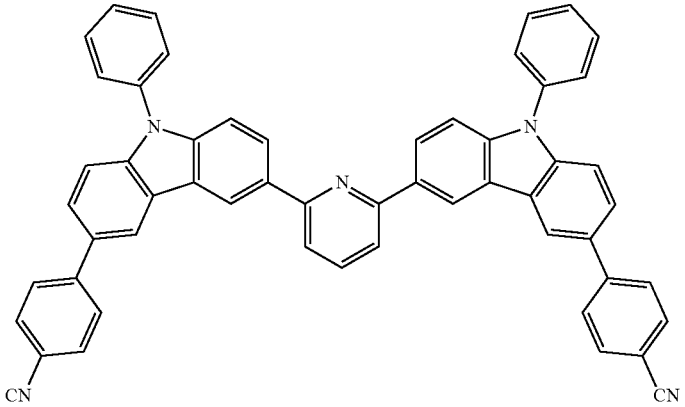 | 13.12 | 0.73 | 4.38 | 3.51 | 10 |

TABLE 2-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 10-1 | BH4 | [structure] | 0.46 | 0.95 | 3.91 | 4.96 | 28 |
| 10-2 | BH4 | [structure] | 3.63 | 1.73 | 4.15 | 4.67 | 4 |

Additional Experimental Example 2

Organic light emitting devices were manufactured in the same manner as in Experimental Example 1-1 except that compounds of the following Table 3 were each used instead of using BH1 as the host of the light emitting layer and the compound of Experimental Example 1-1 of Table 1 as the electron injection and transfer layer, and ET1 was not deposited on the light emitting layer.

For each of the organic light emitting devices manufactured in the experimental examples, driving voltage and light emission efficiency were measured at current density of 10 mA/cm², and time taken for luminance becoming 98% with respect to initial luminance (LT98) was measured at current density of 20 mA/cm². The results are shown in the following Table 3.

TABLE 3

| Example Number | Experimental emitting layer | Electron transport and injection layer | DM | EA | Voltage (V) | Efficiency (cd/A) | LT-98 (hr) |
|---|---|---|---|---|---|---|---|
| 73-1 | BH1 | [structure] | 2.67 | 0.95 | 4.15 | 4.22 | 31 |

TABLE 3-continued

| Example Number | Experimental emitting layer | Light Electron transport and injection layer | DM | EA | Voltage (V) | Efficiency (cd/A) | LT-98 (hr) |
|---|---|---|---|---|---|---|---|
| 73-2 | BH1 | [structure] | 5.95 | 1.22 | 4.02 | 5.01 | 65 |
| 74-1 | BH1 | [structure] | 2.78 | 0.68 | 4.28 | 4.54 | 26 |
| 74-2 | BH1 | [structure] | 8.45 | 1.03 | 4.22 | 4.71 | 71 |
| 75-1 | BH1 | [structure] | 2.32 | 0.98 | 4.09 | 4.55 | 85 |
| 75-2 | BH1 | [structure] | 3.06 | 1.17 | 3.99 | 4.85 | 70 |

TABLE 3-continued

| Example Number | Experimental emitting layer | Electron transport and injection layer | DM | EA | Voltage (V) | Efficiency (cd/A) | LT-98 (hr) |
|---|---|---|---|---|---|---|---|
| 76-1 | BH1 | (structure) | 1.10 | 0.87 | 4.11 | 4.42 | 28 |
| 76-2 | BH1 | (structure) | 5.05 | 1.06 | 4.08 | 4.75 | 66 |
| 77-1 | BH1 | (structure) | 3.52 | 0.76 | 4.51 | 4.23 | 29 |
| 77-2 | BH1 | (structure) | 8.38 | 1.25 | 4.41 | 4.41 | 75 |

TABLE 3-continued

| Example Number | Experimental emitting layer | Light Electron transport and injection layer | DM | EA | Voltage (V) | Efficiency (cd/A) | LT-98 (hr) |
|---|---|---|---|---|---|---|---|
| 78-1 | BH3 | (structure) | 0.99 | 1.03 | 4.22 | 4.75 | 35 |
| 78-2 | BH3 | (structure) | 5.58 | 1.28 | 4.12 | 4.93 | 67 |
| 79-1 | BH2 | (structure) | 0.32 | 0.93 | 3.99 | 4.57 | 21 |
| 79-2 | BH2 | (structure) | 5.52 | 1.12 | 3.89 | 5.01 | 59 |

TABLE 3-continued

| Example Number | Experimental emitting layer | Light Electron transport and injection layer | DM | EA | Voltage (V) | Efficiency (cd/A) | LT-98 (hr) |
|---|---|---|---|---|---|---|---|
| 80-1 | BH2 | | 0.51 | 0.90 | 4.05 | 4.35 | 34 |
| 80-2 | BH2 | | 5.10 | 1.12 | 3.99 | 5.12 | 65 |
| 81-1 | BH2 | | 0.48 | 0.75 | 4.65 | 3.10 | 21 |
| 81-2 | BH2 | | 6.19 | 1.15 | 4.44 | 4.01 | 78 |

TABLE 3-continued

| Example Number | Experimental emitting layer | Light Electron transport and injection layer | DM | EA | Voltage (V) | Efficiency (cd/A) | LT-98 (hr) |
|---|---|---|---|---|---|---|---|
| 82-1 | BH2 | (structure) | 0.44 | 0.87 | 4.41 | 4.55 | 31 |
| 82-2 | BH2 | (structure) | 5.60 | 1.29 | 4.31 | 4.87 | 75 |
| 83-1 | BH4 | (structure) | 0.48 | 0.88 | 4.23 | 4.77 | 36 |
| 83-2 | BH4 | (structure) | 5.43 | 1.29 | 4.05 | 5.00 | 68 |

TABLE 3-continued
| Example Number | Experimental emitting layer | Light Electron transport and injection layer | DM | EA | Voltage (V) | Efficiency (cd/A) | LT-98 (hr) |
|---|---|---|---|---|---|---|---|
| 84-1 | BH5 | 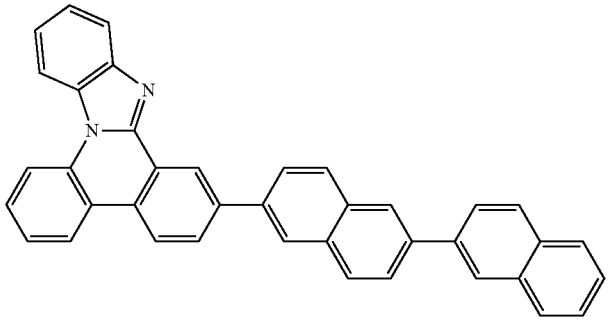 [SMILES: c1ccc2cc(-c3ccc4cc(-c5ccc6c7ccccc7n7c8ccccc8nc7c6c5)ccc4c3)ccc2c1] | 2.48 | 0.75 | 4.32 | 3.87 | 23 |
| 84-2 | BH5 | 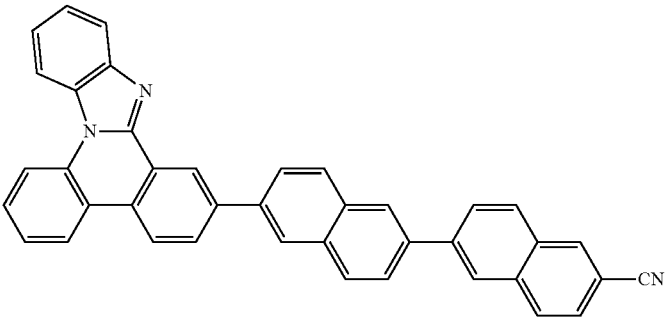 [SMILES: N#Cc1ccc2cc(-c3ccc4cc(-c5ccc6c7ccccc7n7c8ccccc8nc7c6c5)ccc4c3)ccc2c1] | 7.96 | 1.11 | 4.22 | 4.01 | 61 |
| 85-1 | BH3 | 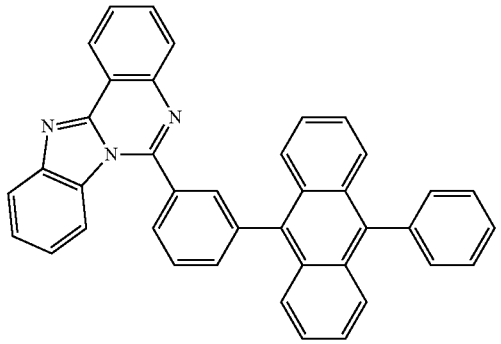 [SMILES: c1ccc(-c2c3ccccc3c(-c3cccc(-c4nc5ccccc5c5nc6ccccc6n45)c3)c3ccccc23)cc1] | 2.47 | 0.73 | 4.21 | 4.77 | 30 |
| 85-2 | BH3 | 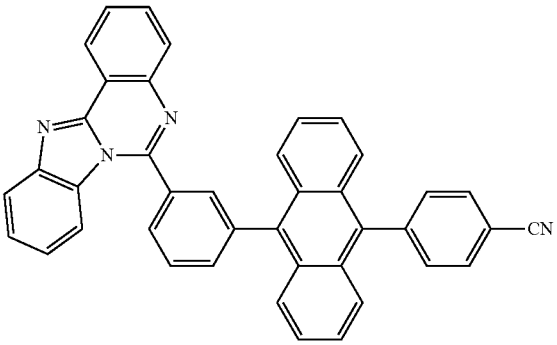 [SMILES: N#Cc1ccc(-c2c3ccccc3c(-c3cccc(-c4nc5ccccc5c5nc6ccccc6n45)c3)c3ccccc23)cc1] | 3.89 | 1.01 | 4.06 | 4.96 | 45 |

TABLE 3-continued

| Example Number | Experimental emitting layer | Light Electron transport and injection layer | DM | EA | Voltage (V) | Efficiency (cd/A) | LT-98 (hr) |
|---|---|---|---|---|---|---|---|
| 86-1 | BH6 | 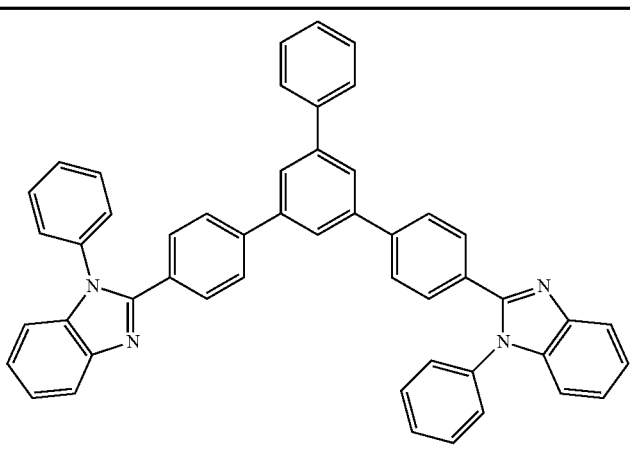 | 5.05 | 0.60 | 4.19 | 4.64 | 34 |
| 86-2 | BH6 | 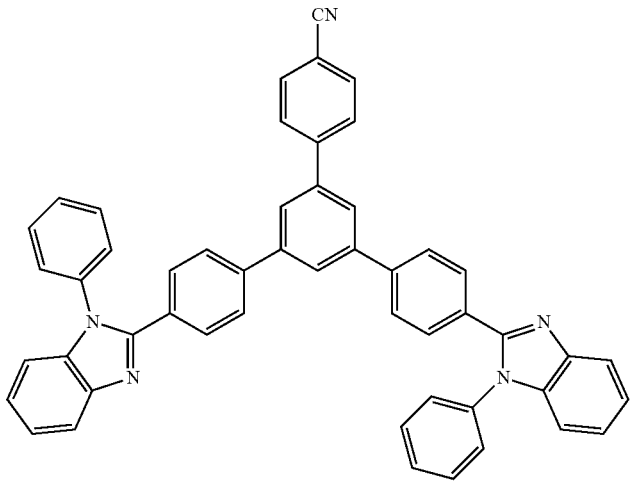 [SMILES: N#Cc1ccc(-c2cc(-c3ccc(-c4nc5ccccc5n4-c4ccccc4)cc3)cc(-c3ccc(-c4nc5ccccc5n4-c4ccccc4)cc3)c2)cc1] | 10.87 | 0.82 | 4.03 | 5.09 | 74 |

Comparative Example 2

Organic light emitting devices were manufactured in the same manner as in Experimental Example 1-1 except that compounds of the following Table 4 were each used instead of using BH1 as the host of the light emitting layer and the compound of Experimental Example 1-1 of Table 1 as the electron injection and transfer layer, and ET1 was not deposited on the light emitting layer.

For each of the organic light emitting devices manufactured in the comparative examples, driving voltage and light emission efficiency were measured at current density of 10 mA/cm$^2$, and time taken for luminance becoming 98% with respect to initial luminance (LT98) was measured at current density of 20 mA/cm$^2$. The results are shown in the following Table 4.

TABLE 4

| Comparative Example Number | Light emitting layer | Electron transport and injection layer | DM | EA | Voltage (V) | Efficiency (cd/A) | LT-98 (hr) |
|---|---|---|---|---|---|---|---|
| 11-1 | BH1 | (structure) | 2.78 | 0.49 | 4.43 | 4.53 | 32 |
| 11-2 | BH1 | (structure) | 4.28 | 0.87 | 4.40 | 4.44 | 21 |
| 12-1 | BH4 | (structure) | 0.80 | 0.79 | 4.21 | 4.74 | 39 |

TABLE 4-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 12-2 | BH4 | | 1.50 | 1.20 | 4.18 | 4.71 | 25 |
| 13-1 | BH4 | | 1.81 | 0.54 | 4.31 | 4.54 | 25 |
| 13-2 | BH4 | | 2.95 | 1.16 | 4.26 | 4.09 | 11 |
| 14-1 | BH4 | | 3.26 | −0.02 | 4.60 | 3.19 | 32 |

TABLE 4-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 14-2 | BH4 | (structure) | 9.81 | 0.88 | 4.58 | 3.08 | 16 |
| 15-1 | BH2 | (structure) | 2.28 | 0.79 | 4.32 | 4.51 | 35 |
| 15-2 | BH2 | (structure) | 3.46 | 1.28 | 4.28 | 4.35 | 21 |
| 16-1 | BH4 | (structure) | 2.30 | 0.75 | 4.41 | 4.23 | 42 |

TABLE 4-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 16-2 | BH4 | (structure) | 2.98 | 0.90 | 4.48 | 4.15 | 25 |
| 17-1 | BH1 | (structure) | 4.08 | 0.71 | 4.24 | 4.68 | 38 |
| 17-2 | BH2 | | | | 4.21 | 4.71 | 30 |
| 17-3 | BH1 | (structure) | 1.02 | 0.94 | 4.20 | 4.29 | 19 |
| 17-4 | BH2 | | | | 4.20 | 4.60 | 15 |

TABLE 4-continued

| Comparative Example Number | Light emitting layer | Electron transport and injection layer | DM | EA | Voltage (V) | Efficiency (cd/A) | LT-98 (hr) |
|---|---|---|---|---|---|---|---|
| 18-1 | BH4 | [structure: 2,4-diphenyl-1,3,5-triazine connected through phenyl-naphthyl-phenyl-biphenyl] | 0.46 | 0.95 | 4.02 | 4.74 | 32 |
| 18-2 | BH4 | [structure: 2,4-diphenyl-1,3,5-triazine connected through phenyl-naphthyl-phenyl-phenyl-CF3] | 3.63 | 1.73 | 4.24 | 4.44 | 11 |

As seen from the results of Tables 1 and 3, Compound (A) (the compound including a heteroatom and a cyano group) according to one embodiment of the present specification satisfies Equations 1 and 2, and when using Compound (A) in the electron injection and transfer layer of the organic light emitting device, effects of lower driving voltage, excellent efficiency and long lifetime were obtained compared to the organic light emitting device using the compound having the same core as Compound (A) without including a cyano group.

On the other hand, as seen from the results of Tables 2 and 4, results of higher driving voltage, and reduced efficiency and lifetime were obtained when using the compound different from Compound (A) of the present specification by not including a cyano group even when including a heteroatom, or using the compound including a heteroatom and a cyano group but not satisfying Equations 1 and 2, compared when using Compound (A) satisfying Equations 1 and 2 according to one embodiment of the present specification in an organic light emitting device.

Accordingly, the organic light emitting device using Compound (A) including a heteroatom and a cyano group, and satisfying Equations 1 and 2 is effective in obtaining a low driving voltage, excellent efficiency and long lifetime.

In Tables 1 to 4, DM means a dipole moment, and EA means electron affinity.

The invention claimed is:

1. An organic light emitting device comprising:
a cathode;
an anode provided opposite to the cathode;
one or more of a light emitting layer provided between the cathode and the anode; and
an organic material layer provided between the cathode and the light emitting layer, and including Compound (A) including a heteroatom and a cyano group,
wherein Compound (A) satisfies the following Equation 1 and the following Equation 2:

$$|P_{El}^{CN}| \geq 3 \text{debye} \qquad \text{Equation 1}$$

wherein in Equation 1:
$|P_{El}^{CN}|$ means an absolute value of a dipole moment of Compound (A);

$$\frac{|P_{El}^{CN}|}{|P_{El}|} > \frac{|Ea_{El}^{CN}|}{|Ea_{El}|} \qquad \text{Equation 2}$$

wherein in Equation 2:
$|P_{El}^{CN}|$ means an absolute value of a dipole moment of Compound (A);
$|P_{El}|$ means an absolute value of a dipole moment of a compound having the same core as the compound of $|P_{El}^{CN}|$ without including a cyano group;
$|Ea_{El}^{CN}|$ means an absolute value of electron affinity of Compound (A); and
$|Ea_{El}|$ means an absolute value of electron affinity of a compound having the same core as the compound of $|Ea_{El}^{CN}|$ without including a cyano group.

2. The organic light emitting device of claim 1, wherein the organic material layer is a hole blocking layer, an electron transfer layer, an electron injection layer, or an electron injection and transfer layer.

3. The organic light emitting device of claim 1, further comprising a hole blocking layer provided between the light emitting layer and the organic material layer,
wherein the hole blocking layer is provided adjoining the light emitting layer; and the organic material layer is an electron injection and transfer layer.

4. The organic light emitting device of claim 1, wherein Compound (A) has electron mobility of greater than or equal to $10^{-12}$ cm$^2$/Vs and less than or equal to $10^2$ cm$^2$/Vs under an electric field condition of 0.1 MV/cm.

5. The organic light emitting device of claim 1, wherein the organic material layer has a glass transition temperature (Tg) of higher than 100° C. and lower than or equal to 200° C.

6. The organic light emitting device of claim 1, wherein the light emitting layer includes a host and a dopant, and the dopant has a maximum light emission wavelength in a range of 420 nm to 520 nm.

7. The organic light emitting device of claim 6, wherein the dopant is a blue fluorescent dopant.

8. The organic light emitting device of claim 1, wherein the organic material layer further includes a metal complex, and includes Compound (A):the metal complex in a weight ratio of 1:9 to 9:1.

9. The organic light emitting device of claim 1, wherein Compound (A) is a compound including a heteroring including at least one N.

10. The organic light emitting device of claim 1, comprising two or more light emitting layers.

11. The organic light emitting device of claim 10, wherein at least two of the two or more light emitting layers have a different maximum light emission wavelength.

12. The organic light emitting device of claim 10, wherein at least one of the two or more light emitting layers includes a phosphorescent dopant, and at least one of the light emitting layers includes a fluorescent dopant.

13. The organic light emitting device of claim 1, comprising:
- a first light emitting layer provided between the anode and the organic material layer including Compound (A); and
- a second light emitting layer provided on the first light emitting layer.

14. The organic light emitting device of claim 1, comprising:
- a first light emitting layer provided on a part of between the anode and the organic material layer including Compound (A); and
- a second light emitting layer provided on the remaining part of between the anode and the organic material layer including Compound (A).

15. The organic light emitting device of claim 1, comprising:
- a first light emitting layer provided between the anode and the organic material layer including Compound (A);
- a second light emitting layer provided on the first light emitting layer; and
- a third light emitting layer provided on the second light emitting layer.

* * * * *